United States Patent
Kim et al.

(10) Patent No.: US 11,811,008 B2
(45) Date of Patent: Nov. 7, 2023

(54) LIGHT SOURCE MODULE INCLUDING LIGHT-EMITTING DIODE

(71) Applicant: SAMSUNG ELECTRONICS CO., LTD., Suwon-si (KR)

(72) Inventors: Inho Kim, Hwaseong-si (KR);
Yongmin Kwon, Hwaseong-si (KR);
Sanghyun Kim, Goyang-si (KR);
Jinwoo Park, Suwon-si (KR);
Dongyeoul Lee, Suwon-si (KR);
Dongju Lee, Hwaseong-si (KR);
Sangbum Lee, Hwaseong-si (KR);
Jonghyun Lee, Suwon-si (KR);
Dahyun Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 277 days.

(21) Appl. No.: 17/154,632

(22) Filed: Jan. 21, 2021

(65) Prior Publication Data

US 2021/0367121 A1 Nov. 25, 2021

(30) Foreign Application Priority Data

May 25, 2020 (KR) .................. 10-2020-0062656

(51) Int. Cl.
*H01L 33/62* (2010.01)
*H01L 27/15* (2006.01)
(Continued)

(52) U.S. Cl.
CPC ............ *H01L 33/62* (2013.01); *H01L 27/156* (2013.01); *H01L 33/22* (2013.01); *H01L 33/382* (2013.01); *H01L 33/46* (2013.01); *H01L 33/50* (2013.01); *H01L 33/58* (2013.01); *H01L 33/642* (2013.01); *F21K 9/23* (2016.08); *F21K 9/27* (2016.08);
(Continued)

(58) Field of Classification Search
None
See application file for complete search history.

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

KR 101868540 B1 6/2018

OTHER PUBLICATIONS

US 10,615,325 B2, 04/2020, Andrews (withdrawn)

*Primary Examiner* — Robert K Carpenter
(74) *Attorney, Agent, or Firm* — Sughrue Mion, PLLC

(57) ABSTRACT

A light source module includes a light-emitting cell, a wiring structure provided on the light-emitting cell and connected to the light-emitting cell, a support structure that is apart from the light-emitting cell with the wiring structure therebetween in a vertical direction, a printed circuit board (PCB) that is apart from the wiring structure with the support substrate therebetween in the vertical direction and overlapping the light-emitting cell in the vertical direction, and at least one insulating film that is apart from the wiring structure in the vertical direction and covering at least one of a first surface of the support substrate, which faces the wiring structure, and a second surface of the support substrate, which faces the PCB.

20 Claims, 39 Drawing Sheets

(51) Int. Cl.
  *H01L 33/22*   (2010.01)
  *H01L 33/38*   (2010.01)
  *H01L 33/46*   (2010.01)
  *H01L 33/50*   (2010.01)
  *H01L 33/58*   (2010.01)
  *H01L 33/64*   (2010.01)
  *F21K 9/23*   (2016.01)
  *F21K 9/27*   (2016.01)

(52) U.S. Cl.
  CPC ........... *H01L 2933/0016* (2013.01); *H01L 2933/0025* (2013.01); *H01L 2933/0041* (2013.01); *H01L 2933/0066* (2013.01)

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,239,333 B2 | 7/2007 | Tu et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,905,543 B2 | 2/2018 | Yeon et al. |
| 2015/0001572 A1* | 1/2015 | Katsuno ............... H01L 33/387 257/99 |
| 2019/0326349 A1 | 10/2019 | Kwon et al. |
| 2020/0011518 A1 | 1/2020 | Ko et al. |
| 2020/0135706 A1 | 4/2020 | Sa et al. |
| 2022/0367775 A1* | 11/2022 | Yamazaki ............. H01L 27/156 |

* cited by examiner

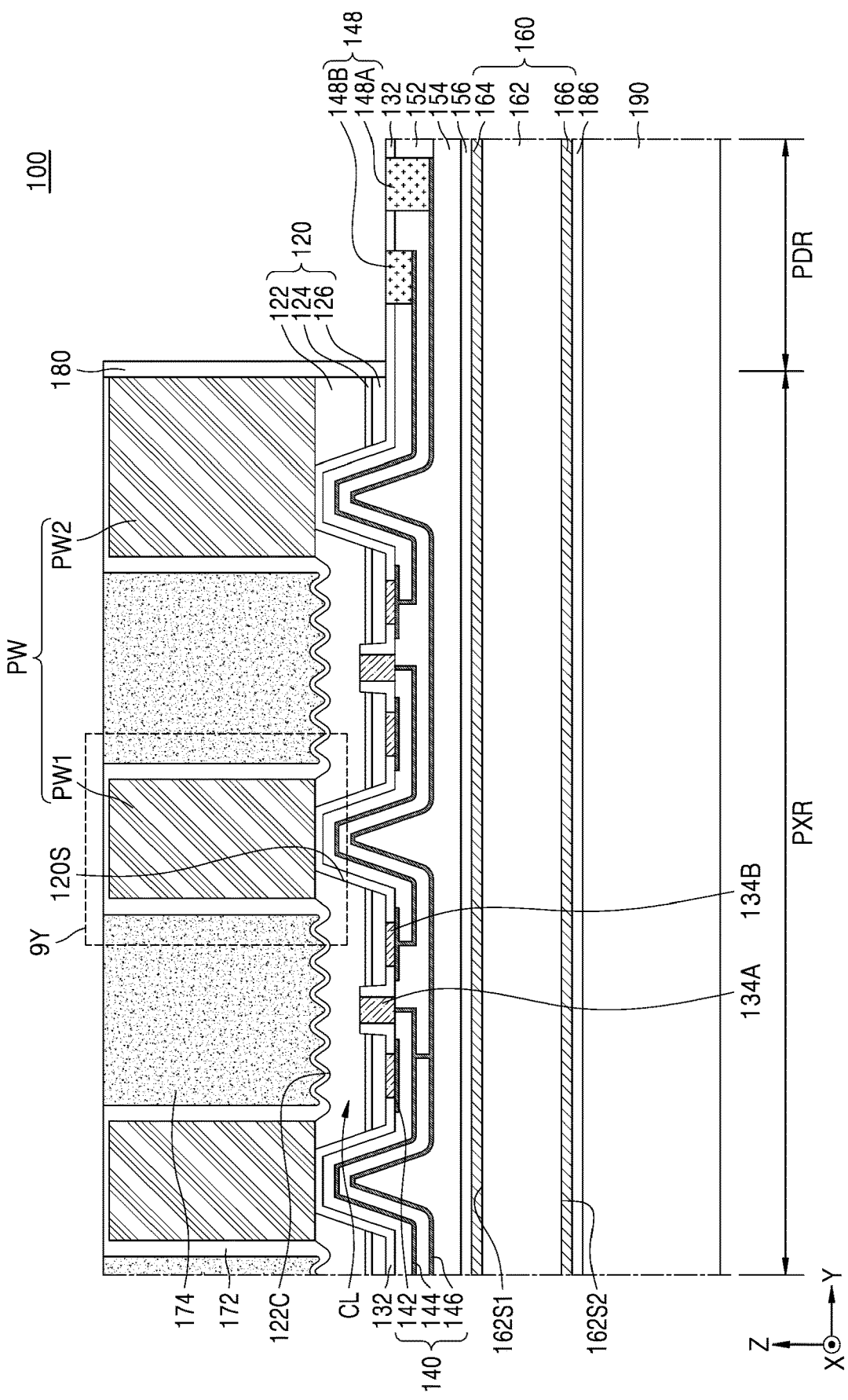

LIGHT SOURCE MODULE INCLUDING LIGHT-EMITTING DIODE

CROSS-REFERENCE TO RELATED APPLICATION

This application claims priority to Korean Patent Application No. 10-2020-0062656, filed on May 25, 2020, in the Korean Intellectual Property Office, the disclosure of which is incorporated by reference herein in its entirety.

BACKGROUND

Example embodiments of the disclosure relate to a light source module including a light-emitting diode (LED), and more particularly, to a light source module including an LED supported by a support substrate.

LEDs are used as light sources for various electronic products. As the LEDs become versatile, it is necessary to develop a new structure for improving the optical characteristics and reliability of light source modules including the LEDs.

SUMMARY

One or more example embodiments provide a light source module having improved optical characteristics and reliability.

According to an aspect of an example embodiment, there is provided a light source module including a light-emitting cell, a wiring structure provided on the light-emitting cell and connected to the light-emitting cell, a support substrate that is apart from the light-emitting cell with the wiring structure therebetween in a vertical direction, a printed circuit board (PCB) that is apart from the wiring structure with the support substrate therebetween in the vertical direction. The PCB overlaps the light-emitting cell in the vertical direction. At least one insulating film is apart from the wiring structure in the vertical direction. The at least one insulating film covers at least one of a first surface of the support substrate, which faces the wiring structure, and a second surface of the support substrate, which faces the PCB.

According to an aspect of an example embodiment, there is provided a light source module including a plurality of light-emitting cells that are apart from each other in a lateral direction, a wiring structure provided on the plurality of light-emitting cells and configured to electrically connect the plurality of light-emitting cells to each other, a support structure provided opposite the plurality of light-emitting cells with the wiring structure therebetween. The support structure extends in the lateral direction. A PCB overlaps the plurality of light-emitting cells with the wiring structure and the support structure therebetween in a vertical direction. The support structure includes a support substrate and at least one insulating film covering at least one of a first surface of the support substrate, which faces the wiring structure, and a second surface of the support substrate, which faces the PCB.

According to an aspect of an example embodiment, there is provided a light source module including a plurality of light-emitting cells including a plurality of light-emitting stack structures. Each of the light-emitting stack structures includes a first conductive semiconductor layer, an active layer, and a second conductive semiconductor layer, which are sequentially stacked in a vertical direction. The plurality of light-emitting stack structures are apart from each other in a lateral direction. A wiring structure includes a plurality of conductive lines configured to connect the plurality of light-emitting cells to each other. A buried insulating film covers the wiring structure. An adhesive layer covers the buried insulating film. A support structure is apart from the buried insulating film with the adhesive layer therebetween in the vertical direction. A PCB overlaps the plurality of light-emitting stack structures in the vertical direction with the wiring structure and the support structure therebetween. The support structure includes a support substrate and at least one insulating film covering at least one of a first surface of the support substrate, which faces the wiring structure, and a second surface of the support substrate, which faces the PCB.

BRIEF DESCRIPTION OF THE DRAWINGS

The above and other aspects of certain example embodiments will be more clearly understood from the following detailed description taken in conjunction with the accompanying drawings, in which:

FIG. 1C is an enlarged cross-sectional view of examples of some components, which is taken along line CY-CY' of FIG. 1B;

DETAILED DESCRIPTION

Figure 1A:
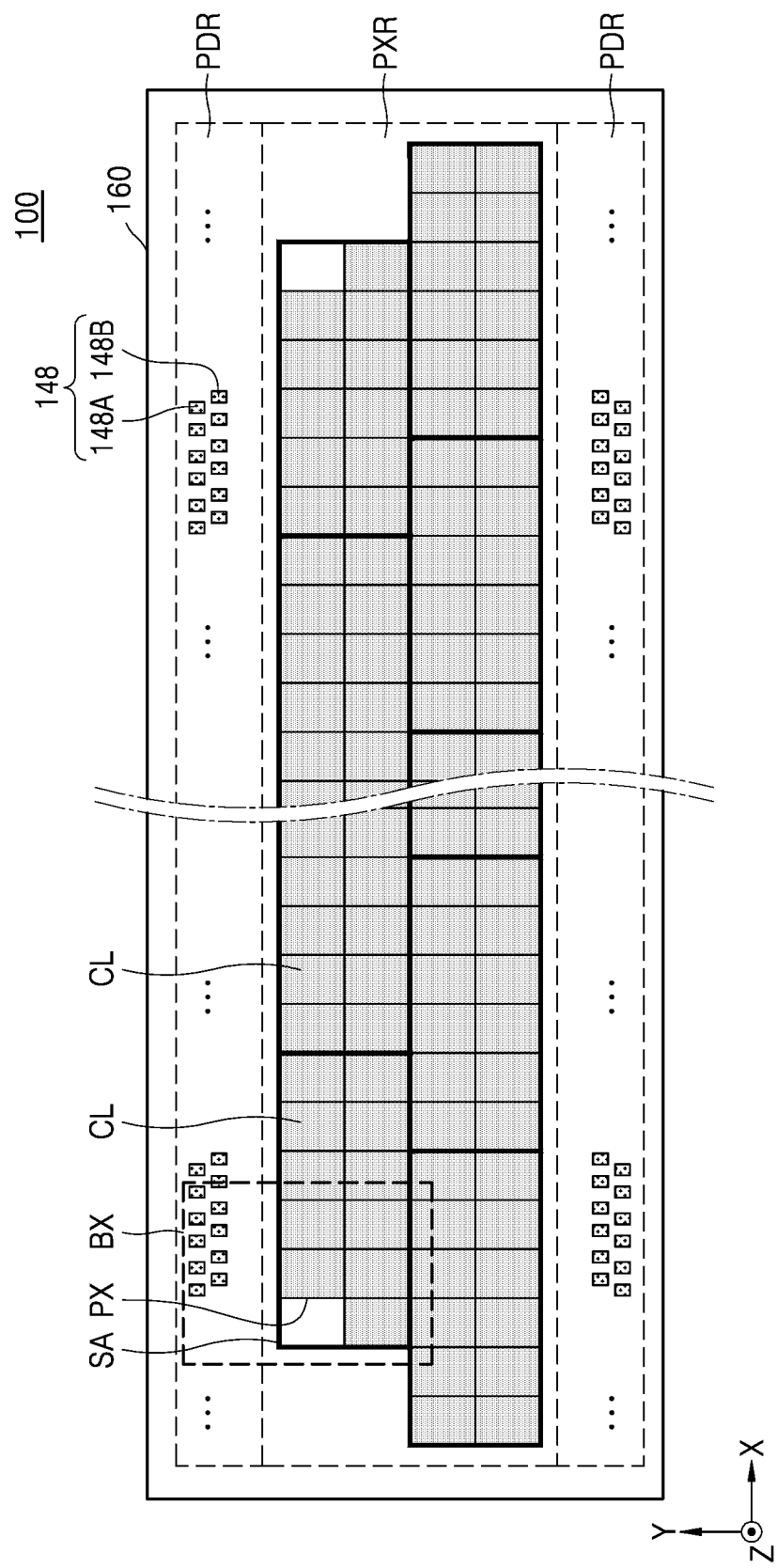
FIG. 1A is a schematic plan view of a light source module according to embodiments.

Hereinafter, example embodiments will be described in detail with reference to the accompanying drawings. The same reference numerals are used to denote the same elements in the drawings, and repeated descriptions thereof will be omitted.

Figure 1B:
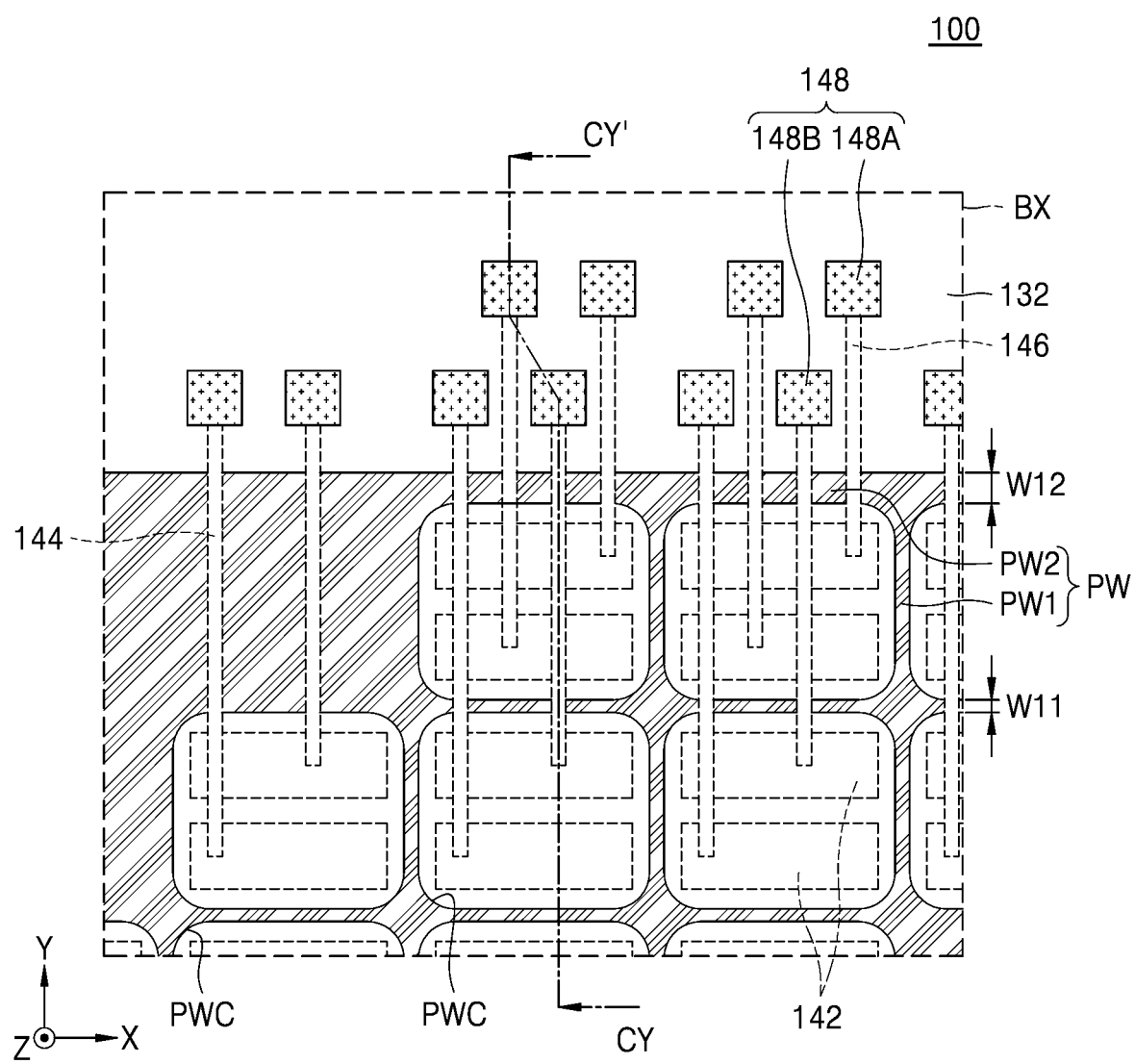
FIG. 1B is an enlarged plan view of a partial region BX in FIG. 1A.

FIGS. 1A to 1C are diagrams of a light source module 100 according to an example embodiment. FIG. 1A is a schematic plan view of the light source module 100. FIG. 1B is an enlarged plan view of a partial region BX in FIG. 1A. FIG. 1C is an enlarged cross-sectional view of examples of some components, which is taken along line CY-CY' of FIG. 1B.

Referring to FIGS. 1A to 1C, the light source module 100 may include a support structure 160 and a plurality of light-emitting cells CL. The support structure 160 may have a pixel region PXR and a pad region PDR around the pixel region PXR. The plurality of light-emitting cells CL may be supported in the pixel region PXR of the support structure 160. A plurality of light-emitting cells CL may be arranged in a matrix form in the pixel region PXR of the support structure 160. A plurality of conductive pads 148, which may be electrically connected to the plurality of light-emitting cells CL, may be in the pad region PDR of the support structure 160. The plurality of conductive pads 148 may include a plurality of first conductive pads 148A and a plurality of second conductive pads 148B.

As shown in FIG. 1A, a planar shape of a portion occupied by one pixel region PXR and two pad regions PDR around the one pixel region PXR on the support structure 160 may substantially have a rectangular shape. A length of the rectangular shape in a first lateral direction (X direction) may be greater than a length of the rectangular shape in a second lateral direction (Y direction). In example embodiments, the length of the rectangular shape in the first lateral direction (X direction) may be greater than or equal to about 1.1 times the length of the rectangular shape in the second lateral direction (Y direction). In example embodiments, the length of the rectangular shape in the first lateral direction (X direction) may be less than or equal to about 100 times the length of the rectangular shape in the second lateral direction (Y direction).

A thickness of the light source module 100 in a vertical direction (or Z direction) may be several tens of μm to several hundreds of p.m. According to example embodiments, the thickness of the light source module 100 in the vertical direction (or Z direction) may be less than or equal to about 1/10 of a length of the light source module 100 in the first lateral direction (or X direction). The light source module 100 having the above-described dimensions may optimize resistance to physical stress, and thus, the warpage of the light source module 100 may be minimized.

A plurality of pixels PX may be arranged in a line in a first lateral direction (X direction) and a second lateral direction (Y direction) in the pixel region PXR of the support structure 160. Each of the plurality of pixels PX may include a light-emitting cell CL. Although FIG. 1A illustrates a case in which 102 pixels PX are arranged in one pixel region PXR, embodiments are not limited thereto. For example, one pixel PX or a plurality of pixels PX may be arranged in one pixel region PXR, and the number of pixels PX may be variously selected.

In example embodiments, each of the plurality of pixels PX may have a width of about 10 μm to several mm in the first lateral direction (X direction) or the second lateral direction (Y direction), but are not limited thereto In example embodiments, the plurality of pixels PX in one pixel region PXR may be divided into a plurality of sub-arrays SA. A plurality of light-emitting cells CL included in one sub-array SA may be connected in series or in parallel to each other. In other example embodiments, the plurality of pixels PX arranged in one pixel region PXR may not be divided into the plurality of sub-arrays SA but connected in series or parallel to each other.

FIG. 1A illustrates a configuration in which the pad regions PDR are respectively in both side portions of one pixel region PXR in the second lateral direction (Y direction), but embodiments are not limited to the configuration shown in FIG. 1A. For example, the pad region PDR may be in at least one of a plurality of side portions including both side portions of the pixel region PXR in the first lateral direction (X direction) and both the side portions of the pixel region PXR in the second lateral direction (Y direction).

As shown in FIGS. 1B and 1C, a partition wall structure PW may be formed on the plurality of light-emitting cells CL1 on an opposite side of the support structure 160. The partition wall structure PW may include an inner partition wall PW1 between the plurality of light-emitting cells CL to define a plurality of pixel spaces (refer to PS in FIG. 7H) on the plurality of light-emitting cells CL and an outer partition wall PW2 surrounding the inner partition wall PW1 on the periphery of the plurality of light-emitting cells CL. The inner partition wall PW1 may overlap an isolation region (refer to S1 in FIG. 7C) between the plurality of light-emitting cells CL in the vertical direction (Z direction).

As shown in FIG. 1B, in the partition wall structure PW, each of the inner partition wall PW1 and the outer partition wall PW2 may include a round-corner sidewall unit PWC facing the pixel space PS. The pixel space PS having a round corner may be defined by the round-corner sidewall unit PWC of the partition wall structure PW.

In the pixel region PXR, a lateral width of the outer partition wall PW2 may be greater than a lateral width of the inner partition wall PW1. In a partial region of the pixel region PXR, the inner partition wall PW1 may have a first width W11 in the second lateral direction (Y direction), and the outer partition wall PW2 may have a second width W12 in the second lateral direction (Y direction). The second width W12 may be greater than the first width W11. In example embodiments, the first width W11 of the inner partition wall PW1 may be selected in the range of about 10 μm to about 100 μm, and the second width W12 of the outer partition wall PW2 may be selected in the range of about 10 μm to about 1 mm. In example embodiments, a ratio of the second width W12 to the first width W11 may be greater than about 1 and less than about 10. However, the ranges of the first and second widths W11 and W12 and the ratio of the second width W12 to the first width W11 are not limited to the above-described examples. The outer partition wall PW2 may have various widths according to positions in the first lateral direction (X direction) and the second lateral direction (Y direction).

The outer partition wall PW2, which is an outermost portion of the partition wall structure PW, may have a greater width than the inner partition wall PW1, and thus, the structural stability of the light source module 100 may be provided. In addition, because the partition wall structure PW includes the round-corner sidewall unit PWC, the durability of the inner partition wall PW1 may be improved. For example, even when cracks occur in a partial region of the inner partition wall PW1 due to external physical impact, the cracks may be prevented from spreading to other portions of the inner partition wall PW1 by the round-corner sidewall unit PWC. Furthermore, even when repetitive vibration and impact are applied to the light source module 100 when the light source module 100 is used as a headlamp for a vehicle, the reliability of the light source module 100 may be improved due to excellent structural stability of the light source module 100, which is provided by the partition wall structure PW.

In example embodiments, a width and height of each of the inner partition wall PW1 and the outer partition wall PW2 included in the partition wall structure PW may be variously adjusted so that the plurality of pixels PX may obtain desired contrast characteristics.

Although FIG. 1C illustrates a case in which a top surface of each of the inner partition wall PW1 and the outer partition wall PW2 is planar, embodiments are not limited thereto. For example, a trench or a concave/convex portion may be formed in the top surface of each of the inner partition wall PW1 and the outer partition wall PW2.

FIGS. 1A to 1C illustrate a case in which the plurality of pixels PX divided from each other by the inner partition walls PW1 have about the same or similar planar shapes and planar areas, but embodiments are not limited thereto. For example, at least some of the plurality of pixels PX may have different planar shapes and different planar areas from other pixels PX. In addition, at least some of a plurality of pixel spaces defined by the inner partition walls PW1 (e.g., a plurality of pixel spaces PS shown in FIG. 7H) may have various volumes. Here, the term "planar area" refers to a projected area of a light-emitting surface of each of the plurality of pixels PX.

In example embodiments, at least some of the plurality of pixels PX may be configured to receive different power from other pixels PX. In example embodiments, at least some of the plurality of pixels PX may be configured to have different optical characteristics from other pixels PX. In example embodiments, the plurality of pixels PX may be configured to individually control power supplied to each of the plurality of pixels PX and optical characteristics of each of the plurality of pixels PX.

As shown in FIG. 1C, each of the plurality of light-emitting cells CL may include a light-emitting stack structure 120, which includes a first conductive semiconductor layer 122, an active layer 124, and a second conductive semiconductor layer 126. In the pixel region PXR, a plurality of light-emitting stack structures 120 may be apart from each other with an isolation region (refer to S1 in FIG. 7C) therebetween in a lateral direction. Although FIG. 1C illustrates a configuration in which some pieces of the light-emitting stack structure 120 are in the pad region PDR, embodiments are not limited thereto. For example, the light-emitting stack structure 120 may not be in the pad region PDR.

The first conductive semiconductor layer 122 may be a nitride semiconductor having a composition of n-type $In_xAl_yGa_{(1-x-y)}N$ (where $0 \leq x<1$, $0 \leq y<1$, and $0 \leq x+y<1$). For example, the first conductive semiconductor layer 122 may include GaN containing n-type impurities. The n-type impurities may be silicon (Si).

In example embodiments, the first conductive semiconductor layer 122 may include a first conductive semiconductor contact layer and a current diffusion layer. An impurity concentration of the first conductive semiconductor contact layer may be in the range of $2 \times 10^{18}$ cm$^{-3}$ to $9 \times 10^{19}$ cm$^{-3}$. A thickness of the first conductive semiconductor contact layer may be about 0.1 μm to about 5 μm. The current diffusion layer may have a structure in which a plurality of $In_xAl_yGa_{(1-x-y)}N$ layers (where $0 \leq x$, $y \leq 1$, and $0 \leq x+y \leq 1$) having different compositions or different impurity contents are alternately stacked. For example, the current diffusion layer may have an n-type superlattice structure in which n-type GaN layers and/or $Al_xIn_yGa_zN$ layers (where $0 \leq x \leq 1$, $0 \leq y \leq 1$, $0 \leq z \leq 1$, and $x+y+z \neq 0$) each having a thickness of about 1 nm to about 500 nm are alternately stacked. An impurity concentration of the current diffusion layer may be in the range of about $2 \times 10^{18}$ cm$^{-3}$ to about $9 \times 10^{19}$ cm$^{-3}$.

The active layer 124 may be between the first conductive semiconductor layer 122 and the second conductive semiconductor layer 126. The active layer 124 may discharge light having some energy by recombination of electrons and holes. The active layer 124 may have a multiple quantum well (MQW) structure in which quantum well layers and quantum barrier layers are alternately stacked. In example embodiments, the quantum well layer and the quantum barrier layer may include $In_xAl_yGa_{(1-x-y)}N$ layers (where $0 \leq x$, $y \leq 1$, and $0 \leq x+y \leq 1$) having different compositions. For example, the quantum well layer may include an $In_xGa_{1-x}N$ layer (where $0 \leq x \leq 1$), and the quantum barrier layer may include a GaN layer or an AlGaN layer. A thickness of each of the quantum well layer and the quantum barrier layer may be in the range of about 1 nm to about 50 nm. The active layer 124 is not limited to having the MQW structure and may have a single quantum well structure.

The second conductive semiconductor layer 126 may include a nitride semiconductor layer having a composition of p-type $In_xAl_yGa_{(1-x-y)}N$ (where $0 \leq x<1$, $0 \leq y<1$, and $0 \leq x+y<1$). For example, the p-type impurities included in the second conductive semiconductor layer 126 may be magnesium (Mg).

In example embodiments, the second conductive semiconductor layer 126 may include an electron blocking layer, a low-concentration p-type GaN layer, and a high-concentration p-type GaN layer that is provided as a contact layer. For example, the electron blocking layer may have a structure in which a plurality of $In_xAl_yGa_{(1-x-y)}N$ layers (where $0 \leq x$, $y \leq 1$, and $0 \leq x+y \leq 1$) having a thickness of about 5 nm to about 100 nm and having different compositions are alternately stacked, or may include a single layer including $Al_yGa_{(1-y)}N$ (where $0<y \leq 1$). An energy band gap of the electron blocking layer may decrease in a direction away from the active layer 124. For example, aluminum (Al) content in the electron blocking layer may decrease in the direction away from the active layer 124.

In other example embodiments, the light-emitting stack structure 120 may further include a buffer structure between the first conductive semiconductor layer 122 and the partition wall structure PW. The buffer structure may have any one of buffer structures BS1 and BS2, which will be described below with reference to FIGS. 8A and 8B, and buffer structures having various structures, which are formed by applying various modifications and changes within the scope of embodiments.

The first conductive semiconductor layer 122, the active layer 124, and the second conductive semiconductor layer 126 may be sequentially stacked in the vertical direction (Z direction). A surface of the first conductive semiconductor layer 122, which is an opposite side of a surface of the first conductive semiconductor layer 122 in contact with the active layer 124, may include a concave/convex surface 122C.

An insulating liner 132, a first electrode 134A, and a second electrode 134B may be in the light-emitting stack structure 120. A wiring structure 140, an inter-wiring insulating film 152, and a buried insulating film 154 may be on the first electrode 134A and the second electrode 134B. The wiring structure 140 may have a multilayered structure. The inter-wiring insulating film 152 may fill respective spaces between a plurality of conductive lines included in the wiring structure 140. The buried insulating film 154 may cover the wiring structure 140.

The insulating liner 132 covering the light-emitting stack structure 120 may isolate the plurality of light-emitting stack structures 120 included in the plurality of light-emitting cells CL from each other. The insulating liner 132 may electrically isolate the first electrode 134A and the second electrode 136A from each other. The insulating liner 132 may include a material having a relatively low light absorptivity. In example embodiments, the insulating liner 132 may include silicon oxide, silicon oxynitride, silicon nitride, aluminum oxide, aluminum nitride, or a combination thereof. In other example embodiments, the insulating liner 132 may have a multilayered reflective structure in which a plurality of insulating films having different refractive indexes are alternately stacked. For example, the multilayered reflective structure may include a distributed Bragg reflector (DBR) in which first insulating films having a first refractive index and second insulating films having a second refractive index are alternately stacked. The multilayered reflective structure may have a structure in which a plurality of insulating films having different refractive indexes are repeatedly stacked several to several hundred times. Each of the plurality of insulating films included in the multilayered reflective structure may be selected from $SiO_2$, SiN, $Si_3N_4$, SiON, $TiO_2$, $Al_2O_3$, $ZrO_2$, TiN, AlN, TiAlN, TiSiN, and a combination thereof.

The first electrode 134A may be connected to the first conductive semiconductor layer 122. The second electrode 134B may be connected to the second conductive semiconductor layer 126. Each of the first electrode 134A and the second electrode 134B may include a metal material having a high reflectivity. In example embodiments, each of the first electrode 134A and the second electrode 134B may include silver (Ag), aluminum (Al), nickel (Ni), chromium (Cr), gold (Au), platinum (Pt), palladium (Pd), tin (Sn), tungsten (W), rhodium (Rh), iridium (Ir), ruthenium (Ru), magnesium (Mg), zinc (Zn), titanium (Ti), copper (Cu), or a combination thereof, without being limited thereto.

The wiring structure 140 having the multilayered structure may include a plurality of conductive lines, which are connected to the plurality of light-emitting cells CL. The wiring structure 140 may be on the plurality of light-emitting cells CL and electrically connect the plurality of light-emitting cells CL to each other.

The inter-wiring insulating film 152 may fill respective spaces between the plurality of conductive lines included in the wiring structure 140. The buried insulating film 154 may cover the wiring structure 140 and the inter-wiring insulating film 152.

The wiring structure 140 may include a plurality of first conductive lines 142, a plurality of second conductive lines 144, and a plurality of third conductive lines 146, which are formed on the plurality of light-emitting cells CL. Each of the plurality of first conductive lines 142 may be connected to the second electrode 134B. The plurality of second conductive lines 144 may include conductive lines configured to connect a plurality of first electrodes 134A included in the plurality of pixels PX to each other and conductive lines configured to connect a plurality of second electrodes 134B included in the plurality of pixels PX to each other through the plurality of first conductive lines 142. The plurality of third conductive lines 146 may connect some second conductive lines 144 selected out of the plurality of second conductive lines 144 to some conductive pads 148 (e.g., the first conductive pads 148A) selected out of the plurality of conductive pads 148.

Each of the plurality of first conductive lines 142, the plurality of second conductive lines 144, and the plurality of third conductive lines 146 included in the wiring structure 140 may include Ag, Al, Ni, Cr, Au, Pt, Pd, Sn, W, Rh, Ir, Ru, Mg, Zn, Ti, Cu, or a combination thereof, without being limited thereto. Each of the inter-wiring insulating film 152 and the buried insulating film 154 may include silicon oxide, silicon oxynitride, silicon nitride, aluminum oxide, aluminum nitride, a silicone resin, an epoxy resin, an acrylic resin, polyimide, or a combination thereof, without being limited thereto.

The plurality of light-emitting stack structures 120 included in the plurality of light-emitting cells CL may be in the pixel region PXR and apart from each other with the isolation region (refer to S1 in FIG. 7C) therebetween in a lateral direction. In example embodiments, a sidewall 120S of each of the plurality of light-emitting stack structures 120 defining the isolation region S1 may be inclined at an inclination angle of about 60° to about 90° with respect to a horizontal plane (refer to an X-Y plane in FIG. 1C), which is parallel to a first surface 162S1 of a support substrate 162 included in the support structure 160. In the lateral direction (X direction or Y direction), a width of a portion of the isolation region S1, which is closest to the inner partition wall PW1, may be less than or equal to a width of the inner partition wall PW1, without being limited thereto.

The insulating liner 132 may conformally cover the sidewall 120S of each of the plurality of light-emitting stack structures 120, which form an inner wall of the isolation region S1, and a surface of the inner partition wall PW1, which faces the isolation region S1.

The plurality of conductive pads 148 may be on the pad region PDR and connected to the plurality of conductive lines included in the wiring structure 140. Each of the plurality of conductive pads 148 may partially pass through the insulating liner 132 and the inter-wiring insulating film 152 and be connected to one selected from the plurality of first conductive lines 142, the plurality of second conductive lines 144, and the plurality of third conductive lines 146, which are included in the wiring structure 140. For instance, the first conductive pad 148A may be connected to one of the plurality of conductive lines of the wiring structure 140, which is connected to the first conductive semiconductor layer 122, and the second conductive pad 148B may be connected to one of the plurality of conductive lines of the wiring structure 140, which is connected to the second conductive semiconductor layer 126.

Although FIGS. 1B and 1C partially illustrate exemplary structures of the plurality of first conductive lines 142, the plurality of second conductive lines 144, the plurality of third conductive lines 146, and the plurality of conductive pads 148, embodiments are not limited thereto. In example embodiments, at least some of the plurality of first conductive lines 142, the plurality of second conductive lines 144, and the plurality of third conductive lines 146 may be positioned to connect at least some of the plurality of light-emitting cells CL in series to each other. In other example embodiments, the plurality of first conductive lines 142, the plurality of second conductive lines 144, and the plurality of third conductive lines 146 may be positioned to connect at least some of the plurality of light-emitting cells CL in parallel to each other. The connection and arrangement of each of the plurality of first conductive lines 142, the plurality of second conductive lines 144, the plurality of third conductive lines 146, and the plurality of conductive pads 148 may be variously modified.

The partition wall structure PW may be apart from the wiring structure 140 with the plurality of light-emitting cells CL therebetween in the vertical direction (Z direction).

The support structure 160 may be apart from the plurality of light-emitting cells CL with the wiring structure 140 therebetween in the vertical direction (Z direction). The support structure 160 may be on the buried insulating film 154 covering the wiring structure 140. The support structure 160 may be opposite the plurality of light-emitting cells CL with the wiring structure 140 and the buried insulating film 154 therebetween and have a flat-panel shape in the lateral direction (e.g., the X direction and the Y direction). A first adhesive layer 156 may be between the support structure 160 and the wiring structure 140. The buried insulating film 154 may be between the wiring structure 140 and the first adhesive layer 156. The support structure 160 may be adhered onto the buried insulating film 154 by the first adhesive layer 156.

A printed circuit board (PCB) 190 may be adhered onto the support structure 160 by a second adhesive layer 186. The PCB 190 may overlap the plurality of light-emitting cells CL with the wiring structure 140 and the support structure 160 therebetween in the vertical direction (Z direction).

The support structure 160 may reinforce insulation characteristics between the wiring structure 140 and the PCB 190 For example, the buried insulating film 154 covering the wiring structure 140 may include physically vulnerable portions. For example, partial regions of the buried insulating film 154 may have relatively small thicknesses or have structures (e.g., steps or inclined surfaces) that are vulnerable to physical deformation. In this case, cracks may occur in the partial regions of the buried insulating film 154 due to deformation caused by small external impact, a difference in coefficient of thermal expansion (CTE) between components of the light source module 100, or stress induced by the components. Alternatively, during or after the process of manufacturing the light source module 100, for example, a structure including the plurality of light-emitting cells CL supported on the support structure 160 may be adhered onto the PCB 190 as described below with reference to FIG. 7N. Thereafter, when there is a temperature variation in the obtained resultant structure, physical deformation or cracks may occur in partial regions of the buried insulating film 154 due to a difference in CTE between the PCB 190 and a partial region including the plurality of light-emitting cells CL. According to embodiments, the support structure 160 capable of reinforcing insulation characteristics may be between the buried insulating film 154 covering the wiring structure 140 and the PCB 190 in the light source module 100. Thus, even when physical deformation or cracks occur in the buried insulating film 154 covering the wiring structure 140 during or after the process of manufacturing the light source module 100, the formation of an electrical path from the wiring structure 140 through the buried insulating film 154 and the support substrate 162 to the PCB 190 in the vertical direction may be prevented. Therefore, failures caused by electrical conduction through an undesired vertical path between the plurality of light-emitting cells CL and the PCB 190 may be prevented.

The support structure 160 may include the support substrate 162 and an upper insulating film 164 and a lower insulating film 166, which cover both surfaces of the support substrate 162. The upper insulating film 164 may cover a first surface 162S1 of the support substrate 162, which faces the wiring structure 140, and the lower insulating film 166 may cover a second surface 162S2 of the support substrate 162, which faces the PCB 190. The upper insulating film 164 may be apart from the wiring structure 140 with the adhesive layer 156 therebetween in the vertical direction (e.g., the Z direction). In example embodiments, the upper insulating film 164 may be in contact with the first surface 162S1 of the support substrate 162, and the lower insulating film 166 may be in contact with the second surface 162S2 of the support substrate 162. However, embodiments are not limited thereto. For example, at least one middle film (not shown) may be between the upper insulating film 164 and the support substrate 162 and/or between the lower insulating film 166 and the support substrate 162. The at least one middle film may include an insulating material, a semiconductor material, a conductive material, or a combination thereof.

The support substrate 162 may include an insulating substrate or a conductive substrate. In example embodiments, the support substrate 162 may have an electric resistance of at least several MΩ, for example, at least 50 MΩ. The greater the electrical resistance of the support substrate 162, the better the electrical insulating characteristics of the support structure 160. For example, the support substrate 162 may include doped silicon, undoped silicon, Al$_2$O$_3$, tungsten (W), copper (Cu), a bismaleimide triazine (BT) resin, an epoxy resin, polyimide, a liquid crystal (LC) polymer, a copper clad laminate, or a combination thereof, but embodiments are not limited thereto.

In example embodiments, the support substrate 162 may have a thickness of at least 150 μm (e.g., about 200 μm to about 400 μm) in the vertical direction (Z direction). When the support substrate 162 has an excessively small thickness, emission characteristics of the light source module 100 may be adversely affected. For example, warpage of the support substrate 162 may occur, and thus, a pitch between the plurality of light-emitting cells CL may be undesirably changed. When the support substrate 162 has an excessively great thickness, components around the support substrate 162 may be deformed due to stress caused by the support substrate 162.

Each of the upper insulating film 164 and the lower insulating film 166 may have an electric resistance of at least several tens of MΩ, for example, at least 50 MΩ. As recognized by a person skilled in the art, the resistance of a film may be expressed as Ohms per square. The "per square" notation does not refer to a scientific unit. As an example, an electrical sheet resistance of upper insulating film 164, in some embodiments, is 50 MΩ per square or greater. The greater the electrical resistance of each of the upper insulating film 164 and the lower insulating film 166, the better the electrical insulating characteristics of the support structure 160. For example, each of the upper insulating film 164 and the lower insulating film 166 may include $SiO_2$, $Si_3N_4$, $Al_2O_3$, $HfSiO_4$, $Y_2O_3$, $ZrSiO_4$, $HfO_2$, $ZrO_2$, $Ta_2O_5$, $La_2O_3$, or a combination thereof, but embodiments are not limited to the materials described above. In example embodiments, the upper insulating film 164 may include the same material as the lower insulating film 166. In other example embodiments, the upper insulating film 164 and the lower insulating film 166 may include different materials.

In example embodiments, each of the upper insulating film 164 and the lower insulating film 166 may have a thickness of several nm to several tens of μm in the vertical direction (Z direction). For instance, each of the upper insulating film 164 and the lower insulating film 166 may have a thickness of about 100 nm to about 1000 nm in the vertical direction (Z direction). When the upper insulating film 164 and the lower insulating film 166 have excessively small thicknesses, withstanding voltage characteristics of the support structure 160 may be degraded, and thus, it may be difficult to obtain desired insulating characteristics between the wiring structure 140 and the support substrate 162 or between the wring structure 140 and the PCB 190. When the upper insulating film 164 and the lower insulating film 166 have excessively great thicknesses, the warpage of the support substrate 162 may worsen due to stress caused by the upper insulating film 164 and the lower insulating film 166, thereby adversely affecting the emission characteristics of the light source module 100.

The PCB 190 may use a typical circuit substrate for a package without limitation. In example embodiments, a chip including a light source, a backlight driver circuit, a camera driver circuit, or a power driver circuit may be mounted on the PCB 190. The PCB 190 may be electrically connected to the plurality of light-emitting cells CL through the plurality of conductive pads 148. In example embodiments, the PCB 190 may supply power to the plurality of light-emitting cells CL. In example embodiments, a circuit pattern or terminals may be formed on at least one surface of the PCB 190.

Each of the first adhesive layer 156 and the second adhesive layer 186 may include an insulating material, for example, silicon oxide, silicon nitride, a polymer such as an ultraviolet (UV)-curing material, or resins. In example embodiments, each of the first adhesive layer 156 and the second adhesive layer 186 may include a eutectic adhesive material, such as AuSn, NiSn, AuSi, CuSn, AgSn, PtSn, NiSnAu, and PtSnAu, solder paste, and/or an epoxy resin including metal powder.

The partition wall structure PW may be apart from the support structure 160 with the light-emitting stack structure 120 and the wiring structure 140 therebetween in the vertical direction (Z direction). A portion of the partition wall structure PW may be in contact with the insulating liner 132.

The partition wall structure PW may include a material having a high thermal conductivity. In example embodiments, the partition wall structure PW may include a semiconductor material, a metal material, or an insulating material. The semiconductor material included in the partition wall structure PW may include silicon (Si) or silicon carbide (SiC). The metal material included in the partition wall structure PW may include aluminum (Al), gold (Au), silver (Ag), platinum (Pt), nickel (Ni), chromium (Cr), titanium (Ti), copper (Cu), or a mixture thereof. For example, the metal material may include a plating layer. The insulating material included in the partition wall structure PW may include $Al_2O_3$, $MgAl_2O_4$, MgO, $LiAlO_2$, $LiGaO_2$, and/or resins. The resin may include a silicone-based resin or an epoxy resin. For example, the partition wall structure PW may include a resin mixed with titanium oxide or another reflective material. In other example embodiments, the partition wall structure PW may include sapphire, gallium nitride (GaN), or a combination thereof.

The plurality of pixel spaces (refer to PS in FIG. 7I) defined by the partition wall structure PW on the plurality of light-emitting cells CL may be filled with a fluorescent layer 174.

Sidewalls and a top surface of the partition wall structure PW and the concave/convex surface 122C of the first conductive semiconductor layer 122 may be covered by a protective film 172. The fluorescent layer 174 may fill spaces of the plurality of pixel spaces PS, which remain on the protective film 172.

In example embodiments, the protective film 172 may include an oxide or a metal oxide, such as silicon oxide, aluminum oxide, and titanium oxide. In other example embodiments, the protective film 172 may include a DBR layer. The DBR layer may have a structure in which a plurality of insulating films having different refractive indexes are repeatedly stacked several to several hundred times. The insulating films included in the DBR layer may include an oxide, a nitride, or a combination thereof. For example, the insulating films included in the DBR layer may include $SiO_2$, SiN, $SiO_xN_y$, $TiO_2$, $Si_3N_4$, $Al_2O_3$, TiN, AlN, $ZrO_2$, TiAlN, TiSiN, or a combination thereof, without being limited thereto. In example embodiments, the protective film 172 may have a multilayered structure including a stack structure of a silicon oxide film, an aluminum oxide film, and a silicon oxide film.

Figure 7A:
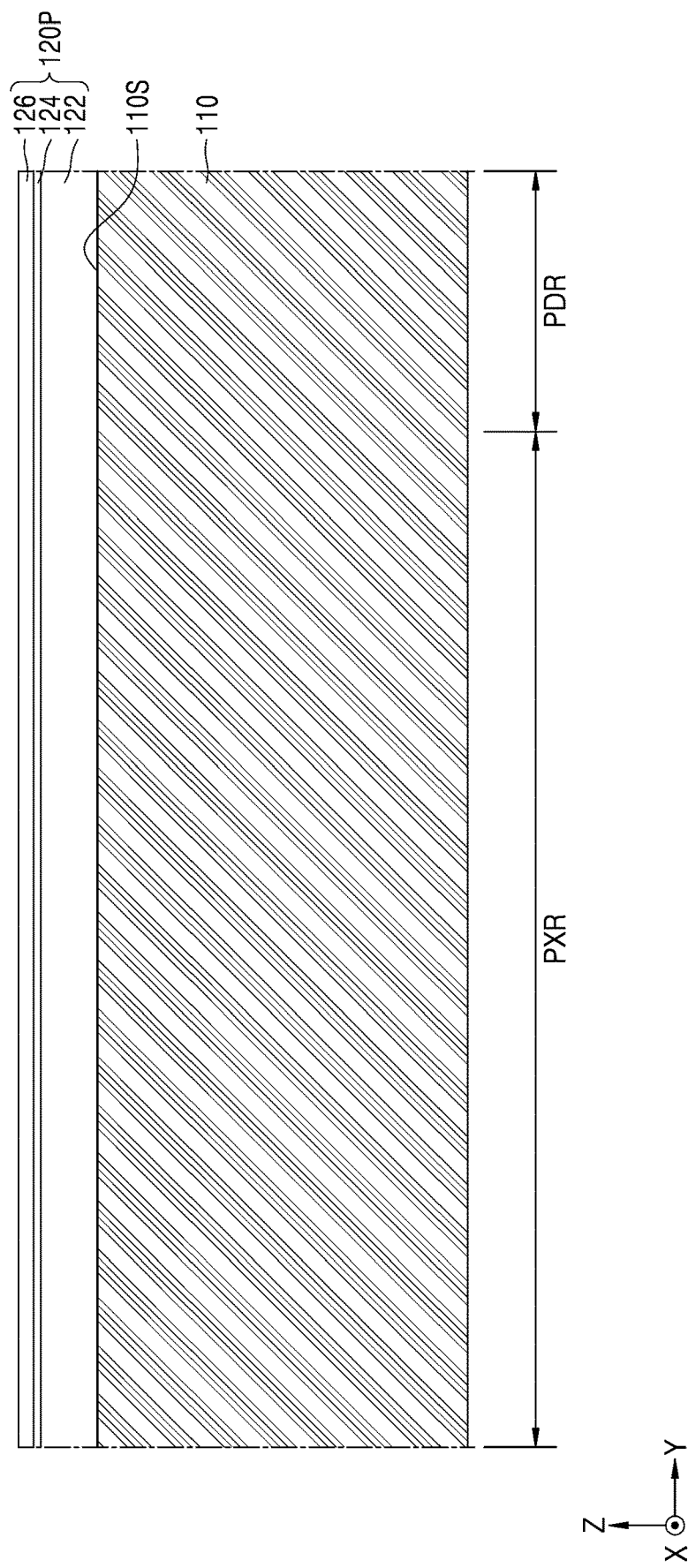
FIGS. 7A, 7B, 7C, 7D, 7E, 7F, 7G, 7H, 7I, 7J, 7K, 7L, 7M and 7N are cross-sectional views of a process sequence of a method of manufacturing a light source module, according to an example embodiment.
Figure 7B:
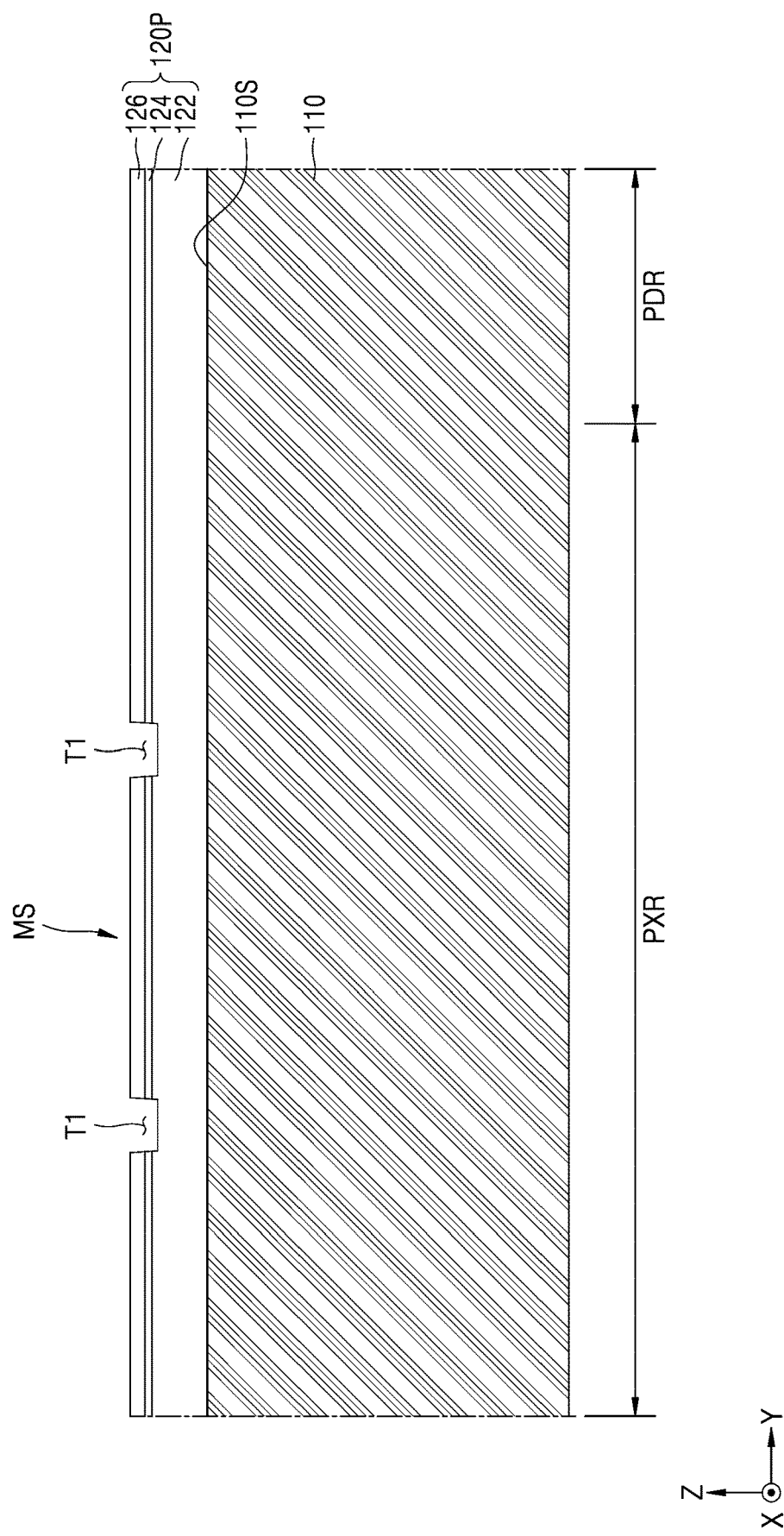
Figure 7C:
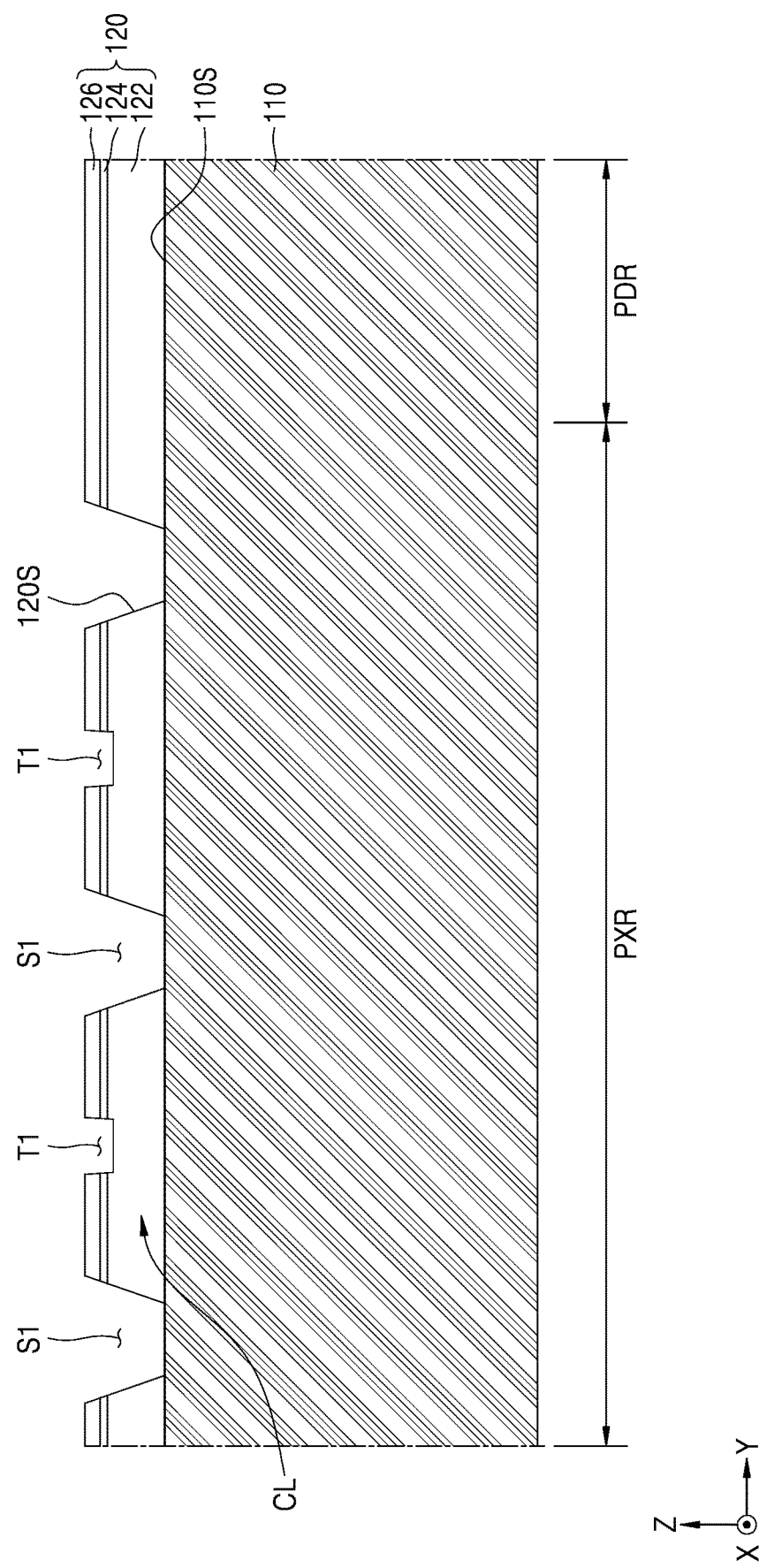
Figure 7D:
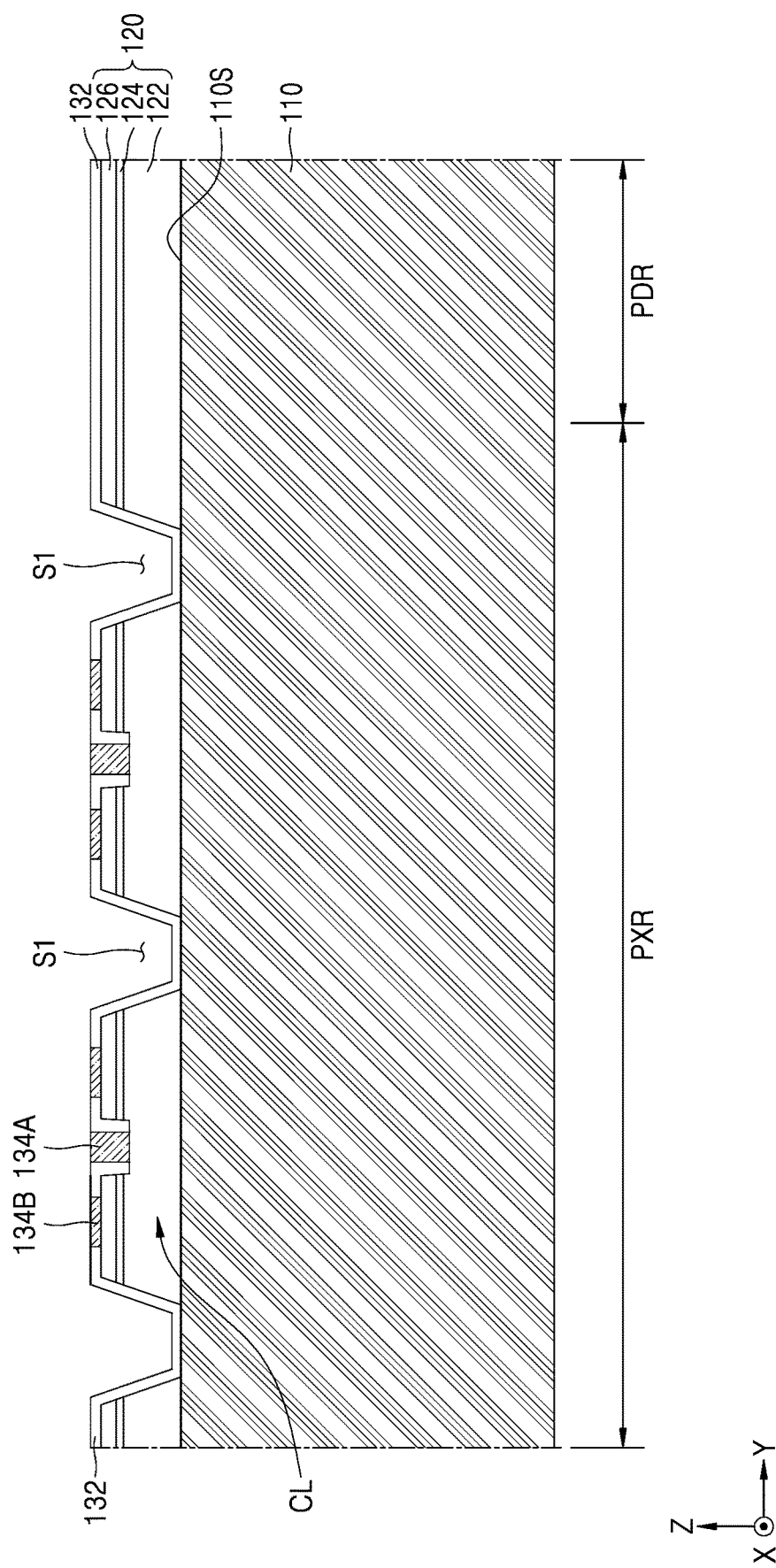
Figure 7E:
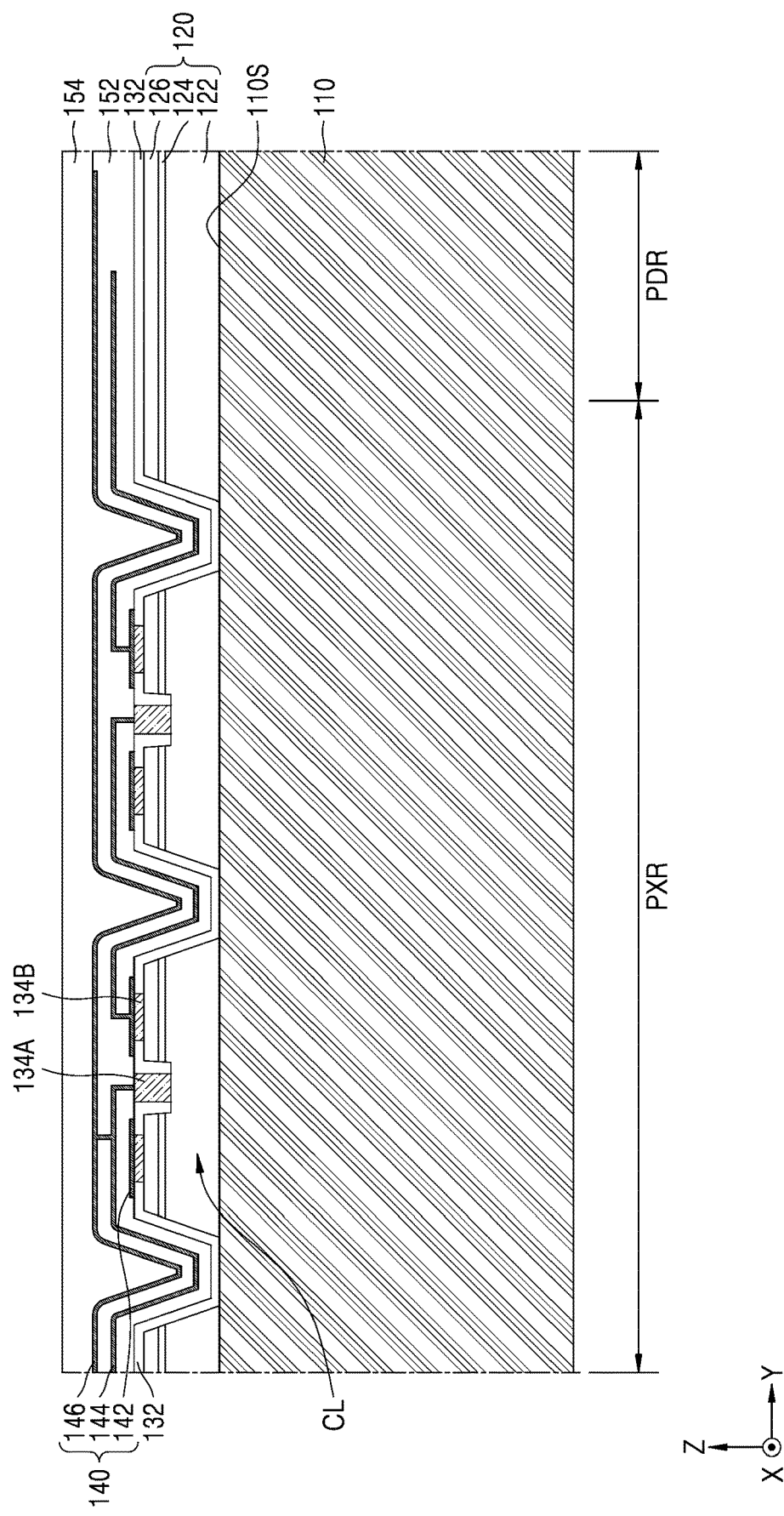
Figure 7F:
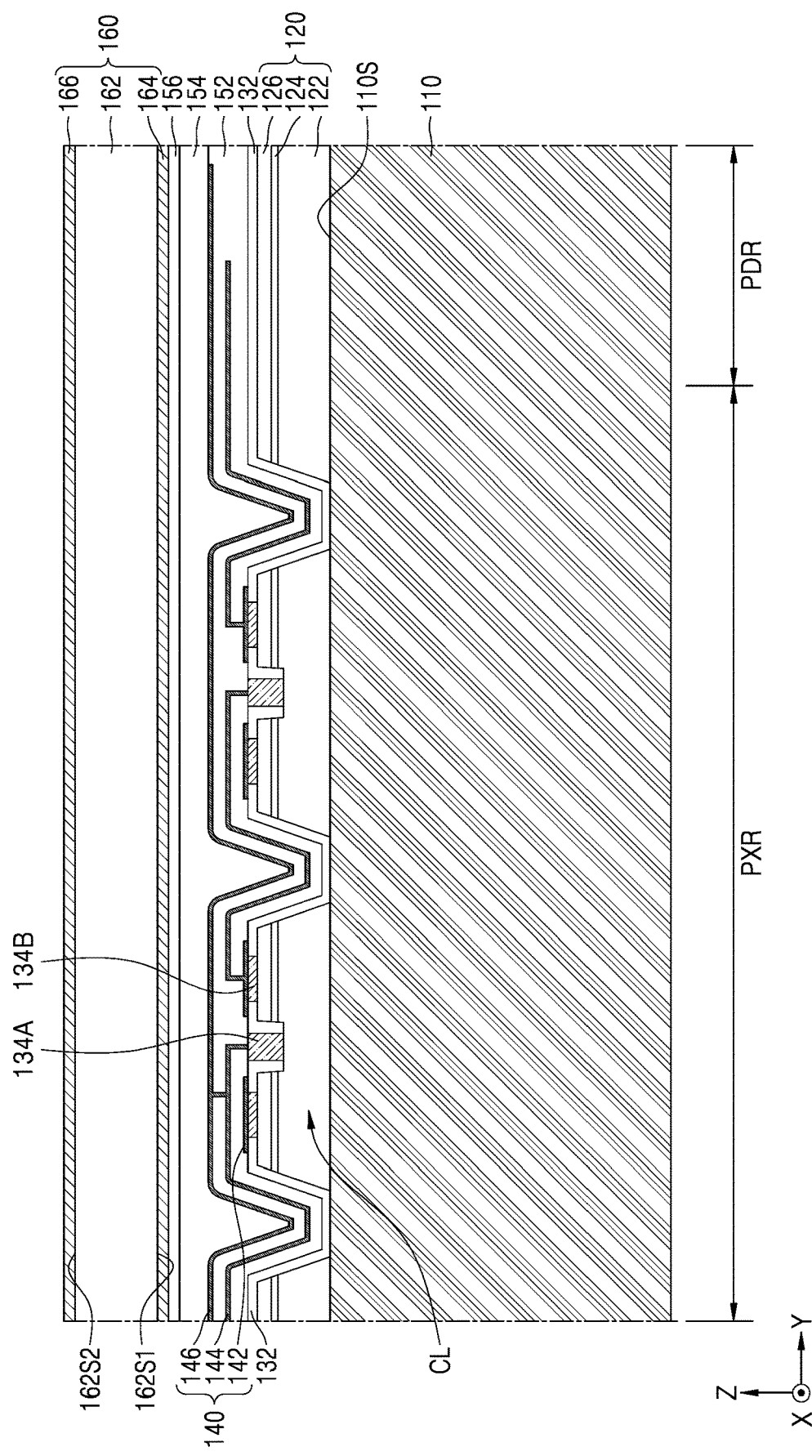
Figure 7G:
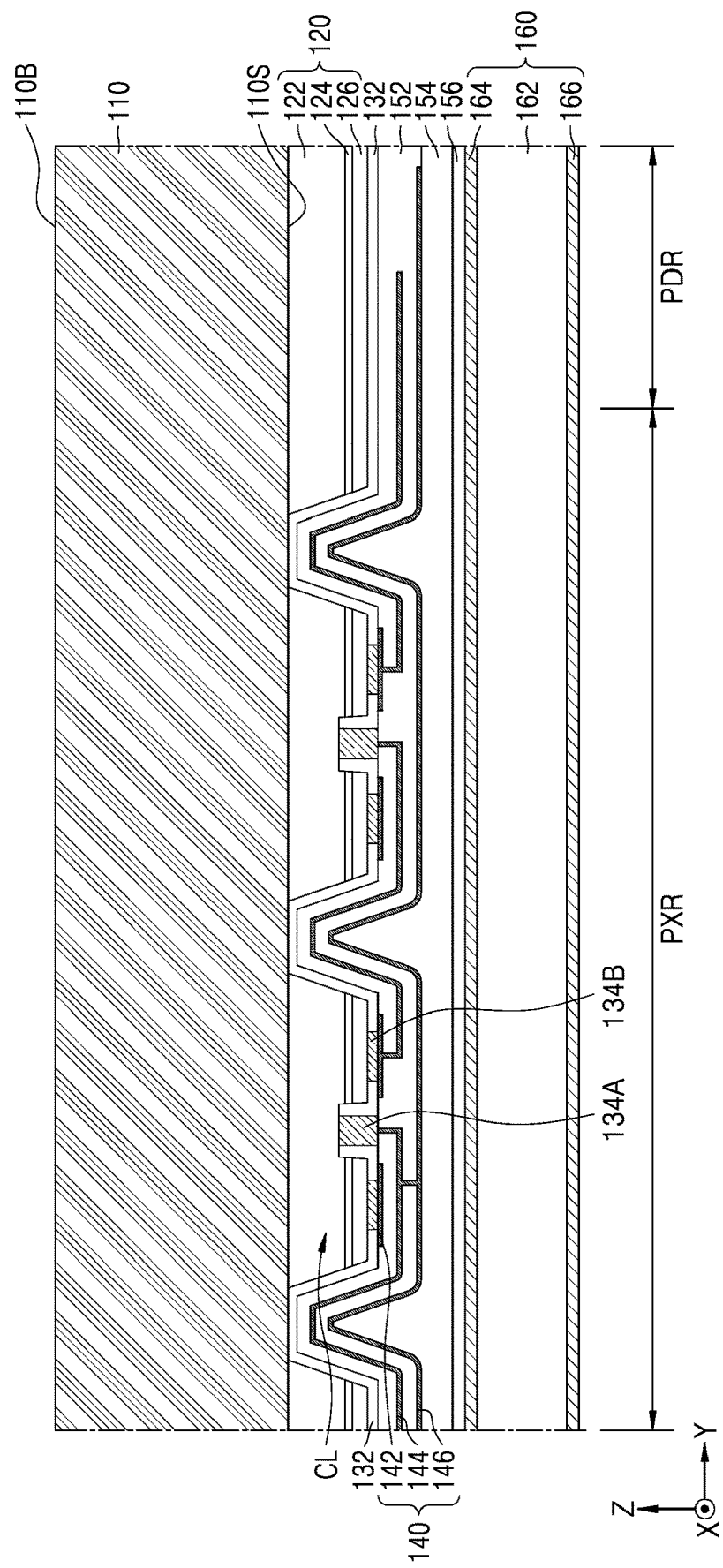
Figure 7H:
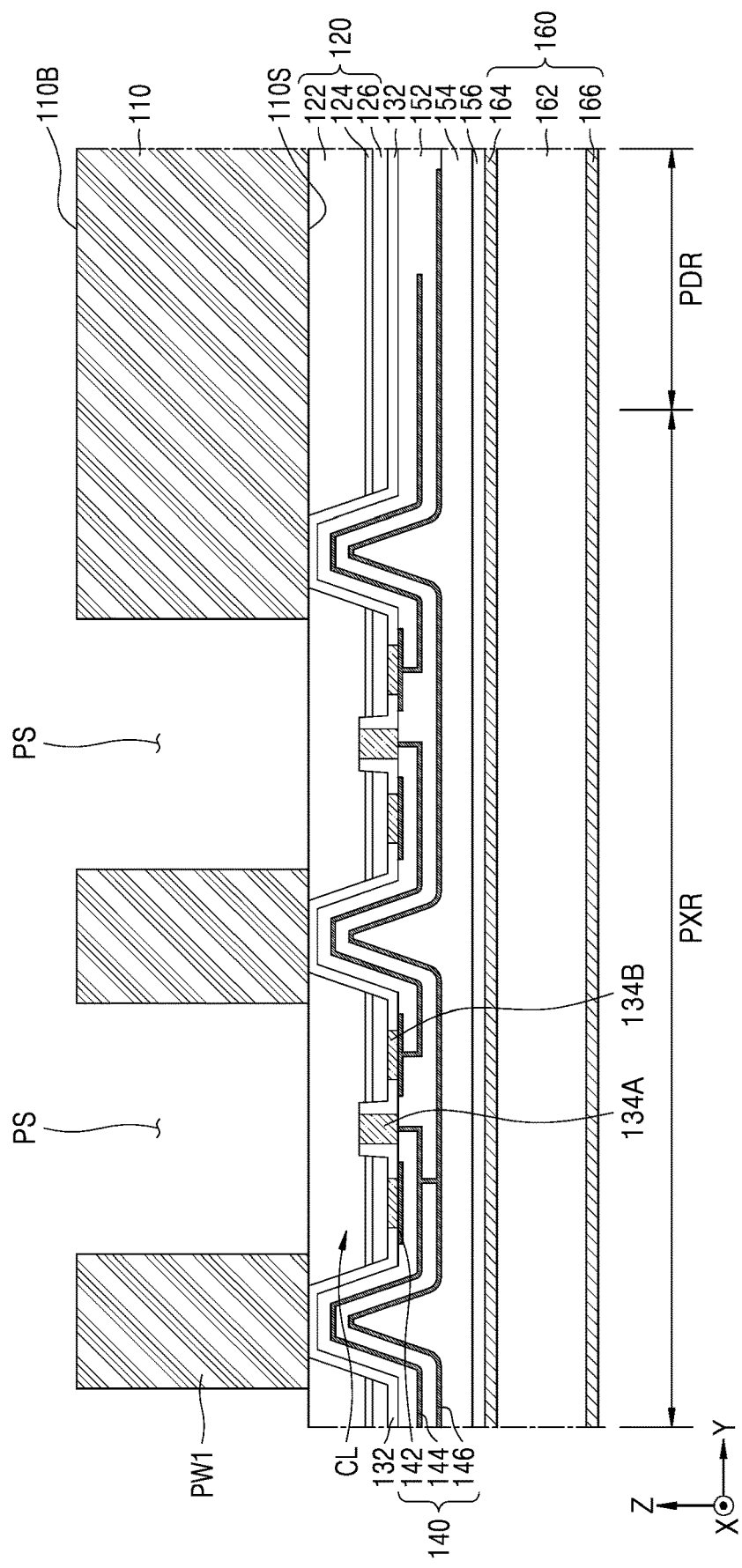
Figure 7I:
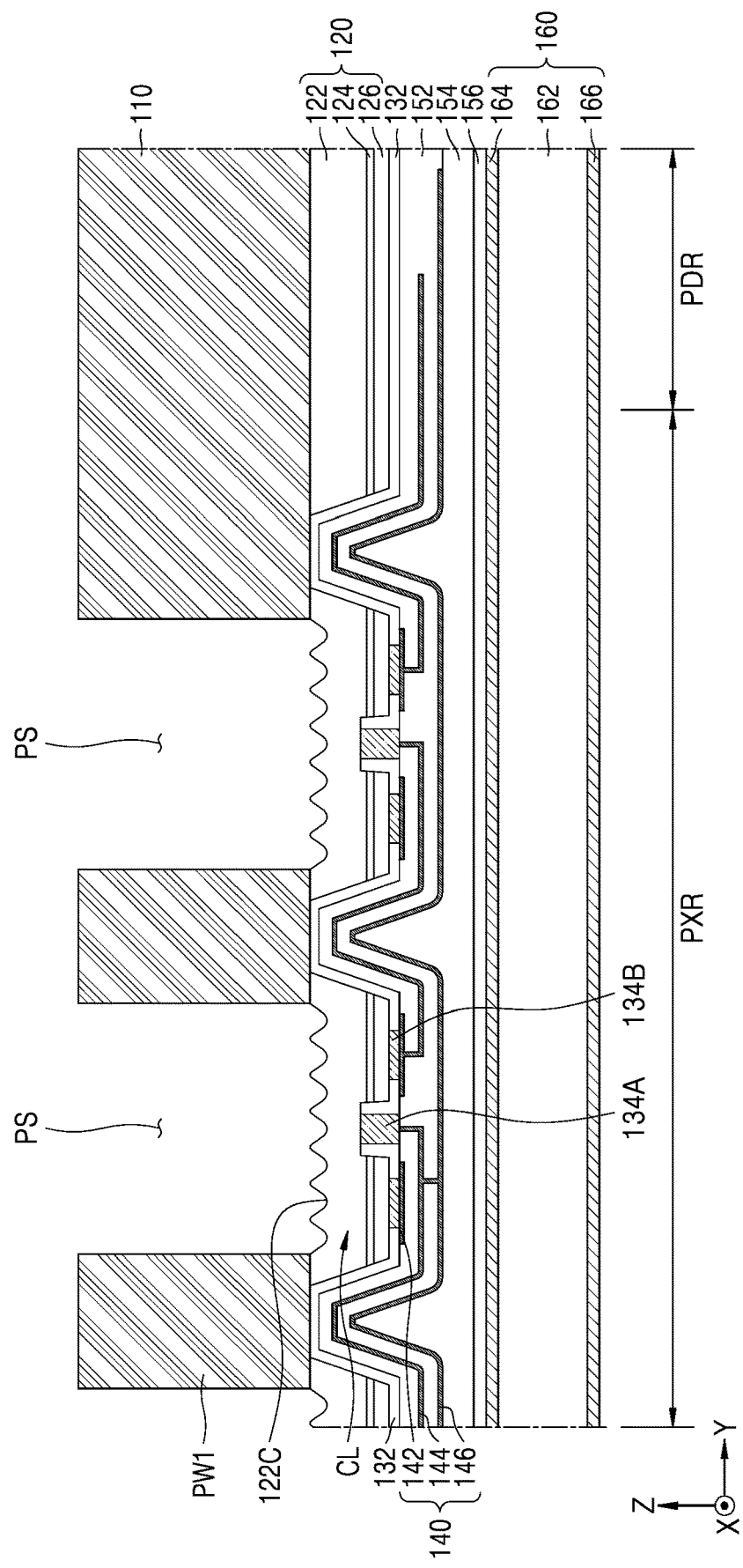
Figure 7J:
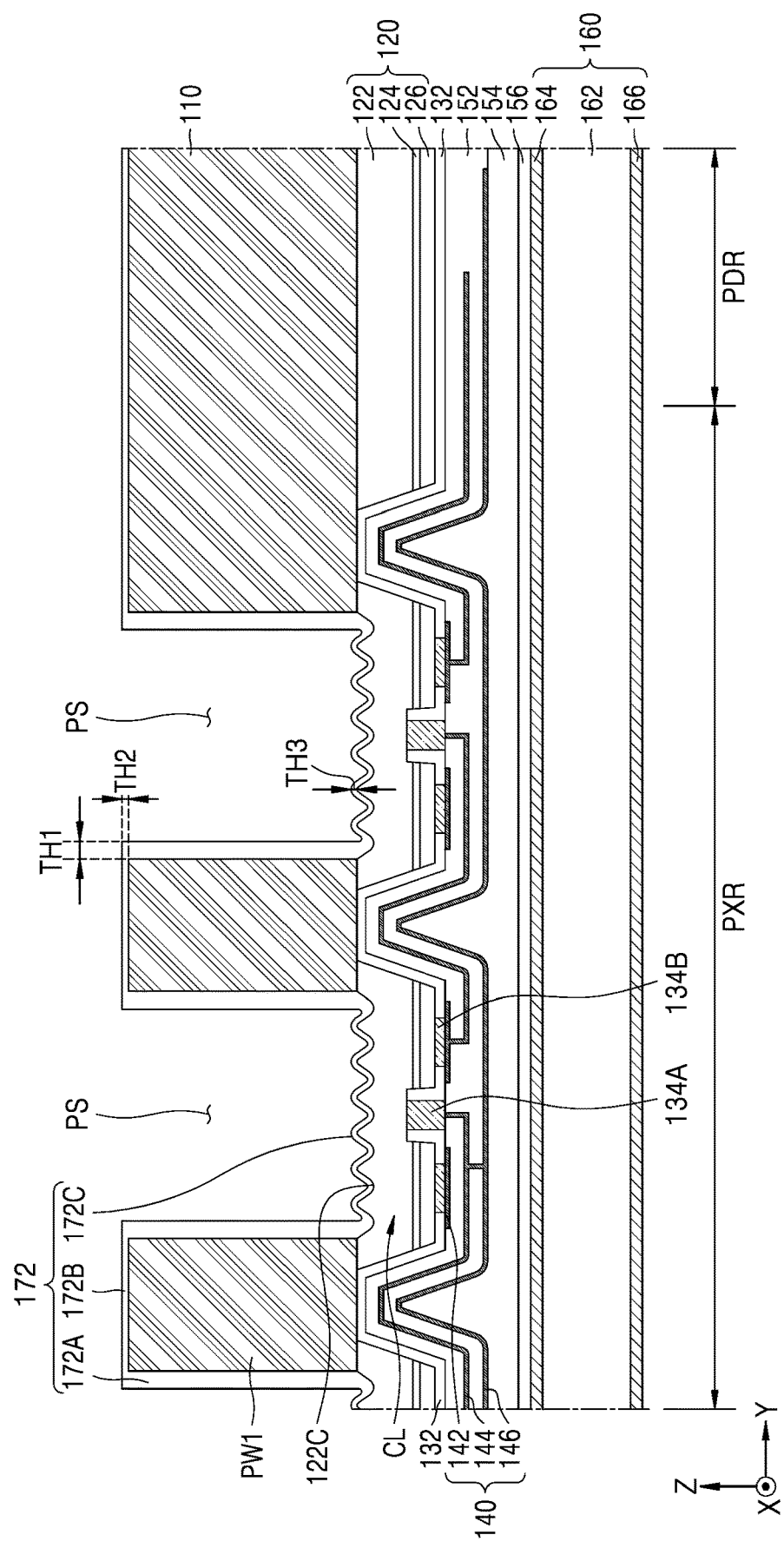

In example embodiments, as shown in FIG. 7J, the protective film 172 may include a first protective film portion 172A, a second protective film portion 172B, and a third protective film portion 172C. The first protective film portion 172A may cover sidewalls facing the pixel space PS on the light-emitting cell CL, from among sidewalls of the inner partition wall PW1 and sidewalls of the outer partition wall PW2. The second protective film portion 172B may cover a top surface of each of the inner partition wall PW1 and the outer partition wall PW2. The third protective film portion 172C may cover the concave/convex surface 122C of the first conductive semiconductor layer 122. A first thickness TH1 of the first protective film portion 172A may be greater than a second thickness TH2 of the second protective film portion 172B and be greater than a third thickness TH3 of the third protective film portion 172C covering the concave/convex surface 122C of the first conductive semiconductor layer 122. The second thickness TH2 may be equal to or different from the third thickness TH3. The third protective film portion 172C of the protective film 172 may be formed to conformally cover the concave/convex surface 122C of the first conductive semiconductor layer 122.

In an example, the first protective film portion 172A of the protective film 172 may have a structure in which the stack structure of the silicon oxide film, the aluminum oxide film, and the silicon oxide film is sequentially stacked twice on the sidewalls of the partition wall structure PW, The second protective film portion 172B may have one stack structure of the silicon oxide film, the aluminum oxide film, and the silicon oxide film, which is formed on the top surface of the partition wall structure PW. Similarly to the second protective film portion 172B, the third protective film portion 172C may have one stack structure of the silicon oxide film, the aluminum oxide film, and the silicon oxide film, which is formed on the concave/convex surface 122C of the first conductive semiconductor layer 122. In another example, each of the first protective film portion 172A, the second protective film portion 172B, and the third protective film portion 172C of the protective film 172 may have one stack structure of a silicon oxide film, an aluminum oxide film, and a silicon oxide film. A thickness of each of the silicon oxide film and the aluminum oxide film included in the first protective film portion 172A may be greater than a thickness of each of the silicon oxide film and the aluminum oxide film included in the second protective film portion 172B and the third protective film portion 172C. The first protective film portion 172A of the protective film 172 may function as a reflective layer. The first protective film portion 172A of the protective film 172 may reflect light emitted from the plurality of light-emitting cells CL.

In other example embodiments, the protective film 172 may cover only the sidewalls facing the pixel space PS on the light-emitting cell CL, from among the sidewalls of the inner partition wall PW1 and the sidewalls of the outer partition wall PW2, without covering the concave/convex surface 122C of the first conductive semiconductor layer 122 and the top surface of the partition wall structure PW. In this case, the fluorescent layer 174 may be in contact with the first conductive semiconductor layer 122 in the plurality of pixel spaces PS.

FIGS. 9A to 9E are cross-sectional views of examples of a protective film, which may be adopted as the protective film 172 shown in FIG. 1C. FIGS. 9A to 9E each illustrate an enlarged cross-sectional configuration corresponding to a region 9Y in FIG. 1C.

Figure 9A:
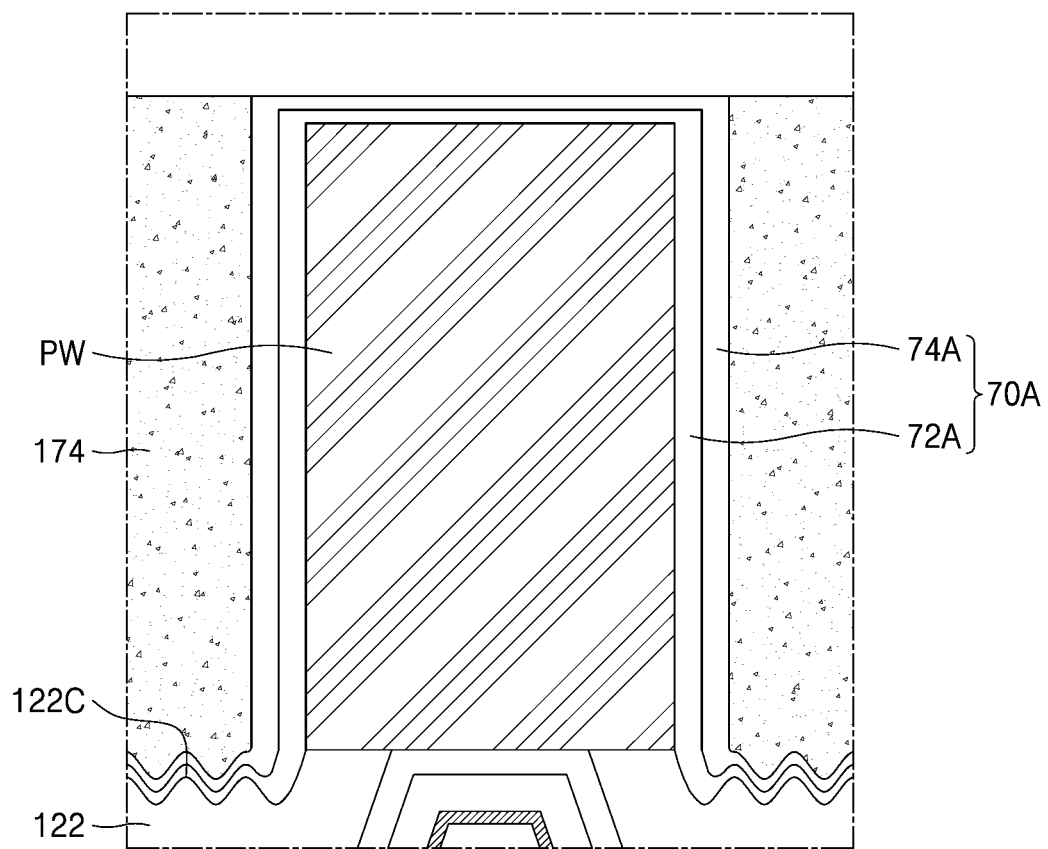
FIGS. 9A, 9B, 9C, 9D and 9E are cross-sectional views of examples of a protective film, which may be included in a light source module according to example embodiments.

Referring to FIG. 9A, a protective film 70A may be adopted as the protective film 172 shown in FIG. 1C. The protective film 70A may include a first passivation layer 72A and a second passivation layer 74A, which conformally cover a top surface and a sidewall of a partition wall PW. The protective film 70A may conformally cover a concave/convex surface 122C of a first conductive semiconductor layer 122.

In example embodiments, the first passivation layer 72A may include a first insulating material, and the second passivation layer 74A may include a second insulating material, which is different from the first insulating material. Each of the first insulating material and the second insulating material may include at least one of silicon oxide, silicon nitride, silicon oxynitride, aluminum oxide, and aluminum nitride.

In example embodiments, a thickness of a portion of the protective film 70A, which covers the sidewall of the partition wall PW, may be greater than a thickness of a portion of the protective film 70A, which covers the top surface of the partition wall PW, and be greater than a portion of the protective film 70A, which covers the concave/convex surface 122C of the first conductive semiconductor layer 122. For example, the portion of the protective film 70A, which covers the sidewall of the partition wall PW, may have a thickness of about 0.5 µm to about 5 µm, and the portion of the protective film 70A, which covers the top surface of the partition wall PW may have a thickness of about 0.1 µm to about 1 µm, without being limited thereto.

Because the portion of the protective film 70A, which covers the top surface of the partition wall PW, is formed to a thickness less than a thickness of the portion of the protective film 70A, which covers the sidewall of the partition wall PW, leaking or penetration of light emitted from a light-emitting cell CL into an adjacent light-emitting cell CL through the portion of the protective film 70A, which covers the top surface of the partition wall PW, may be reduced or prevented. Accordingly, the contrast characteristics of the light source module 100 may be improved.

Figure 9B:
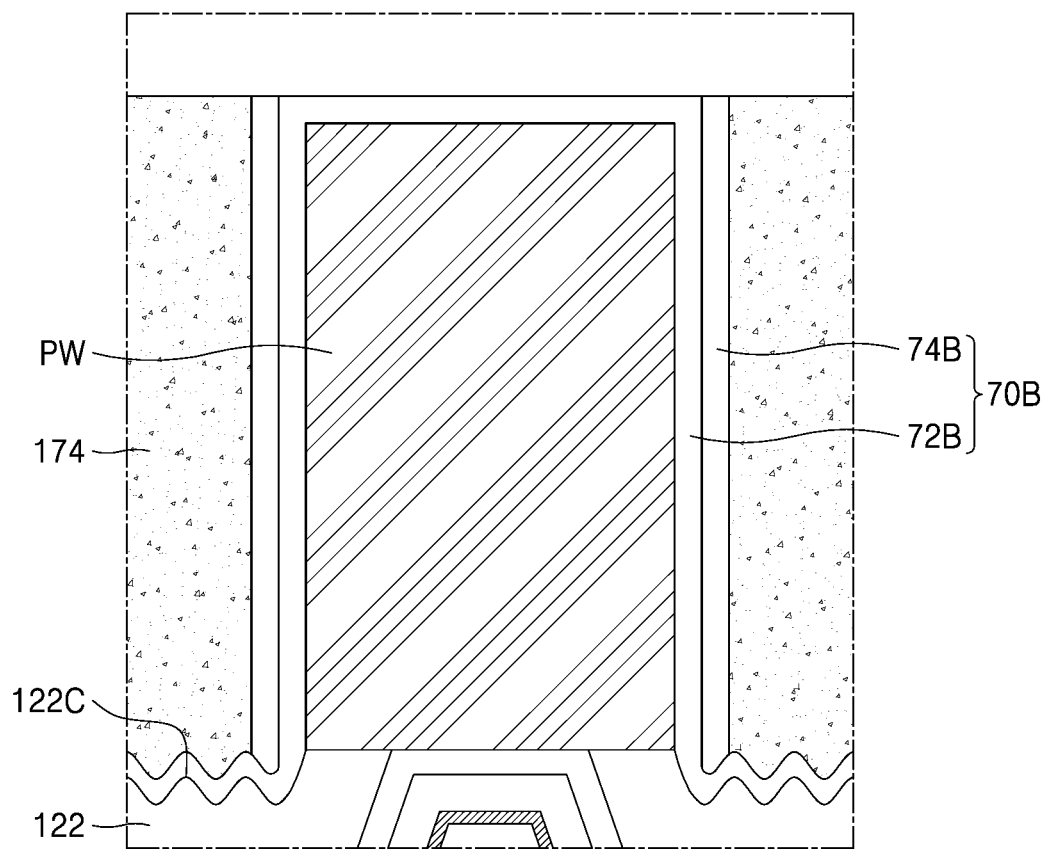

Referring to FIG. 9B, a protective film 70B may be adopted as the protective film 172 shown in FIG. 1C. The protective film 70B may have substantially the same configuration as the protective film 70A shown in FIG. 9A except that the protective film 70B includes a first passivation layer 72B and a second passivation layer 74B. The first passivation layer 72B may conformally cover a top surface and a sidewall of a partition wall PW and a concave/convex surface 122C of a first conductive semiconductor layer 122. The second passivation layer 74B may conformally cover the sidewall of the partition wall PW without covering the top surface of the partition wall PW and the concave/convex surface 122C of the first conductive semiconductor layer 122. Detailed descriptions of the first passivation layer 72B and the second passivation layer 74B may be substantially the same as those of the first passivation layer 72A and the second passivation layer 74A, which are provided with reference to FIG. 9A.

Figure 9C:
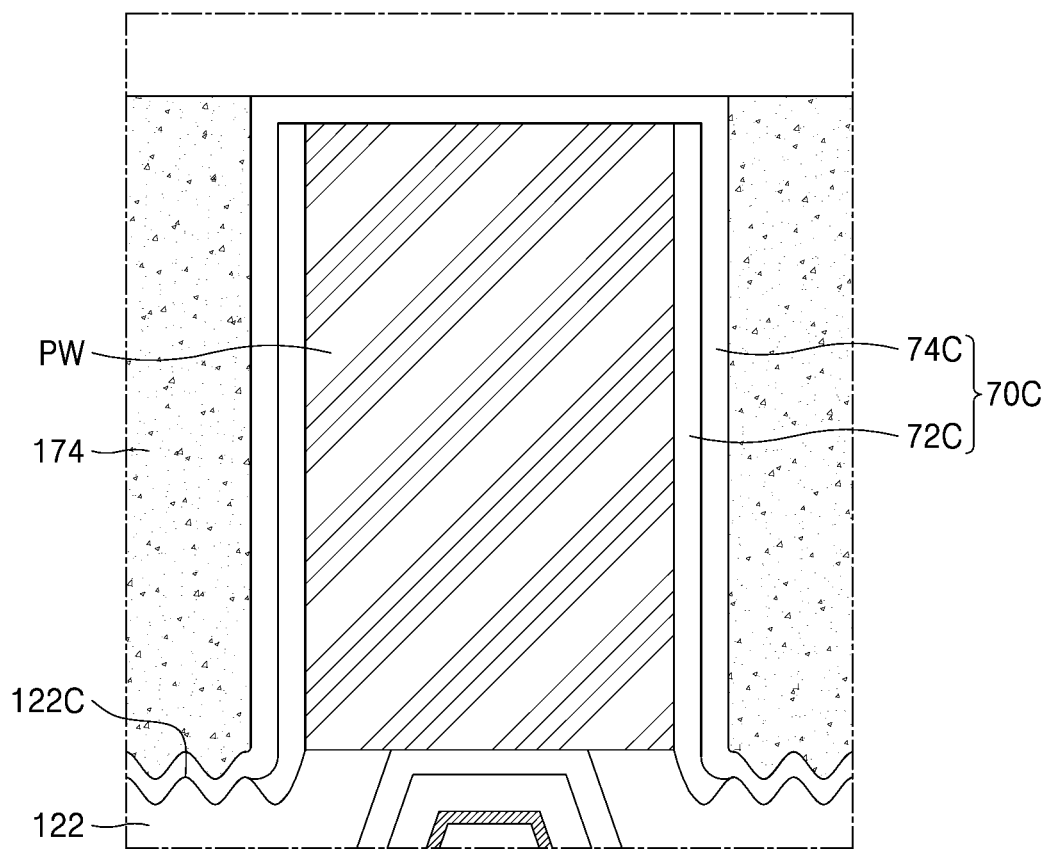

Referring to FIG. 9C, a protective film 70C may be adopted as the protective film 172 shown in FIG. 1C. The protective film 70C may have substantially the same configuration as the protective film 70A shown in FIG. 9A except that the protective film 70C includes a first passivation layer 72C and a second passivation layer 74C. The first passivation layer 72C may conformally cover a sidewall of a partition wall PW without covering a top surface of the partition wall PW and a concave/convex surface 122C of a first conductive semiconductor layer 122. The second passivation layer 74C may conformally cover the top surface and the sidewall of the partition wall PW and the concave/convex surface 122C of the first conductive semiconductor layer 122. Detailed descriptions of the first passivation layer 72C and the second passivation layer 74C may be substantially the same as those of the first passivation layer 72A and the second passivation layer 74A, which are provided with reference to FIG. 9A.

Figure 9D:
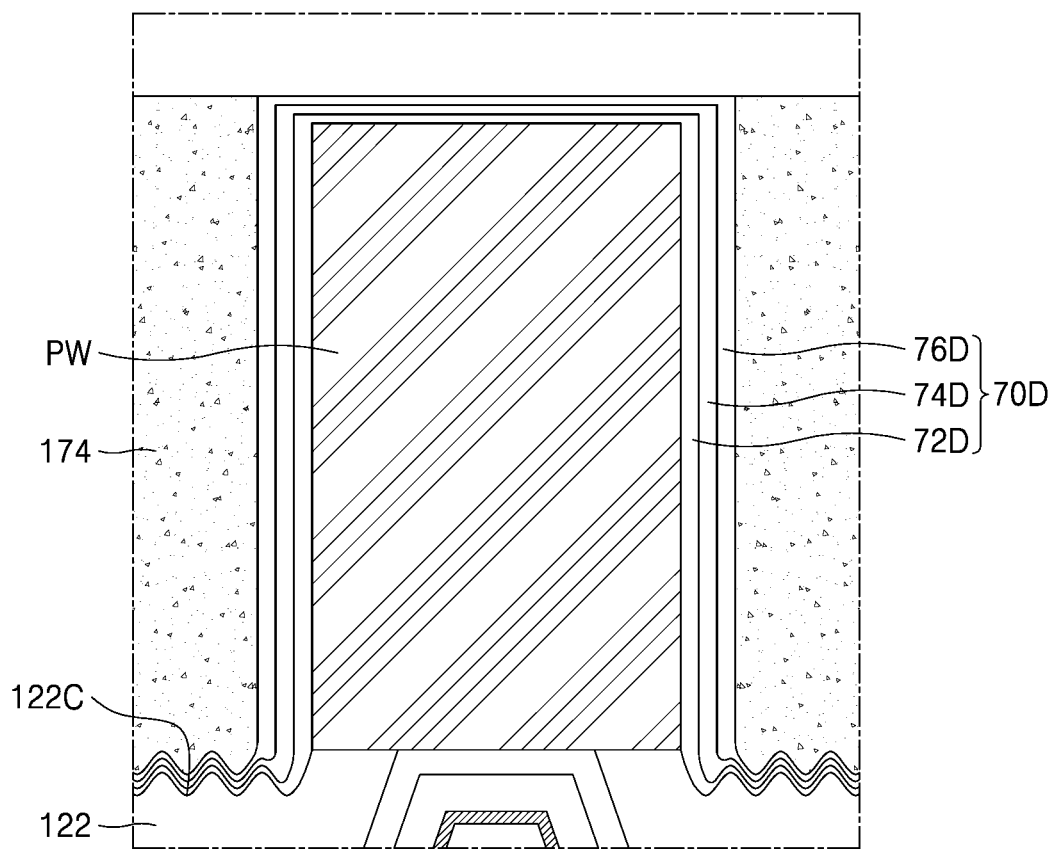

Referring to FIG. 9D, a protective film 70D may be adopted as the protective film 172 shown in FIG. 1C. The protective film 70D may include a first passivation layer 72D, a second passivation layer 74D, and a third passivation layer 76D.

A thickness of a portion of the protective film 70D, which covers the sidewall of the partition wall PW, may be greater than a thickness of a portion of the protective film 70D, which covers the top surface of the partition wall PW, and be greater than a portion of the protective film 70D, which covers the concave/convex surface 122C of the first conductive semiconductor layer 122.

The first passivation layer 72D and the second passivation layer 74D may have substantially the same configurations as the first passivation layer 72A and the second passivation layer 74A described above with reference to FIG. 9A. The third passivation layer 76D may include a third insulating material. The third insulating material may include at least one of silicon oxide, silicon nitride, silicon oxynitride, aluminum oxide, and aluminum nitride. In example embodiments, the third insulating material may include a material, which is the same as the first insulating material included in the first passivation layer 72D and different from the second insulating material included in the second passivation layer 74D.

In example embodiments, the protective film 70D may include a stack structure of $SiO_2/Al_2O_3/SiO_2$, $SiON/Al_2O_3/SiON$, $SiN/Al_2O_3/SiN$, $Al_2O_3/SiO_2/Al_2O_3$, $Al_2O_3/SiON/Al_2O_3$, $Al_2O_3/SiN/Al_2O_3$, $SiO_2/AlN/SiO_2$, $SiON/AlN/SiON$, $SiN/AlN/SiN$, $SiO_2/SiN/SiO_2$, or $Al_2O_3/AlN/Al_2O_3$.

In other example embodiments, the portion of the protective film 70D, which covers the sidewall of the partition wall PW, may include a stack structure in which the first passivation layer 72D and the second passivation layer 74D, which are provided as a pair, are stacked plural times. In this case, the portion of the protective film 70D, which covers the sidewall of the partition wall PW, may include a stack structure of $SiO_2/Al_2O_3/SiO_2/Al_2O_3$, $SiON/Al_2O_3/SiON/Al_2O_3$, $SiN/Al_2O_3/SiN/Al_2O_3$, $Al_2O_3/SiO_2/Al_2O_3/SiO_2$, $Al_2O_3/SiON/Al_2O_3/SiON$, $Al_2O_3/SiN/Al_2O_3/SiN$, $SiO_2/AlN/SiO_2/AlN$, $SiON/AlN/SiON/AlN$, $SiN/AlN/SiN/AlN$, $SiO_2/SiN/SiO_2/SiN$, or $Al_2O_3/AlN/Al_2O_3/AlN$.

Figure 9E:
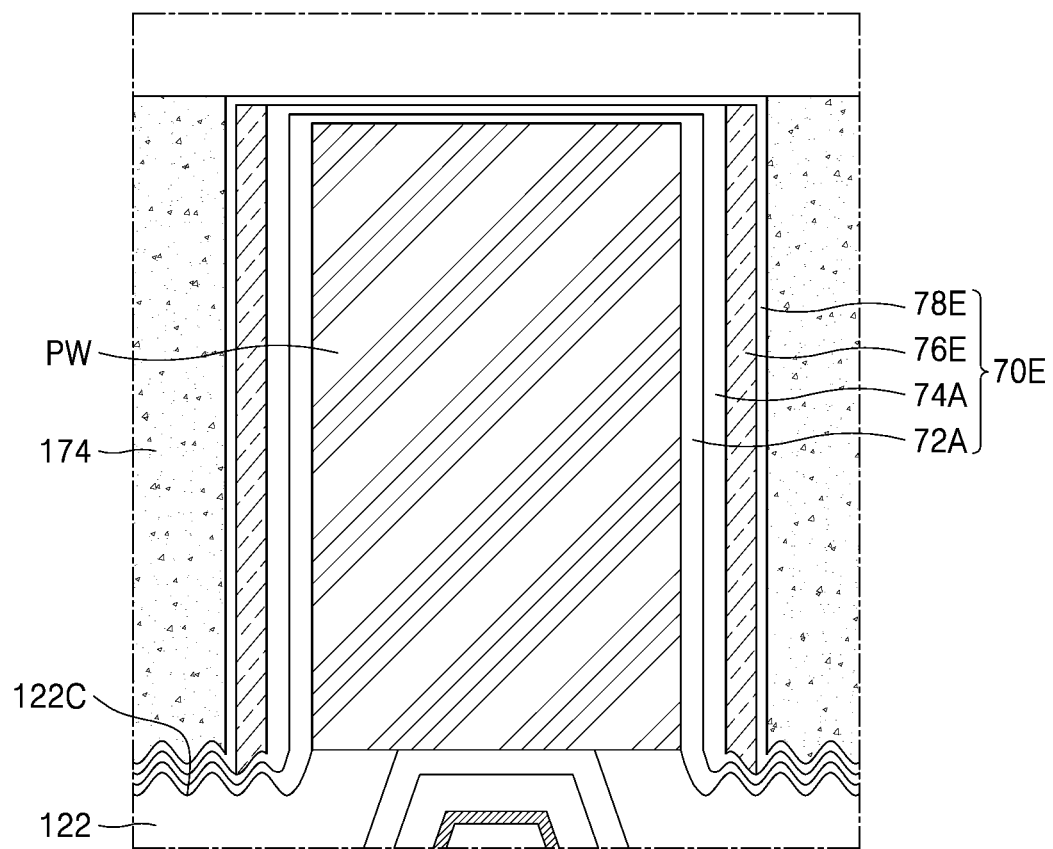

Referring to FIG. 9E, a protective film 70E may be adopted as the protective film 172 shown in FIG. 1C. The protective film 70E may include a first passivation layer 72A, a second passivation layer 74A, a sidewall reflective layer 76E, and an outer passivation layer 78E.

A thickness of a portion of the protective film 70E, which covers a sidewall of a partition wall PW, may be greater than a thickness of a portion of the protective film 70E, which covers a top surface of the partition wall PW, and be greater than a thickness of a portion of the protective film 70E, which covers a concave/convex surface 122C of a first conductive semiconductor layer 122.

Detailed configurations of the first passivation layer 72A and the second passivation layer 74A may be the same as described with reference to FIG. 9A. The sidewall reflective layer 76E may cover the sidewall of the partition wall PW without covering the top surface of the partition wall PW. The sidewall reflective layer 76E may reflect light emitted from a light-emitting stack structure (refer to 120 in FIG. 1C). The sidewall reflective layer 76E may be between the second passivation layer 74A and the outer passivation layer 78E.

In example embodiments, the sidewall reflective layer 76E may include a metal layer including Ag, Al, Ni, Cr, Au, Pt, Pd, Sn, W, Rh, Ir, Ru, Mg, Zn, Ti, Cu, or a combination thereof. In other embodiments, the sidewall reflective layer 76E may include a resin layer (e.g., a polyphthalamide (PPA) layer) containing a metal oxide, such as titanium oxide or aluminum oxide. In other embodiments, the sidewall reflective layer 76E may include a distributed Bragg reflector (DBR) layer. The DBR layer may include a plurality of insulating films, which are selected from $SiO_2$, SiN, $Si_3N_4$, SiON, $TiO_2$, $Al_2O_3$, $ZrO_2$, TiN, AlN, TiAlN, TiSiN, and a combination thereof. The outer passivation layer 78E may include at least one of silicon oxide, silicon nitride, silicon oxynitride, aluminum oxide, and aluminum nitride.

Referring back to FIGS. 1A to 1C, unlike the illustration in FIG. 1C, in the light source module 100, the protective film 172 may not be formed on sidewalls of the partition wall structure PW. In this case, an inner partition wall PW1 and an outer partition wall PW2 may be in direct contact with a fluorescent layer 174 in a plurality of pixel spaces PS.

In example embodiments, a top level of the fluorescent layer 174 may be the same as an uppermost level of the protective film 172 covering the partition wall structure PW. In other example embodiments, a top level of at least a portion of the fluorescent layer 174 may be the same as or lower than a top level of the partition wall structure PW. In an example, a top surface of the fluorescent layer 174 may include a concave surface when viewed from the outside of the light source module 100. In another example, the top surface of the fluorescent layer 174 may have a higher roughness than a planar surface. In yet another example, the fluorescent layer 174 may be formed to cover a top surface of the partition wall structure PW.

The fluorescent layer 174 may include a single type of material capable of converting color of light emitted from a plurality of light-emitting cells CL into a desired color, and the plurality of pixel spaces (refer to PS in FIG. 7J) may be filled with the fluorescent layer 174 associated with the same color. However, embodiments are not limited thereto. For example, color of the fluorescent layer 174 in some of the plurality of pixel spaces PS may be different from color of the fluorescent layer 174 in the remaining pixel spaces PS.

The fluorescent layer 174 may include a resin containing a fluorescent material dispersed therein or a film containing a fluorescent material. For example, the fluorescent layer 174 may include a fluorescent material film in which fluorescent material particles are uniformly dispersed at a certain concentration. The fluorescent material particles may be a wavelength conversion material that changes the wavelength of light emitted from the plurality of unit light-emitting cells CL. To improve the density and color uniformity of the fluorescent material particles, the fluorescent layer 174 may include at least two kinds of fluorescent material particles having different size distributions.

In example embodiments, the fluorescent material included in the fluorescent layer 174 may be selected from an oxide-based composition, a silicate-based composition, a nitride-based composition, and a fluoride-based composition and have various colors and various compositions. For example, $\beta$-SiAlON:$Eu^{2+}$(green), $(Ca,Sr)AlSiN_3$:$Eu^{2+}$(red), $La_3Si_6N_{11}$:$Ce^{3+}$(yellow), $K_2SiF_6$:$Mn_4^+$(red), $SrLiAl_3N_4$:Eu (red), $Ln_{4-x}(Eu_zM_{1-z})_xSi_{12-y}Al_yO_{3+x+y}N_{18-x-y}$ ($0.5 \leq x \leq 3$, $0 < z < 0.3$, $0 < y \leq 4$)(red), $K_2TiF_6$:$Mn_4^+$(red), $NaYF_4$:$Mn_4^+$(red), $NaGdF_4$:$Mn_4^+$(red), and the like may be used as the fluorescent material. However, the kind of the fluorescent material is not limited thereto.

In an embodiment, a wavelength conversion material such as quantum dots may be further over the fluorescent layer 174. The quantum dot may have a core-shell structure including a III-V or II-VI compound semiconductor. For example, the core-shell structure may include a core including a material, such as CdSe and InP, and a shell including a material, such as ZnS and ZnSe. The quantum dot may further include a ligand for stabilizing the core and the shell.

The protective film 172 may not be formed on sidewalls of the outer partition wall PW2, which face a pad region PDR. The sidewalls of the outer partition wall PW2, which face the pad region PDR, and a sidewall of the light-emitting stack structure 120, which is covered by the outer partition wall PW2 and faces the pad region PDR, may be covered by an insulating protective film 180. In example embodiments, the insulating protective film 180 may include a silicon oxide film, without being limited thereto.

A vertical (Z-directional) level of a plurality of conductive pads 148, which are in the pad region PDR at positions apart from the plurality of light-emitting cells CL in a second lateral direction (Y direction) may be different from a vertical (Z-directional) level of the light-emitting stack structures 120 constituting the plurality of light-emitting cells CL in a pixel region PXR. In a vertical direction (Z direction), a level of the plurality of conductive pads 148 may be between a level of the light-emitting stack structure 120 and a level of a support structure 160. In the vertical direction (Z direction), a shortest distance from the support structure 160 to the plurality of conductive pads 148 may be less than a shortest distance from the support structure 160 to the plurality of light-emitting stack structures 120.

A plurality of conductive lines included in a wiring structure 140 may be connected to the plurality of conductive pads 148 at positions apart from the pixel region PXR in a lateral direction, and thus, current may flow through the wiring structure 140 between the plurality of light-emitting cells CL and the support structure 160 in the lateral direction.

The light source module 100 described with reference to FIGS. 1A to 1C may include the support structure 160 configured to reinforce insulation characteristics between the wiring structure 140 and a PCB 190. Accordingly, a partial region of a buried insulating film 154 covering the wiring structure 140 may be physically damaged. Thus, even when a leakage current is likely to occur in the partial region of the buried insulating film 154, insulation characteristics may be reinforced by the support structure 160 between the buried insulating film 154 covering the wiring structure 140 and the PCB 190. As a result, electrical connection from the wiring structure 140 through the buried insulating film 154 and a support substrate 162 to the PCB 190 in the vertical direction may be prevented. Therefore, failures caused by electrical conduction through an undesired vertical path between the plurality of light-emitting cells CL and the PCB 190 may be prevented.

In addition, each of the support substrate 162, an upper insulating film 164, and a lower insulating film 166 included in the support structure 160 may have a thickness within such an appropriate range as to suppress a warpage phenomenon. Thus, the warpage of the light source module 100 due to stress caused by the support structure 160 may be suppressed. Accordingly, during or after the process of manufacturing the light source module 100, the occurrence of cracks in a partial region of the buried insulating film 154 covering the wiring structure 140 due to the warpage of components included in the light source module 100 may be prevented. As a result, the occurrence of a leakage current due to the buried insulating film 154 may be inhibited, and adverse effects on the emission characteristics of the light source module 100 may be prevented.

Figure 2:
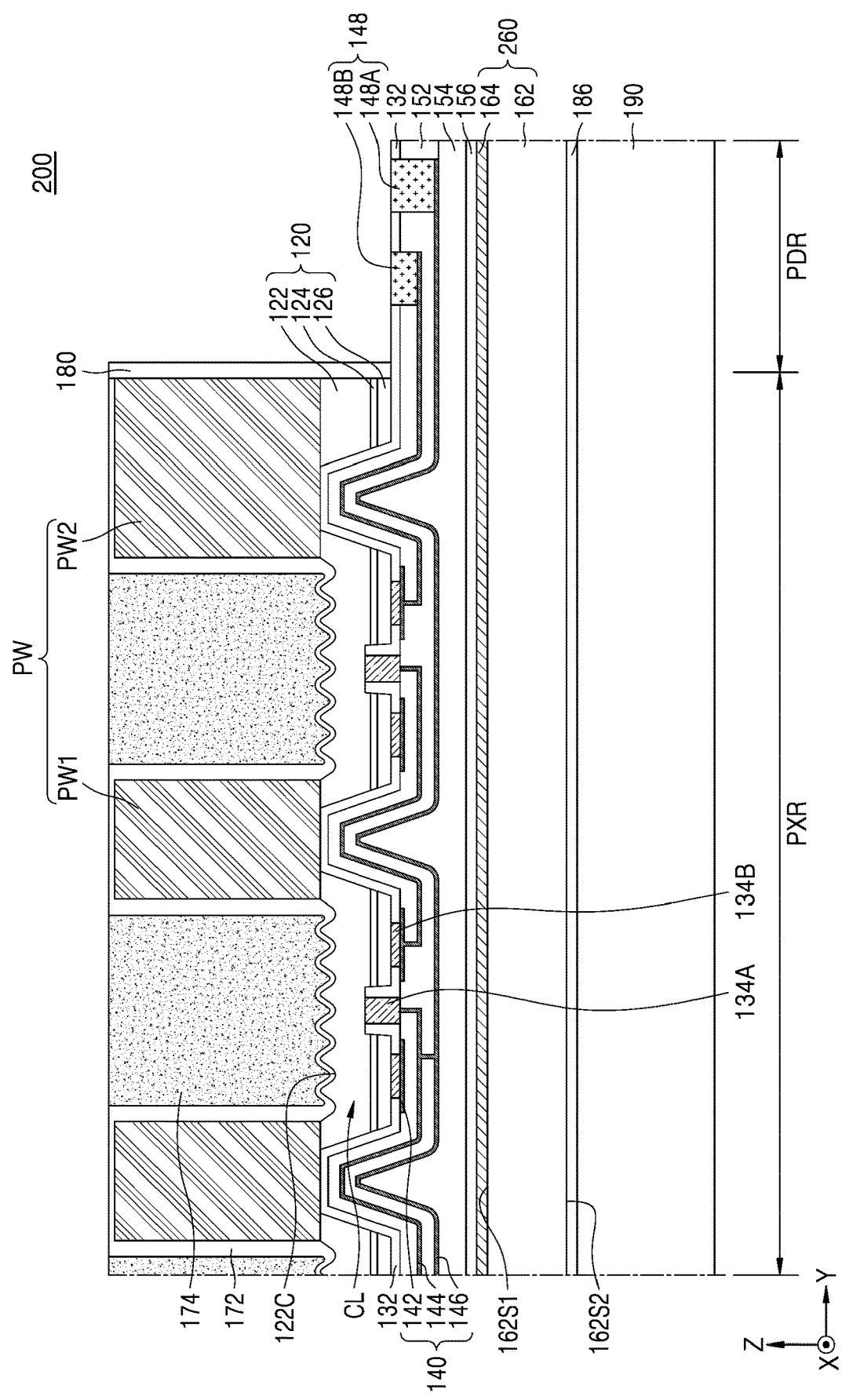
FIG. 2 is a cross-sectional view of a light source module according to an example embodiment.

FIG. 2 is a cross-sectional view of a light source module 200 according to example embodiments. FIG. 2 illustrates some components of a region corresponding to a cross-section taken along line CY-CY' of FIG. 1B. In FIG. 2, the same reference numerals are used to denote the same elements as in FIGS. 1A to 1C, and repeated descriptions thereof will be omitted.

Referring to FIG. 2, the light source module 200 may have substantially the same configuration as the light source module 100 described above with reference to FIGS. 1A to 1C except that the light source module 200 includes a support structure 260 instead of the support structure 160 of the light source module 100.

The support structure 260 may include a support substrate 162 and an upper insulating film 164 covering a first surface 162S1 of the support substrate 162. The upper insulating film 164 may be in contact with the first surface 162S1 of the support substrate 162. Unlike the support structure 160 shown in FIG. 1C, the support structure 260 may not include a lower insulating film 166. Thus, a second surface 162S2 of the support substrate 162 may be in contact with a second adhesive layer 186.

Figure 3:
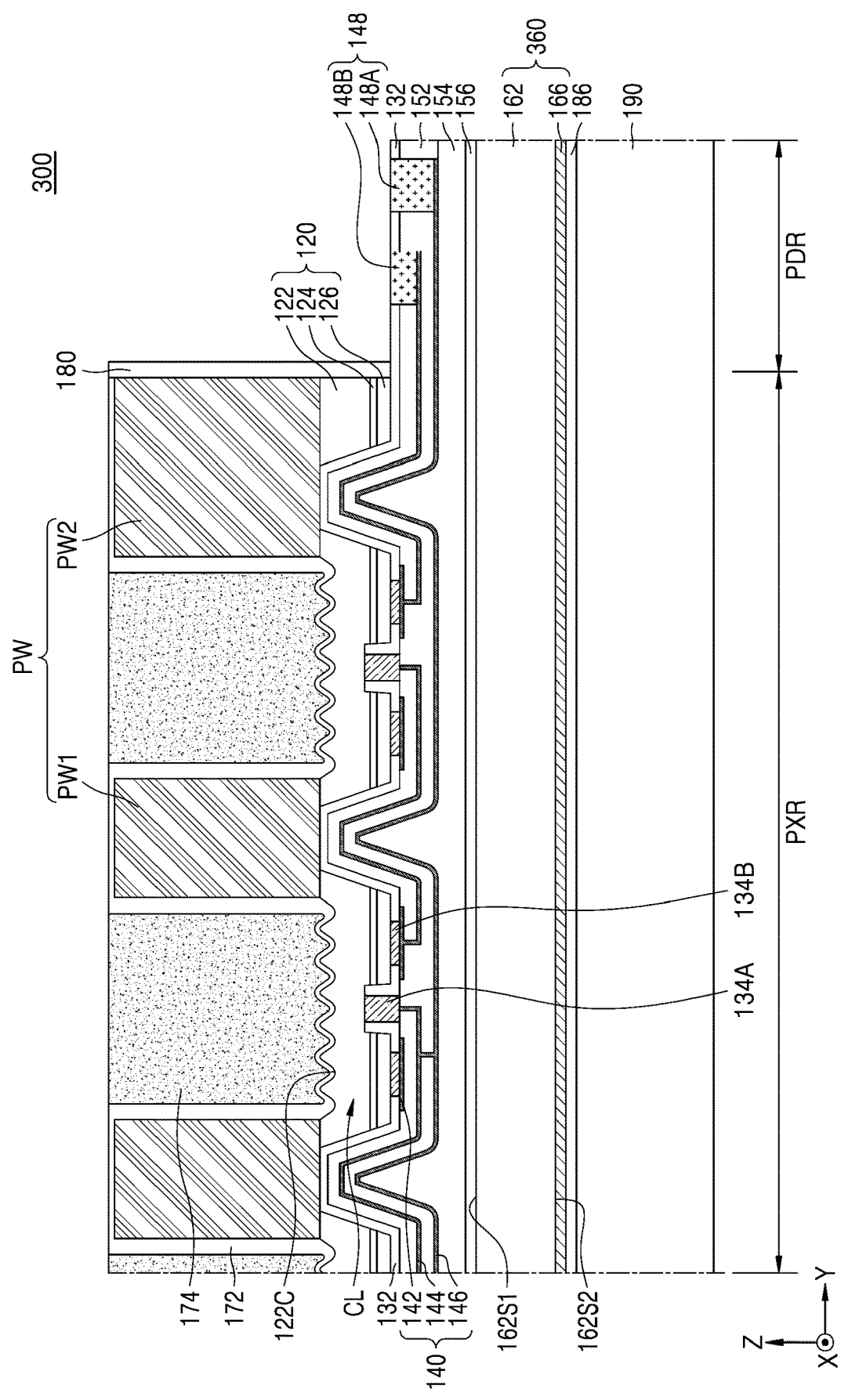
FIG. 3 is a cross-sectional view of a light source module according to an example embodiment.

FIG. 3 is a cross-sectional view of a light source module 300 according to example embodiments. FIG. 3 illustrate some components of a region corresponding to a cross-section taken along line CY-CY' of FIG. 1B. In FIG. 3, the same reference numerals are used to denote the same elements as in FIGS. 1A to 1C, and repeated descriptions thereof will be omitted.

Referring to FIG. 3, the light source module 300 may have substantially the same configuration as the light source module 100 described with reference to FIGS. 1A to 1C except that the light source module 300 includes a support structure 360 instead of the support structure 160 of the light source module 100.

The support structure 360 may include a support substrate 162 and a lower insulating film 166 covering a second surface 162S2 of the support substrate 162. The lower insulating film 166 may be in contact with the second surface 162S2 of the support substrate 162. Unlike the support structure 160 shown in FIG. 1C, the support structure 360 may not include an upper insulating film 164. Thus, a first surface 162S1 of the support substrate 162 may be in contact with a first adhesive layer 156.

Figure 4:
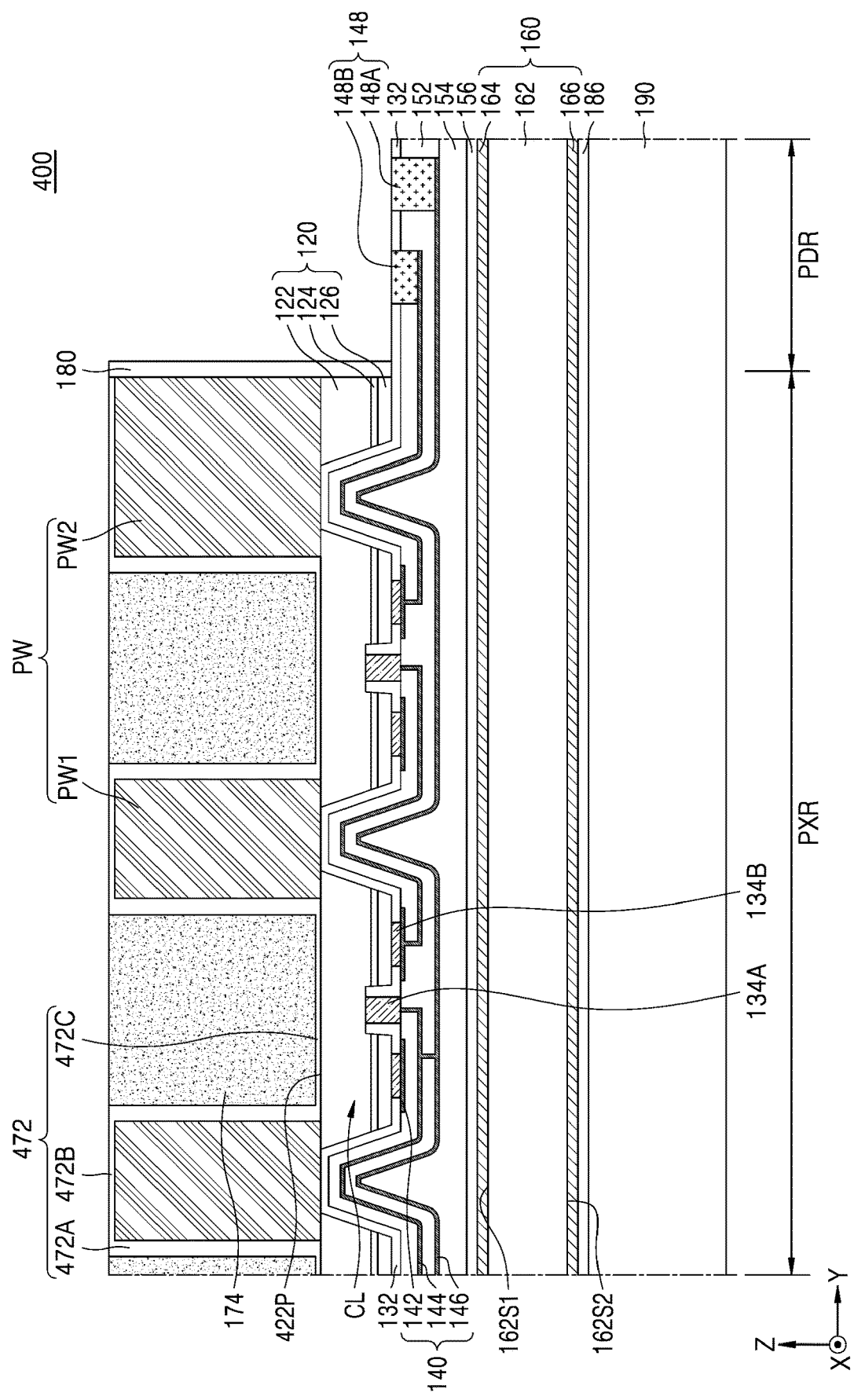
FIG. 4 is a cross-sectional view of a light source module according to an example embodiment.

FIG. 4 is a cross-sectional view of a light source module 400 according to example embodiments. FIG. 4 illustrate some components of a region corresponding to a cross-section taken along line CY-CY' of FIG. 1B. In FIG. 4, the same reference numerals are used to denote the same elements as in FIGS. 1A to 1C, and repeated descriptions thereof will be omitted.

Referring to FIG. 4, the light source module 400 may have substantially the same configuration as the light source module 100 described with reference to FIGS. 1A to 1C. In the light source module 400, each of a plurality of light-emitting stack structures 120 included in a plurality of light-emitting cells CL may include a first conductive semiconductor layer 122, an active layer 124, and a second conductive semiconductor layer 126. However, a surface of the first conductive semiconductor layer 122, which is an opposite side of a surface of the first conductive semiconductor layer 122 in contact with the active layer 124, may include a planar surface 422P.

The planar surface 422P of the first conductive semiconductor layer 122 and sidewalls and a top surface of a partition wall structure PW may be covered by a protective film 472. From among a plurality of pixel spaces (refer to PS in FIG. 7H) defined by the partition wall structure PW on the plurality of light-emitting cells CL, spaces remaining on the protective film 472 may be filled with a fluorescent layer 174.

The protective film 472 may include a first protective film portion 472A, a second protective film portion 472B, and a third protective film portion 472C. The first protective film portion 472A may cover sidewalls facing the pixel space on the light-emitting cell CL from among sidewalls of an inner partition wall PW1 and sidewalls of an outer partition wall PW2. The second protective film portion 472B may cover a top surface of each of the inner partition wall PW1 and the outer partition wall PW2. The third protective film portion 472C may cover the planar surface 422P of the first conductive semiconductor layer 122. A thickness of the first protective film portion 472A may be greater than a thickness of the second protective film portion 472B and be greater than a thickness of the third protective film portion 472C. A detailed description of the protective film 472 may be substantially the same as that of the protective film 172, which is provided with reference to FIG. 1C.

In example embodiments, the light source module 400 shown in FIG. 4 may include the support structure 260 shown in FIG. 2 or the support structure 360 shown in FIG. 3 instead of the support structure 160.

Figure 5:
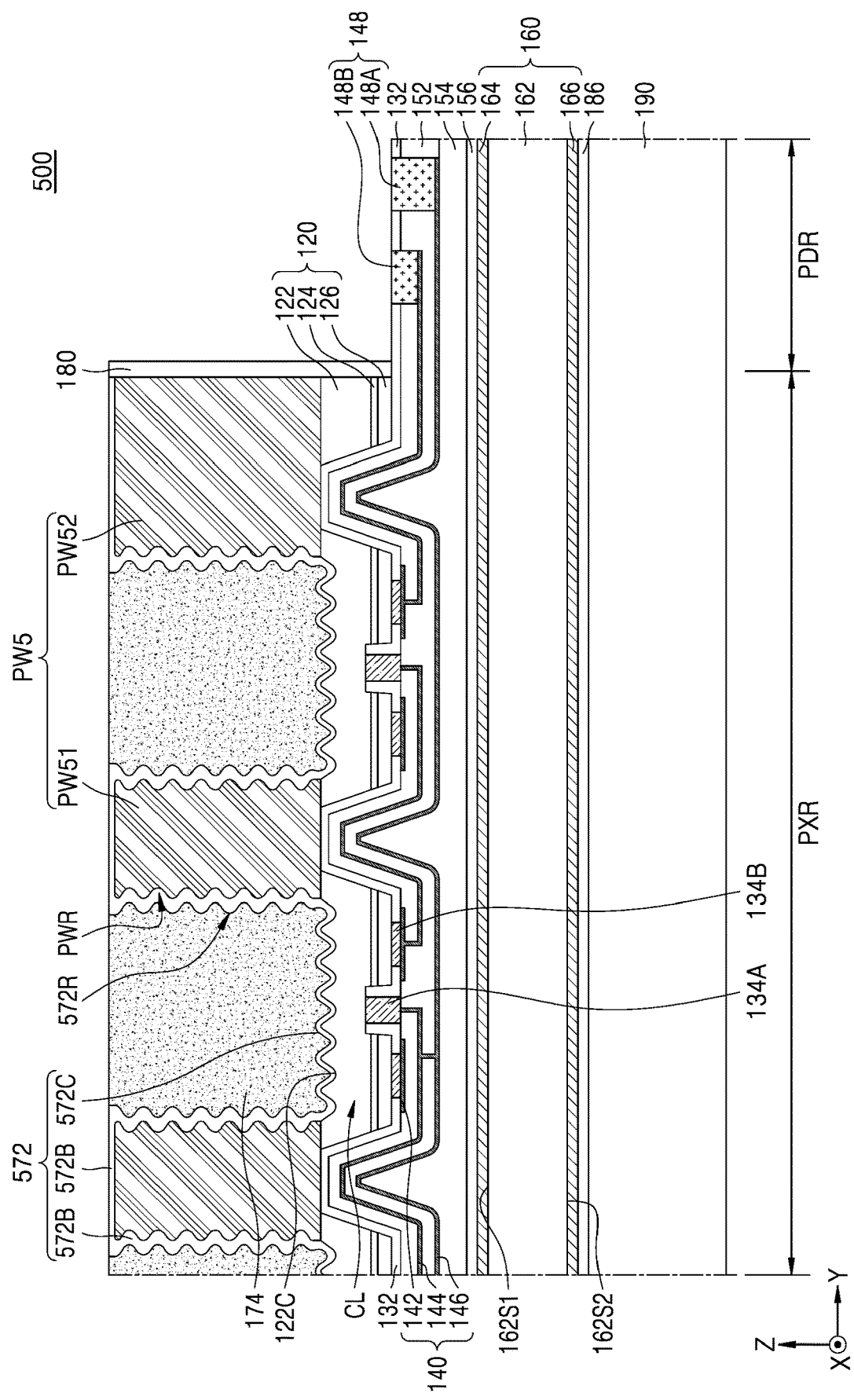
FIG. 5 is a cross-sectional view of a light source module according to an example embodiment.

FIG. 5 is a cross-sectional view of a light source module 500 according to example embodiments. FIG. 5 illustrate some components of a region corresponding to a cross-section taken along line CY-CY' of FIG. 1B. In FIG. 5, the same reference numerals are used to denote the same elements as in FIGS. 1A to 1C, and repeated descriptions thereof will be omitted.

Referring to FIG. 5, the light source module 500 may have substantially the same configuration as the light source module 100 described with reference to FIGS. 1A to 1C. However, the light source module 500 may include a partition wall structure PW5 defining a plurality of pixel spaces on a plurality of light-emitting cells CL and a protective film 572 covering a sidewall of the partition wall structure PW5.

The partition wall structure PW5 may include an inner partition wall PW51 defining a plurality of pixel spaces in a pixel region PXR and an outer partition wall PW52 surrounding the inner partition wall PW51. From among sidewalls of the inner partition wall PW51 and sidewalls of the outer partition wall PW52, sidewalls facing the pixel space on the light-emitting cell CL may include a nonplanar unit PWR, which is not planar in a vertical direction (Z direction) but extends in a convex/concave shape. The nonplanar unit PWR may be formed over a region corresponding to at least part of the total height of the partition wall structure PW5 in the vertical direction (Z direction). The nonplanar unit PWR of the partition wall structure PW5 may face a fluorescent layer 174.

The protective film 572 may include a first protective film portion 572A, a second protective film portion 572B, and a third protective film portion 572C. The first protective film portion 572A may cover the sidewalls facing the pixel space on the light-emitting cell CL, from among the sidewalls of the inner partition wall PW51 and the sidewalls of the outer partition wall PW52. The second protective film portion 572B may cover a top surface of each of the inner partition wall PW51 and the outer partition wall PW52. The third protective film portion 572C may cover the concave/convex surface 122C of the first conductive semiconductor layer 122. A thickness of the first protective film portion 572A may be greater than a thickness of the second protective film portion 572B and be greater than a thickness of the third protective film portion 572C.

The first protective film portion 572A of the protective film 572 may be formed to conformally cover the nonplanar unit PWR of the sidewall of each of the inner partition wall PW51 and the outer partition wall PW52, while the third protective film portion 572C of the protective film 572 may be formed to conformally cover the concave/convex surface 122C of the first conductive semiconductor layer 122.

In the light source module 500, the sidewall of the partition wall structure PW5, which faces the fluorescent layer 174, may include the nonplanar unit PWR, and the first protective film portion 572A of the protective film 572 may also have a nonplanar unit 572R corresponding to the nonplanar unit PWR. Accordingly, a contact area between the protective film 572 and the fluorescent layer 174 may be further increased, and an area of the protective film 572, which faces the partition wall structure PW5, may be increased. Thus, the fluorescent layer 174 may be firmly fixed inside the pixel spaces defined by the partition wall structure PW5. Accordingly, the structural stability of the light source module 500 may be improved. Detailed descriptions of the partition wall structure PW5 and the protective film 572 may be substantially the same as those of the partition wall structure PW and the protective film 172, which are provided with reference to FIG. 1C.

In example embodiments, the light source module 500 shown in FIG. 5 may include the support structure 260 shown in FIG. 2 or the support structure 360 shown in FIG. 3 instead of the support structure 160.

Figure 6:
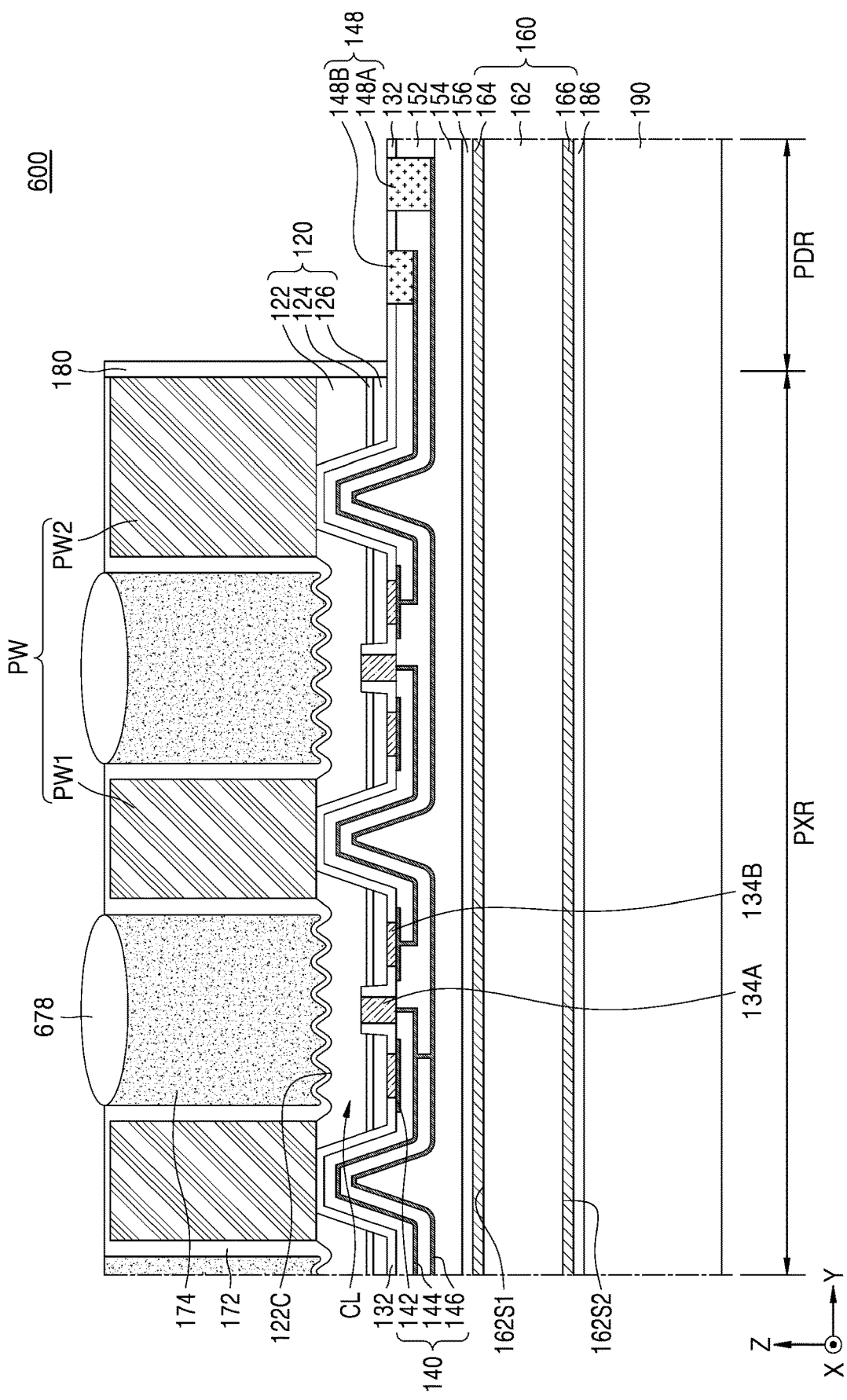
FIG. 6 is a cross-sectional view of a light source module according to an example embodiment.

FIG. 6 is a cross-sectional view of a light source module 600 according to example embodiments. FIG. 6 illustrate some components of a region corresponding to a cross-section taken along line CY-CY' of FIG. 1B. In FIG. 6, the same reference numerals are used to denote the same elements as in FIGS. 1A to 1C, and repeated descriptions thereof will be omitted.

Referring to FIG. 6, the light source module 600 may have substantially the same configuration as the light source module 100 described with reference to FIGS. 1A to 1C except that the light source module 600 includes a plurality of lenses 678, which are apart from a plurality of light-emitting cells CL with a fluorescent layer 174 therebetween.

The plurality of lenses 678 may be fixed by a partition wall structure PW and a protective film 172. An edge unit of each of the plurality of lenses 678 may be in contact with the protective film 172. Each of the plurality of lenses 678 may have a convex top surface and a convex bottom surface in an outward direction thereof. Accordingly, the fluorescent layer 174 facing each of the plurality of lenses 678 may have a concave top surface corresponding to the convex top surface of the lens 678.

In example embodiments, the light source module 600 shown in FIG. 6 may include the support structure 260 shown in FIG. 2 or the support structure 360 shown in FIG. 3 instead of the support structure 160.

Because the light source module 600 includes the plurality of lenses 178, an additional optical system (e.g., an additional lens), which is typically provided outside the light source module 600, may be simplified, and thus, the light source module 600 may have a compact size.

FIGS. 7A to 7H are cross-sectional views of a process sequence of a method of manufacturing a light source module 100, according to example embodiments. FIGS. 7A to 7N illustrate some components of a region corresponding to a cross-section taken along line CY-CY' of FIG. 1B.

Referring to FIG. 7A, a light-emitting stack film 120P may be formed on a substrate 110.

In example embodiments, the substrate 110 may include a silicon (Si) substrate, a silicon carbide (SiC) substrate, a sapphire substrate, and/or a gallium nitride (GaN) substrate. The substrate 110 may include a pixel region PXR and a pad region PDR.

The light-emitting stack film 120P may include a first conductive semiconductor layer 122, an active layer 124, and a second conductive semiconductor layer 126, which are sequentially stacked on a main surface 110S of the substrate 110.

The light-emitting stack film 120P may be formed using a metal-organic chemical vapor deposition (MOCVD) process, a molecular beam epitaxy (MBE) process, or a hydride vapor phase epitaxy (HVPE) process, without being limited thereto.

In example embodiments, the light-emitting stack film 120P may further include a buffer structure between the substrate 110 and the first conductive semiconductor layer 122.

Figure 8A:
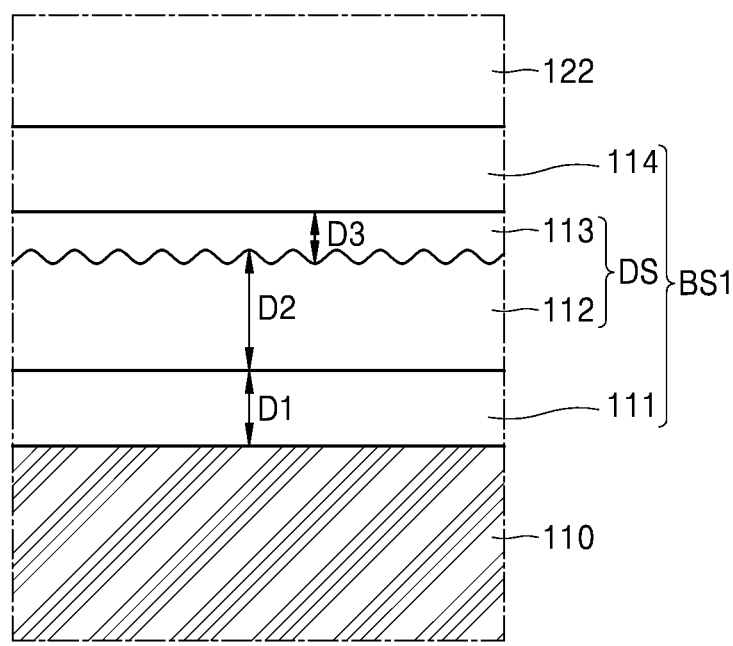
FIGS. 8A and 8B are cross-sectional views for explaining examples of a buffer structure that may be between a substrate and a first conductive semiconductor layer in a light source module according to example embodiments.
Figure 8B:
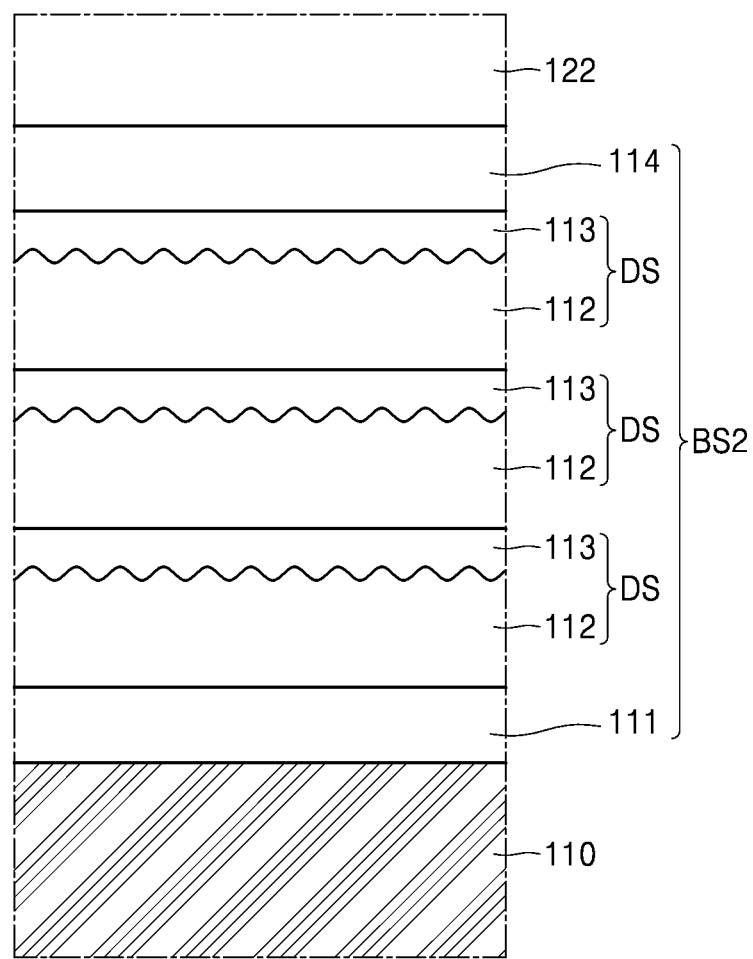

FIGS. 8A and 8B are cross-sectional views of some components of a light-emitting stack film 120P, for explaining buffer structures BS1 and BS2, which are examples of the buffer structure that may be between the substrate 110 and the first conductive semiconductor layer 122.

Referring to FIG. 8A, the light-emitting stack film 120P may further include the buffer structure BS1, which is between the substrate 110 and the first conductive semiconductor layer 122.

The buffer structure BS1 may include a nucleation layer 111, a dislocation-removing structure DS, and a buffer layer 114, which are sequentially formed on the substrate 110.

The nucleation layer 111 may be a layer for forming nuclei for crystal growth. The nucleation layer 111 may prevent the occurrence of a melt-back phenomenon where gallium (Ga) included in another layer (e.g., a first material layer 112 and/or the buffer layer 114) of the buffer structure BS1 contacts and reacts with silicon (Si) included in the substrate 110. Also, the nucleation layer 111 may improve the wetting characteristics of the dislocation-removing structure DS. In example embodiments, the nucleation layer 111 may include aluminum nitride (AlN).

The dislocation-removing structure DS may include the first material layer 112 and a second material layer 113, which are sequentially formed on the nucleation layer 111. The first material layer 112 may include $B_xAl_yIn_zGa_{1-x-y-z}N$ (where $0 \le x<1$, $0<y<1$, $0 \le z<1$, and $0 \le x+y+z<1$). In example embodiments, a composition ratio of the first material layer 112 may be substantially constant over the total thickness thereof. For example, an aluminum (Al) content of the first material layer 112 may be about 20 atomic percent (at %) to about 75 at %.

The second material layer 113 may have a different lattice constant from the first material layer 112. In example embodiments, the second material layer 113 may include the same material as the nucleation layer 111. For example, the second material layer 113 may include aluminum nitride (AlN). Also, a roughness of a top surface of the first material layer 112 may be higher than a roughness of a top surface of the nucleation layer 111 and a roughness of a top surface of the second material layer 113. The top surface of the first material layer 112 may have a roughness of about 5 nm to about 500 nm. The top surface of the nucleation layer 111 and the top surface of the second material layer 113 may have a roughness of about 0 nm to about 10 nm. Each of the top surface of the nucleation layer 111 and the top surface of the second material layer 113 may be substantially planar. A relatively high roughness of the top surface of the first material layer 112 at an interface between the first material layer 112 and the second material layer 113 may bend a dislocation and reduce a dislocation density.

In example embodiments, the lattice constant of the second material layer 113 may be lower than the lattice constant of the first material layer 112. Accordingly, tensile stress may be caused in the second material layer 113 and result in cracks. In this case, the second material layer 113 may be formed to a thickness D3 less than a thickness D1 of the nucleation layer 111, and thus, tensile stress may be reduced to prevent the occurrence of cracks. The thickness D3 of the second material layer 113 may be about 10% to about 50% of the thickness D2 of the first material layer 112. As used herein, a thickness of a layer may be defined as a maximum thickness of the layer. To control the warpage of the substrate 110 and improve the crystallinity of the first conductive semiconductor layer 122, the thickness D1 of the nucleation layer 111, the thickness D2 of the first material layer 112, and the thickness D3 of the second material layer 113 may be appropriately selected.

The buffer layer 114 may reduce differences in lattice constant and coefficient of thermal expansion (CTE) between a structure (e.g., the first conductive semiconductor layer 122) formed on the buffer structure BS1 and the second material layer 113. For example, a lattice constant of the buffer layer 114 may be between a lattice constant of the first conductive semiconductor layer 122 and a lattice constant of the second material layer 113. In addition, a CTE of the buffer layer 114 may be between a CTE of the first conductive semiconductor layer 122 and a CTE of the second material layer 113. The buffer layer 114 may include the same material as the first material layer 112. In example embodiments, the buffer layer 114 may include $B_xAl_yIn_zGa_{1-x-y-z}N$ (where $0 \le x<1$, $0<y<1$, $0 \le z<1$, and $0 \le x+y+z<1$).

In example embodiments, the light-emitting stack film 120P may further include an undoped semiconductor layer (not shown), which is between the buffer layer 114 and the first conductive semiconductor layer 122. The undoped semiconductor layer may further improve the crystallinity of the first conductive semiconductor layer 122. The undoped semiconductor layer may include a nitride-based semiconductor, for example, $Al_xIn_yGa_{1-x-y}N$ (where $0 \le x \le 1$, $0 \le y \le 1$, and $0 \le x+y \le 1$).

In example embodiments, at least one of the nucleation layer 111, the first material layer 112, the second material layer 113, and the buffer layer 114 may be doped with silicon (Si). In this case, a Si doping concentration of the at least one of the nucleation layer 111, the first material layer 112, the second material layer 113, and the buffer layer 114 may be in a range of about 0 $cm^{-3}$ to about $10^{19}$ $cm^{-3}$. By doping the at least one of the nucleation layer 111, the first material layer 112, the second material layer 113, and the buffer layer 114 with silicon (Si), tensile stress may be reduced or compressive stress may be caused to prevent the occurrence of cracks.

In example embodiments, the first material layer 112 may be formed at a temperature of about 1100° C. or lower such that the first material layer 112 is formed to have a rough top surface. In other example embodiments, the first material layer 112 may be formed to have a planar top surface, and the planar top surface of the first material layer 112 may be surface-treated or etched, and thus, the first material layer 112 may have the rough top surface. The second material layer 113 may be formed to have a planar top surface. To this end, the second material layer 113 may be formed at a temperature of about 1000° C. or higher.

After the buffer layer 114 is formed, to prevent the crystallinity of the first conductive semiconductor layer 122 from being degraded due to a roughness of a top surface of the buffer layer 114, the first conductive semiconductor layer 122 may be initially formed at a relatively low temperature of about 900° C. to about 1100° C. and then formed at a relatively high temperature of about 1050° C. or higher.

Referring to FIG. 8B, the light-emitting stack film 120P may further include the buffer structure BS2 interposed between the substrate 110 and the first conductive semiconductor layer 122.

The buffer structure BS2 may have substantially the same configuration as the buffer structure BS1 described with reference to FIG. 8A. However, the buffer structure BS2 may include a plurality of dislocation-removing structures DS between the nucleation layer 111 and the buffer layer 114 Although FIG. 8B illustrates an example in which the two dislocation-removing structures DS are between the nucleation layer 111 and the buffer layer 114, embodiments are not limited thereto. The number of dislocation-removing structures DS interposed between the nucleation layer 111 and the buffer layer 114 may be greater or less than 3. The plurality of dislocation-removing structures DS may improve the capability of the buffer structure BS2 to reduce a dislocation density.

In the plurality of dislocation-removing structures DS, the roughness of the top surface of the second material layer 113 may decrease in a direction away from the substrate 110, that is, in a direction toward the first conductive semiconductor layer 122. Due to the above-described configuration, the crystallinity of each of the first conductive semiconductor layer 122, the active layer 124, and the second conductive semiconductor layer 126 shown in FIG. 7A may be prevented from being degraded.

Referring to FIG. 7B, a mask pattern (not shown) may be formed on the light-emitting stack film 120P, and a portion of the light-emitting stack film 120P may be etched using the mask pattern as an etch mask in a pixel region PXR, thereby forming a trench T1 defining a plurality of mesa structures MS. The first conductive semiconductor layer 122 may be exposed at a bottom surface of the trench T1. The trench T1 may not be formed in a pad region PDR of the substrate 110.

Referring to FIG. 7C, a portion of the light-emitting stack film (refer to 120P in FIG. 7B) including the plurality of mesa structures MS may be etched in the pixel region PXR, and thus, an isolation region S1 may be formed to expose the substrate 110 in the pixel region PXR. As a result, the light-emitting stack film 120P may be separated into a plurality of light-emitting stack structures 120. The light-emitting stack structure 120 may constitute a plurality of light-emitting cells CL in the pixel region PXR.

In example embodiments, after the isolation region S1 is formed, a sidewall 120S of each of the plurality of light-emitting stack structures 120 defining the isolation region Si may be inclined at an inclination angle of about 60° to about 90° with respect to a horizontal plane, which is parallel to a main surface 110S of the substrate 110. In a lateral direction (X direction or Y direction), a bottom unit of the isolation region S1 at which the substrate 110 is exposed may be formed to a width less than or equal to a width of an inner partition wall (refer to PW1 in FIGS. 1B and 1C), which is obtained from the substrate 110 during a subsequent process, without being limited thereto.

Referring to FIG. 7D, an insulating liner 132, a first electrode 134A, and a second electrode 134B may be formed. The insulating liner 132 may cover the plurality of light-emitting cells CL. The first electrode 134A may pass through the insulating liner 132 and be connected to the first conductive semiconductor layer 122. The second electrode 134B may pass through the insulating liner 132 and be connected to the second conductive semiconductor layer 126.

The first electrode 134A and the second electrode 134B may be sequentially formed. For example, forming the second electrode 134B may be followed by forming the first electrode 134A, embodiments are not limited thereto.

Referring to FIG. 7E, a wiring structure 140 having a multilayered structure, an inter-wiring insulating film 152, and a buried insulating film 154 may be formed on the resultant structure of FIG. 7D. The wiring structure 140 may include a plurality of conductive lines, which are connected to the first electrode 134A and the second electrode 134B. The inter-wiring insulating film 152 may fill respective spaces between the plurality of conductive lines. The buried insulating film 154 may cover the wiring structure 140.

The wiring structure 140 may include a plurality of first conductive lines 142, a plurality of second conductive lines 144, and a plurality of third conductive lines 146, which are sequentially formed on the plurality of light-emitting stack structures 120. In example embodiments, the wiring structure 140 may be formed using a plating process, without being limited thereto.

Referring to FIG. 7F, a support structure 160 may be adhered onto the buried insulating film 154 by using a first adhesive layer 156. The support structure 160 may include a support substrate 162, an upper insulating film 164 covering a first surface 162S1 of the support substrate 162 and a lower insulating film 166 covering a second surface 162S2 of the support substrate 162.

Referring to FIG. 7G, the resultant structure of FIG. 7F may be reversed and the substrate 110 may be positioned to face upward in a vertical direction (Z direction). Afterwards, a grinding process may be performed on a surface of the substrate 110, which is an opposite side of the main surface 110S of the substrate 110, thereby reducing a thickness of the substrate 110. As a result, a rear surface 110B of the substrate 110 of which the thickness is reduced may be exposed.

Referring to FIG. 7H, a mask pattern (not shown) may be formed on the rear surface 110B of the substrate 110 in the resultant structure of FIG. 7G. The substrate 110 may be etched using the mask pattern as an etch mask, and thus, the inner partition wall PW1 may be obtained from a portion of the substrate 110, which is in the pixel region PXR. A plurality of pixel spaces PS may be defined by the inner partition wall PW1 in the pixel region PXR. A portion of the substrate 110 may remain on an edge unit of the pixel region PXR and the pad region PDR.

The inner partition wall PW1 may overlap the isolation region (refer to S1 in FIG. 7C) between the respective light-emitting stack structures 120 in the vertical direction (Z direction). The first conductive semiconductor layer 122 of each of the plurality of light-emitting stack structures 120 may be exposed by the plurality of pixel spaces PS.

Referring to FIG. 7I, an etching process may be performed on a surface of the first conductive semiconductor layer 122, which is exposed by the plurality of pixel spaces PS, thereby forming a concave/convex surface 122C.

Referring to FIG. 7J, a protective film 172 may be formed to cover the concave/convex surface 122C of the first conductive semiconductor layer 122, the exposed surface of the inner partition wall PW1, and the exposed surface of the substrate 110 remaining in the edge unit of the pixel region PXR and the pad region PDR.

The protective film 172 may include a first protective film portion 172A, a second protective film portion 172B, and a third protective film portion 172C. The first protective film portion 172A may cover sidewalls of the inner partition wall PW1 exposed in the pixel region PXR and sidewalls of the substrate 110 remaining in the edge unit of the pixel region PXR and the pad region PDR. The second protective film portion 172B may cover top surfaces of the inner partition wall PW1 and the remaining substrate 110. The third protective film portion 172C may cover the concave/convex surface 122C of the first conductive semiconductor layer 122. A detailed description of the protective film 172 may be inferred from the description provided with reference to FIG. 1C.

In example embodiments, the formation of the protective film 172 may include performing a plurality of deposition processes for forming a silicon oxide film and an aluminum oxide film and performing an anisotropic etching process for reducing a thickness of the protective film 172 covering the concave/convex surface 122C of the first conductive semiconductor layer 122 and the top surface of the inner partition wall PW1 by partially removing portions of the deposited silicon oxide films and/or aluminum oxide films, which cover the concave/convex surface 122C of the first conductive semiconductor layer 122 and the top surface of the inner partition wall PW1. The anisotropic etching process may be optionally performed between the respective deposition processes or after the plurality of deposition processes. As a result, a metal oxide film (e.g., an aluminum oxide film), which may serve as a reflective layer, may be left in the first protective film portion 172A covering an inner sidewall of the pixel space PS, from among the protective film 172, to a greater thickness than in the second protective film portion 172B and the third protective film portion 172C of the protective film 172. Accordingly, the first protective film portion 172A of the protective film 172 may function as a reflective layer.

In other example embodiments, any one of the protective films 70A, 70B, 70C, 70D, and 70E shown in FIGS. 9A to 9E may be formed as the protective film 172.

Figure 7K:
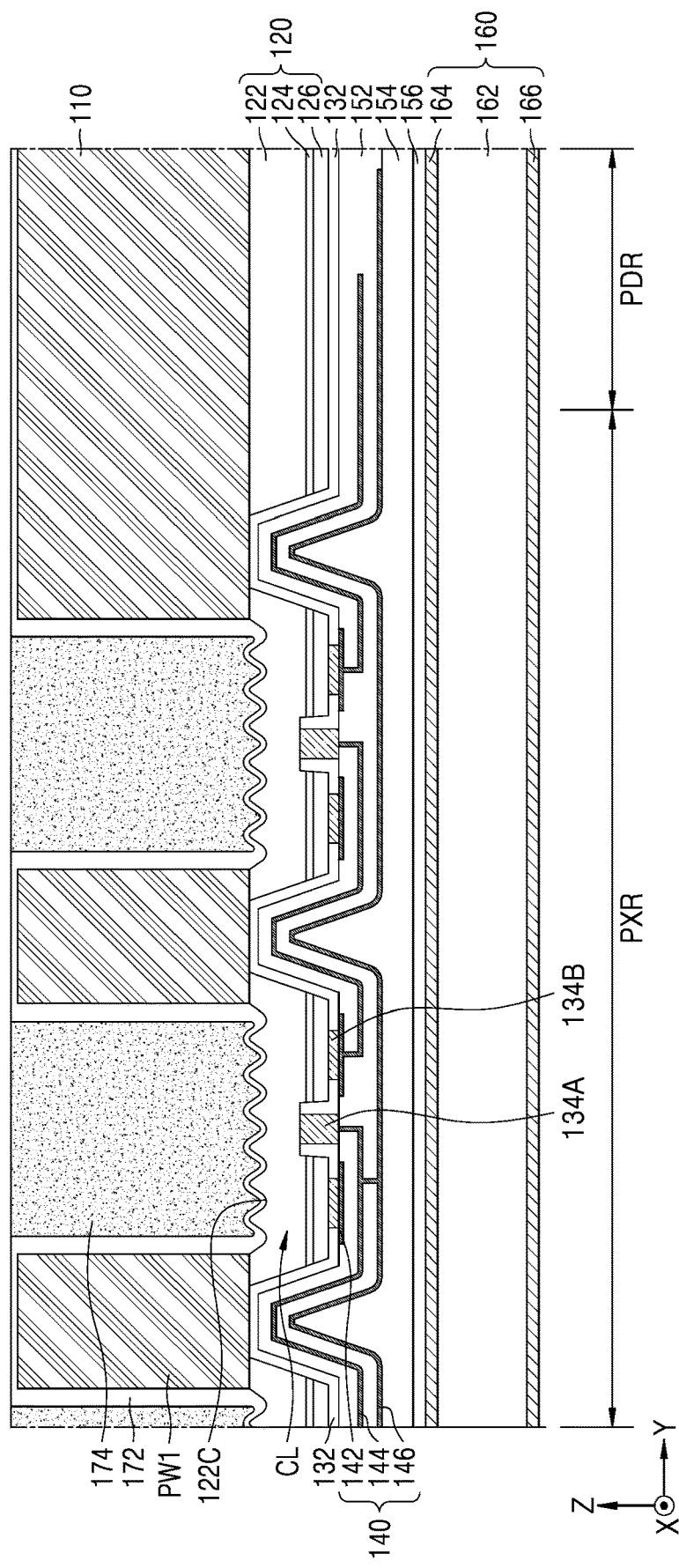

Referring to FIG. 7K, a fluorescent layer 174 may be formed to fill the plurality of pixel spaces PS, which remain on the protective film 172 in the resultant structure of FIG. 7J.

In example embodiments, the fluorescent layer 174 may be formed by applying or dispensing a resin containing fluorescent material particles dispersed therein into each of the plurality of pixel spaces (refer to PS in FIG. 7J). The fluorescent layer 174 may include at least two kinds of fluorescent material particles having different size distributions so that the fluorescent material particles may be uniformly dispersed in each of the plurality of pixel spaces PS.

Figure 7L:
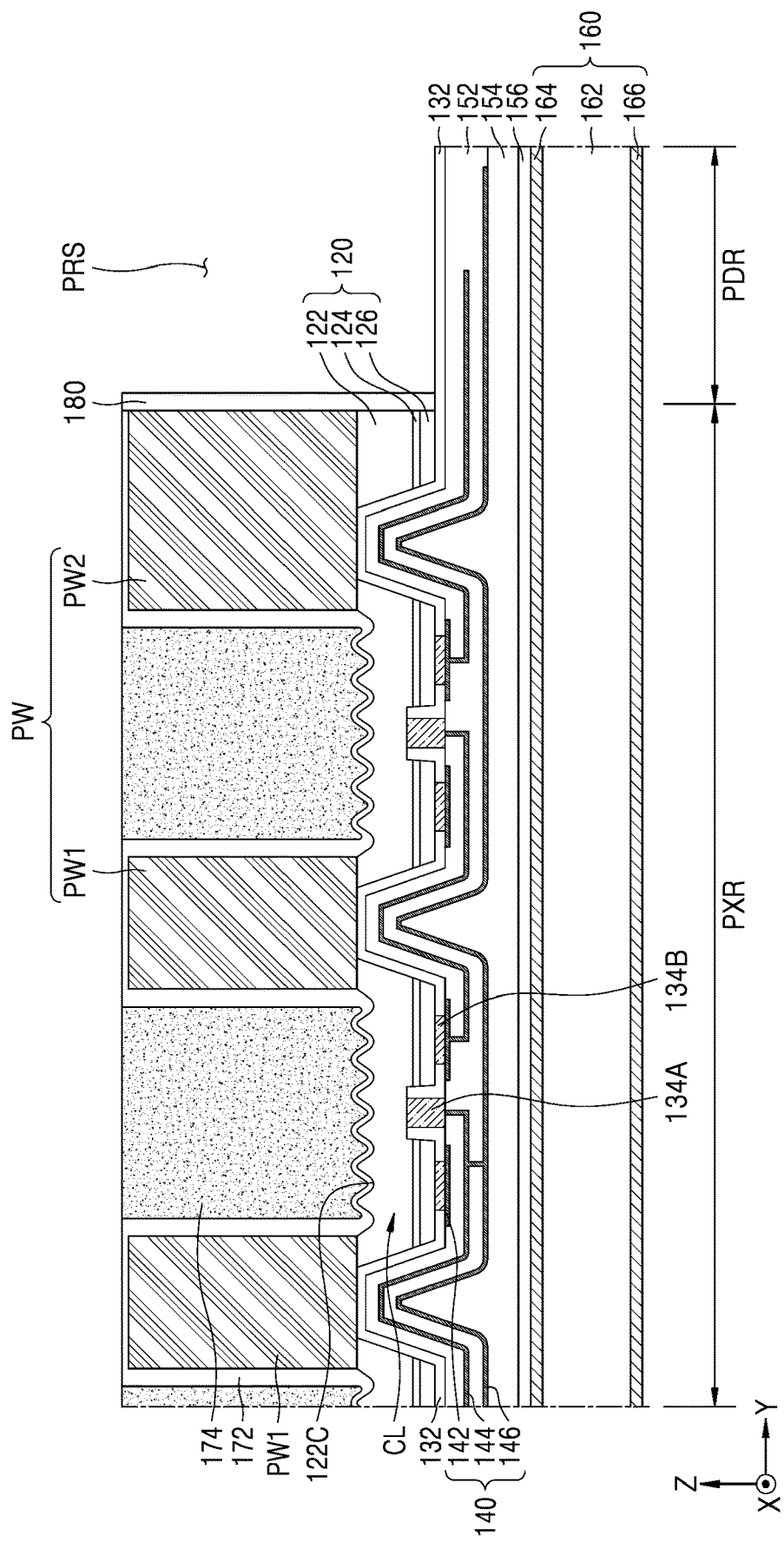

Referring to FIG. 7L, a mask pattern (not shown) may be formed in the pixel region PXR to cover the fluorescent layer 174, the inner partition wall PW1, and a portion of the remaining substrate 110, and the protective film 172 and the substrate 110 remaining in the pad region PDR may be etched using the mask pattern as an etch mask. As a result, an outer partition wall PW2, which includes a portion of the substrate 110 that is left after the etching process, may be formed. After the outer partition wall PW2 is formed, the insulating liner 132 may be exposed in the pad region PDR by removing a portion of the exposed light-emitting stack structure 120.

Thereafter, an insulating protective film 180 may be formed to cover a sidewall of the outer partition wall PW2 and an outermost sidewall of the light-emitting stack structure 120, which are exposed in the pad region PDR. In example embodiments, the insulating protective film 180 may include a silicon oxide film, without being limited thereto.

The outer partition wall PW2 may be between the plurality of light-emitting cells CL and the pad region PDR. The outer partition wall PW2 may surround at least portions of the plurality of light-emitting cells CL, which are divided from each other by the inner partition wall PW1. A pixel-surrounding space PRS, which is defined by the outer partition wall PW2 and the insulating protective film 180, may remain in the pad region PDR.

Figure 7M:
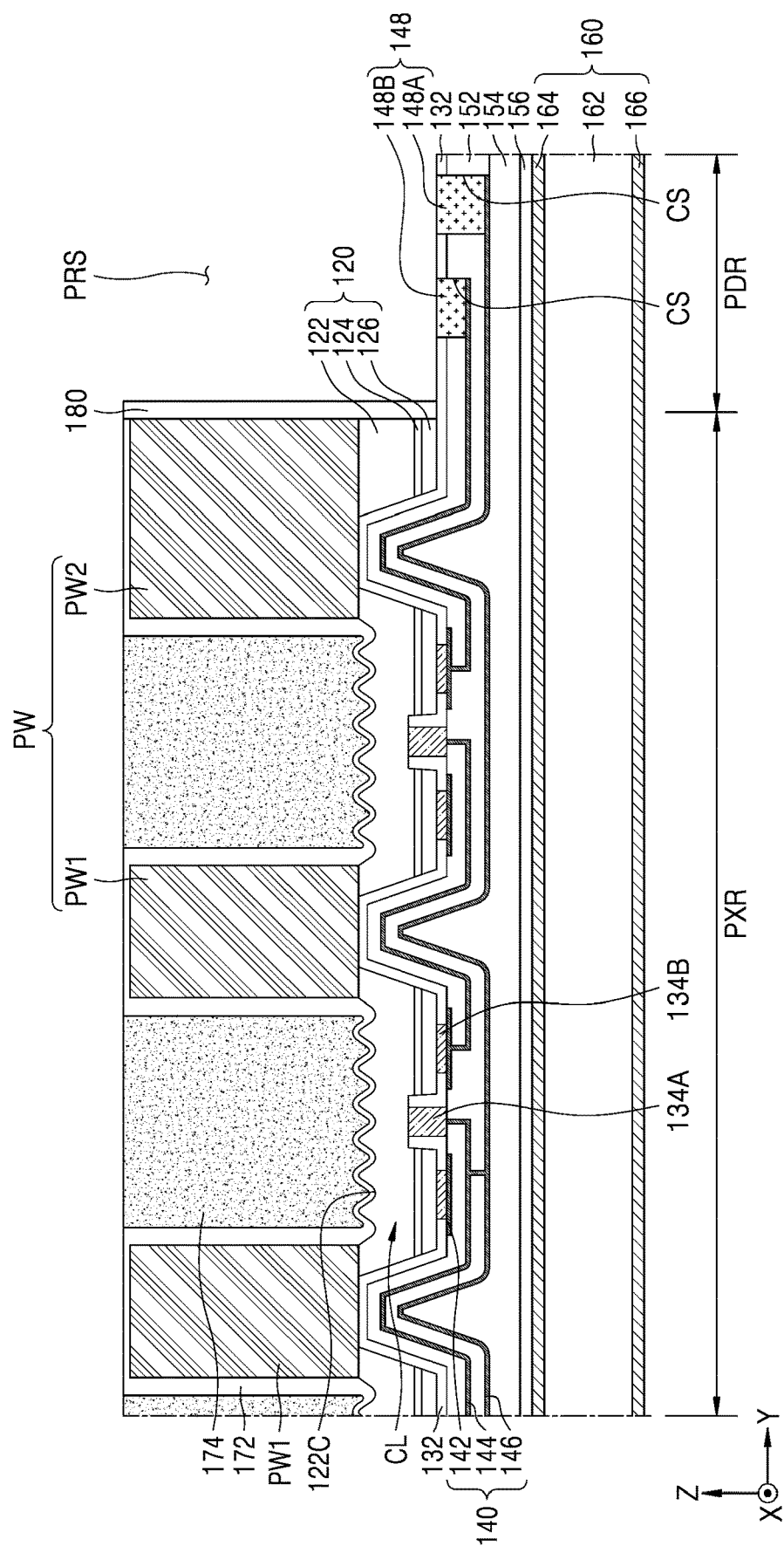
Figure 7N:
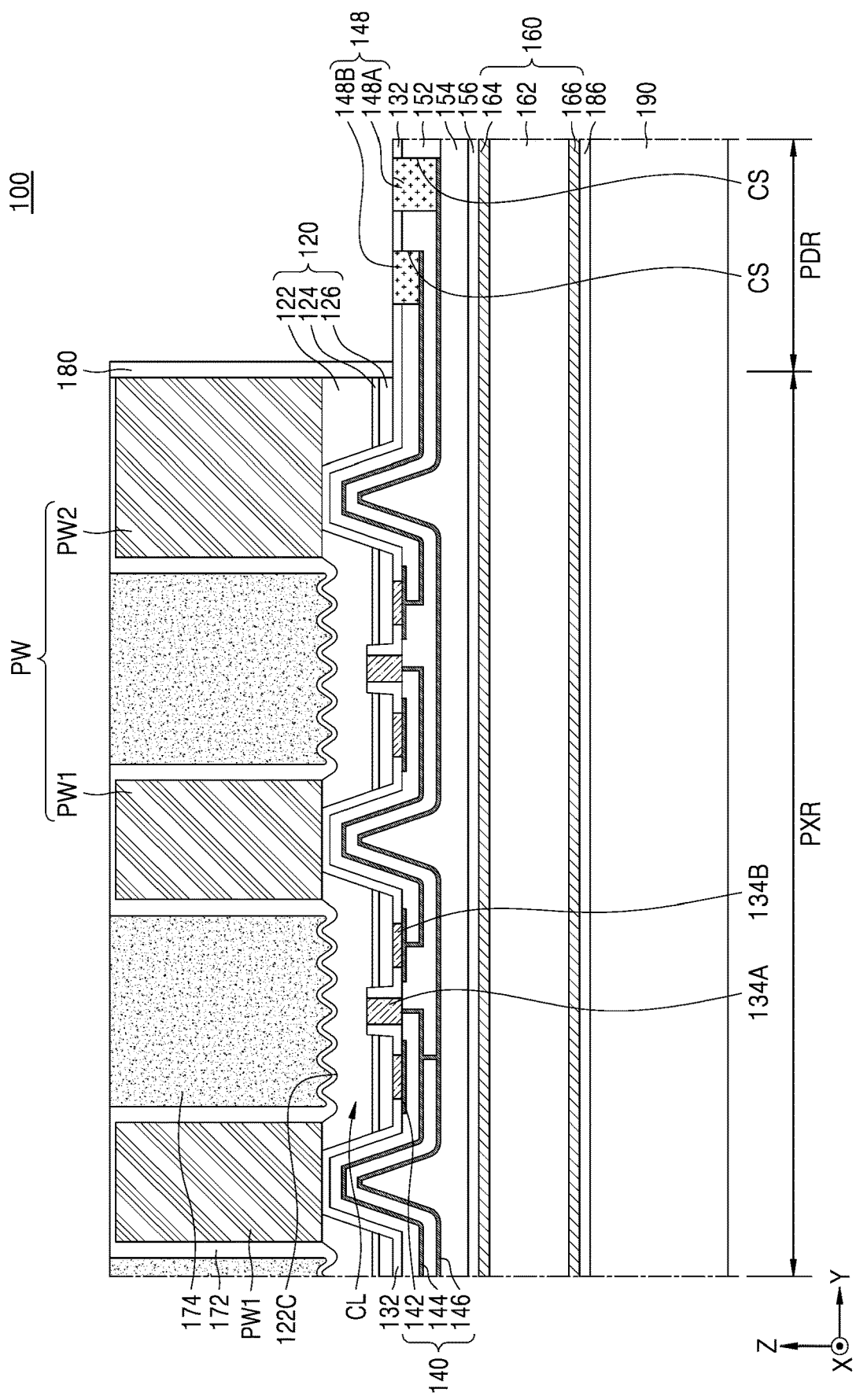

Referring to FIG. 7M, a plurality of pad connection spaces CS exposing a portion of the wiring structure 140 may be formed by partially etching each of the insulating liner 132 and the inter-wiring insulating film 152, which is exposed in the pad region PDR. Afterwards, a plurality of connection pads 148 may be formed. The plurality of connection pads 148 may include a first conductive pad 148A and a second conductive pad 148B, which are connected to the wiring structure 140 in the plurality of pad connection spaces CS.

Referring to FIG. 7N, a PCB 190 may be adhered onto a surface of the support structure 160, which is an opposite side of a surface of the support structure 160 facing the plurality of light-emitting cells CL, by using a second adhesive layer 186, and thus, the light source module 100 shown in FIGS. 1A to 1C may be manufactured. In the present example embodiment, after the PCB 190 is adhered onto the surface of the support structure 160, the second adhesive layer 186 may be in contact with the lower insulating film 166 of the support structure 160. However, the lower insulating film 166 of the support structure 160 may be omitted. In this case, a structure in which the second adhesive layer 186 is in contact with the support substrate 162 may be obtained.

Although the method of manufacturing the light source module 100 shown in FIGS. 1A to 1C has been described with reference to FIGS. 7A to 7N, it will be understood that the light source modules 200, 300, 400, 500, and 600 shown in FIGS. 2 to 6 and light source modules having various structures may be manufactured by applying various modifications and changes within the scope of embodiments.

For example, to manufacture the light source module 200 shown in FIG. 2, the support structure 260 shown in FIG. 2 may be adhered onto the buried insulating film 154 instead of the support structure 160 by using the first adhesive layer 156 during the process described with reference to FIG. 7F.

To manufacture the light source module 300 shown in FIG. 3, the support structure 360 shown in FIG. 3 may be adhered onto the buried insulating film 154 instead of the support structure 160 by using the first adhesive layer 156 during the process described with reference to FIG. 7F.

To manufacture the light source module 400 shown in FIG. 4, the processes described with reference to FIGS. 7A to 7N may be performed. However, the process of forming the concave/convex surface 122C, which is described with reference to FIG. 7I, may be omitted.

To manufacture the light source module 500 shown in FIG. 5, the inner partition wall PW1 defining the plurality of pixel spaces PS may be formed as described with reference to FIG. 7H. The formation of the inner partition wall PW1 may include forming a nonplanar unit PWR on an etched surface of the substrate 110, which is exposed through the plurality of pixel spaces PS, by controlling process conditions for etching the substrate 110 during a process of etching the substrate 110. Subsequently, the processes described with reference to FIGS. 7I to 7N may be performed. Thus, the light source module 500 in which the nonplanar unit PWR is formed on the sidewall of the partition wall structure PW5, which faces the plurality of pixel spaces PS, may be manufactured.

To manufacture the light source module 600 shown in FIG. 6, after the fluorescent layer 174 is formed to fill the plurality of pixel spaces PS as described with reference to FIG. 7K, a process of forming a plurality of lenses 678 on the fluorescent layer 174 may be further performed. Subsequently, the processes described with reference to FIGS. 7L to 7N may be performed to manufacture the light source module 600 shown in FIG. 6.

Figure 10:
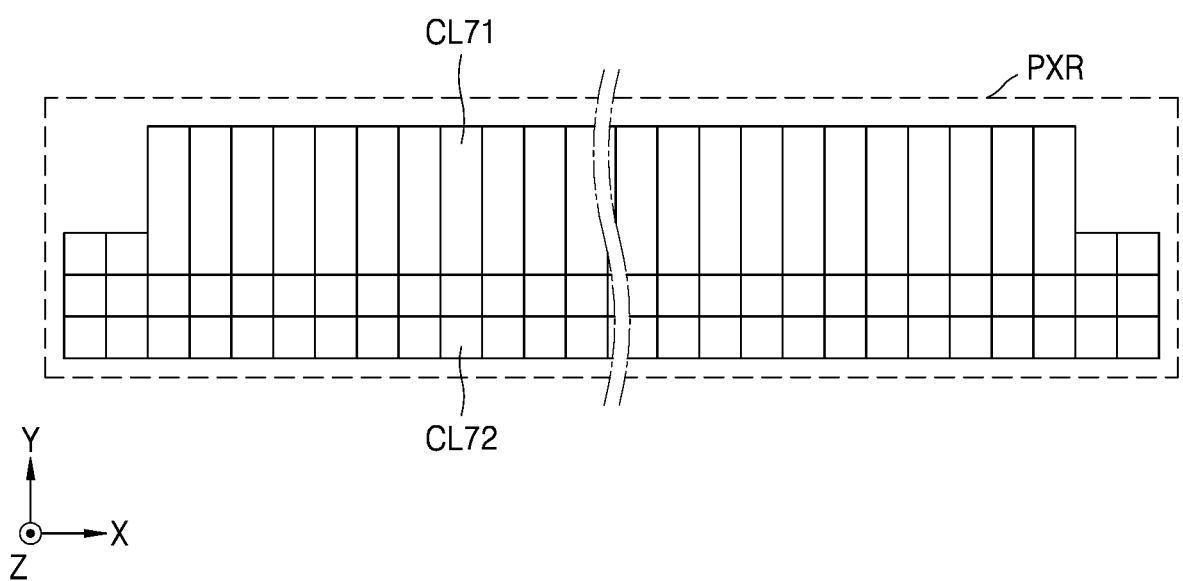
FIG. 10 is a plan view of a light source module according to an example embodiment.

FIG. 10 is a plan view of a light source module 700 according to example embodiments.

Referring to FIG. 10, the light source module 700 may have substantially the same configuration as the light source module 100 shown in FIG. 1. However, in the light source module 700, a plurality of light-emitting cells (e.g., CL71 and CL72) may be arranged in a line in a pixel region PXR of a support structure (refer to 160 in FIG. 1C) in a first lateral direction (X direction) and a second lateral direction (Y direction), which are perpendicular to each other. Each of the light-emitting cells (e.g., CL71 and CL72) may respectively constitute a plurality of pixels PX described with reference to FIGS. 1A to 1C.

The plurality of light-emitting cells (e.g., CL71 and CL72) may include a plurality of first light-emitting cells CL71, which are arranged in a line in the first lateral direction (X direction), and a plurality of second light-emitting cells CL72, which are arranged in a line in the first lateral direction (X direction). In example embodiments, the plurality of first light-emitting cells CL71 may have substantially the same size and shape, and the plurality of second light-emitting cells CL72 may have substantially the same size and shape.

Each of the plurality of first light-emitting cells CL71 and the plurality of second light-emitting cells CL72 may be defined by a partition wall PW described with reference to FIGS. 1B and 1C. The plurality of first light-emitting cells CL71 may be adjacent to the plurality of second light-emitting cells CL72 in the second lateral direction (Y direction).

Each of the plurality of first light-emitting cells CL71 may substantially have a rectangular shape in a view from above (e.g., an X-Y plane). A length of each of the plurality of first light-emitting cells CL71 in the first lateral direction (X direction) may be different from a length of each of the plurality of first light-emitting cells CL71 in the second lateral direction (Y direction). In example embodiments, a ratio of the length of each of the plurality of first light-emitting cells CL71 in the first lateral direction (X direction) to the length of each of the plurality of first light-emitting cells CL71 in the second lateral direction (Y direction) may be in a range of about 1:1.5 to about 1:4.5, without being limited thereto.

The length of the first light-emitting cell CL71 may be equal to the length of the second light-emitting cell CL72 in the first lateral direction (X direction). The first light-emitting cell CL71 and the second light-emitting cell CL72 may be arranged in a line in the second lateral direction (Y direction). The length of the first light-emitting cell CL71 may be greater than the length of the second light-emitting cell CL72 in the second lateral direction (Y direction). For example, the length of the first light-emitting cell CL71 may be about 1.1 times to about 4.5 times the length of the second light-emitting cell CL72 in the second lateral direction (Y direction).

Detailed descriptions of the plurality of light-emitting cells (e.g., CL71 and CL72) may be substantially the same as those of the light-emitting cells CL, which are provided with reference to FIGS. 1A to 1C.

Figure 11:
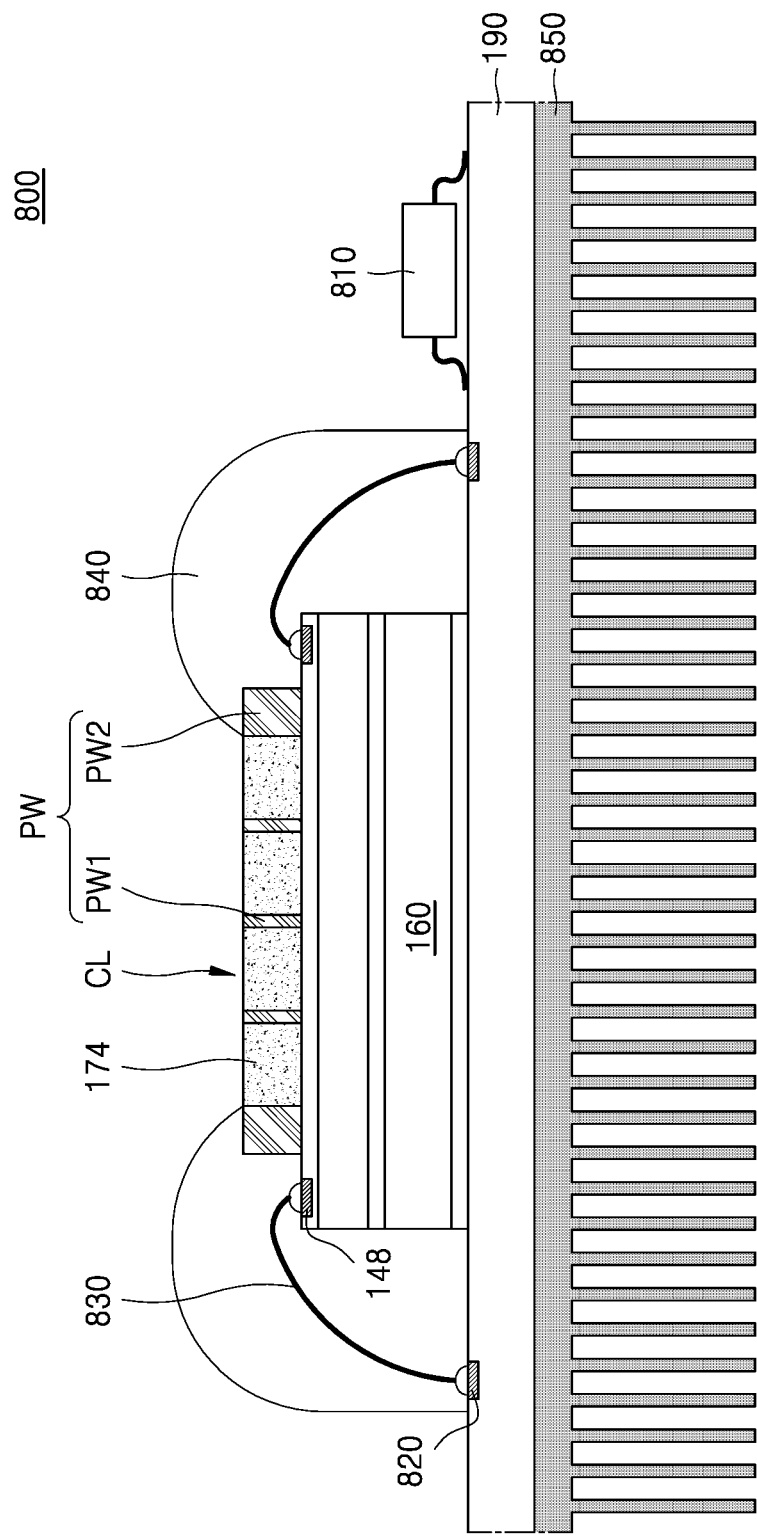
FIG. 11 is a cross-sectional view of a light source module according to an example embodiment.

FIG. 11 is a cross-sectional view of a light source module 800 according to example embodiments. In FIG. 11, the same reference numerals are used to denote the same elements as in FIGS. 1A to 1C, and repeated descriptions thereof will be omitted.

Referring to FIG. 11, the light source module 800 may have substantially the same configuration as the light source module 100 shown in FIG. 1. However, the light source module 900 may further include a bonding wire 830 having one end connected to one of a plurality of conductive pads 148 and another end connected to a conductive pad 820 positioned on a PCB 190. Although FIG. 11 schematically illustrates only some components of the light source module 100 described with reference to FIGS. 1A to 1C, the light source module 800 may include all the same components as those of the light source module 100, which are described with reference to FIGS. 1A to 1C.

The bonding wire 830 may be encapsulated with a molding resin 840. The molding resin 840 may include an epoxy molding resin, without being limited thereto. The molding resin 840 may cover at least a portion of an outer partition wall PW2 without covering a plurality of light-emitting cells CL and an inner partition wall PW1.

A driver semiconductor chip 810 may be mounted on the PCB 190. The driver semiconductor chip 810 may be electrically connected to the plurality of light-emitting cells CL through a bonding wire 830. The driver semiconductor chip 810 may individually or wholly drive a plurality of light-emitting cells CL.

A heat sink 850 may be adhered to a bottom surface of the PCB 190.

Figure 12:
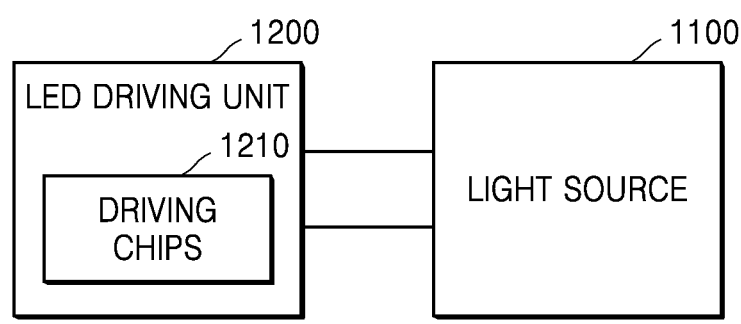
FIG. 12 is a block diagram of a configuration of a light source module according to an example embodiment.

Although FIG. 11 illustrates an example in which the light source module 800 includes the configuration of the light source module 100 described with reference to FIGS. 1A to 1C, embodiments are not limited thereto. For example, at least one selected from the light source modules 200, 300, 400, 500, 600, and 700 described with reference to FIGS. 2, 3, 4, 5, 6, and 10 and light source modules having various structures formed by applying various modifications and changes thereto may be included alone or in combination in the light source module 800. FIG. 12 is a block diagram of a configuration of a light source module 1000 according to embodiments.

Referring to FIG. 12, the light source module 1000 may include a light source 1100 and an LED driving unit 1200.

The light source 1100 may include a light-emitting diode (LED) array. In example embodiments, as described above with reference to FIGS. 1A to 1C, the LED array included in the light source 1100 may include a plurality of pixels PX, which include a plurality of light-emitting cells CL. The plurality of pixels PX included in the LED array may include the plurality of light-emitting cells CL, which are supported by a support structure, for example, the support structure 160 shown in FIG. 1C, the support structure 260 shown in FIG. 2, or the support structure 360 shown in FIG. 3.

The LED array may include a plurality of sub-arrays, for example, the plurality of sub-arrays SA shown in FIG. 1A. The light-emitting cells LC included in different sub-arrays SA, from among the plurality of sub-arrays SA, may be electrically insulated from each other, without being limited thereto.

The LED driving unit 1200 may be connected to a power supply device.

The power supply device may generate an input voltage required for operations of the light source 1100 and provide the input voltage to the light source 1100. According to example embodiments, when the light source module 1000 is a headlamp for a vehicle, and the power supply device may be a battery mounted in the vehicle. According to example embodiments, when the light source module 1000 is a household or industrial lighting fixture, the light source module 1000 may further include an alternating-current (AC) power supply configured to generate an AC voltage, a rectifying circuit configured to rectify the AC voltage and generate a direct-current (DC) voltage, and a voltage regulating circuit.

The LED driving unit 1200 may include a plurality of driving chips 1210. Each of the plurality of driving chips 1210 may be implemented as an integrated circuit (IC) chip. The plurality of driving chips 1210 may drive the LED array included in the light source 1100. In example embodiments, each of the plurality of driving chips 1210 may be electrically connected to at least one corresponding sub-array SA, from among the plurality of sub-arrays SA shown in FIG. 1A, and may control operations of a plurality of light-emitting cells LC included in the corresponding sub-array SA. The number of driving chips 1210 may be equal to or different from the number of sub-arrays SA included in the light source 1100. In example embodiments, the plurality of driving chips 1210 may be mounted on the PCB 190 shown in FIG. 1C.

Figure 13:
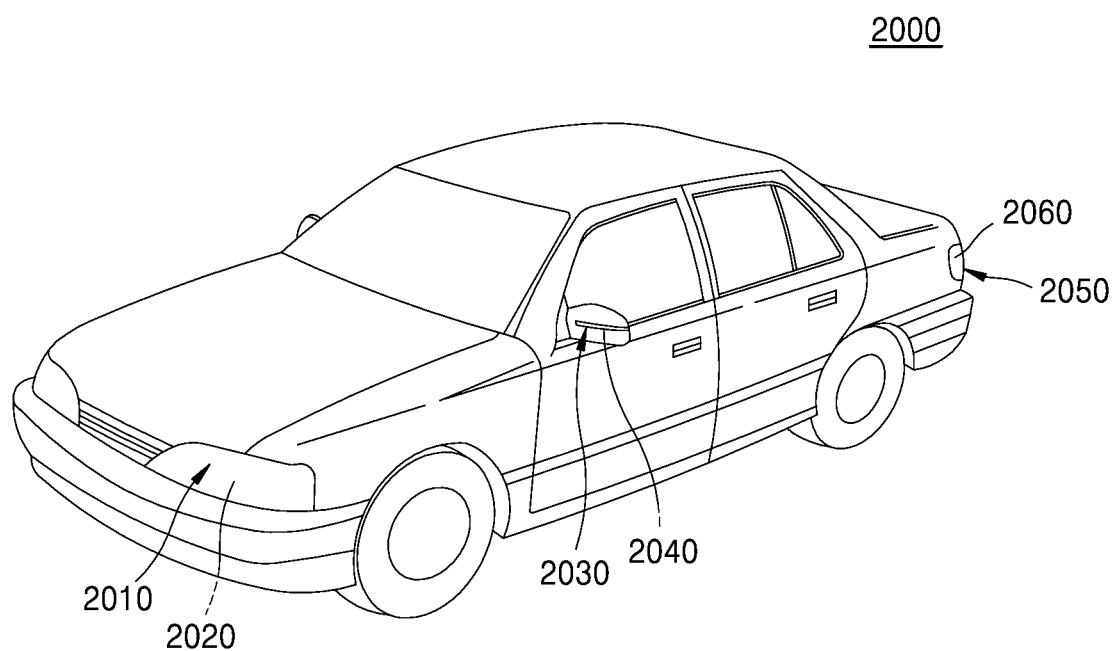
FIG. 13 is a schematic perspective view of a lighting apparatus including a light source module according to an example embodiment.

FIG. 13 is a schematic perspective view of a lighting apparatus 2000 including a light source module, according to example embodiments.

Referring to FIG. 13, a headlamp module 2020 may be installed in a headlamp unit 2010 of a vehicle. A side mirror lamp module 2040 may be installed in an outer side mirror unit 2030, and a tail lamp module 2060 may be installed in a tail lamp unit 2050. At least one of the headlamp module 2020, the side mirror lamp module 2040, and the tail lamp module 2060 may include at least one of the light source modules 100, 200, 300, 400, 500, 600, 700, and 800 according to the embodiments.

Figure 14:
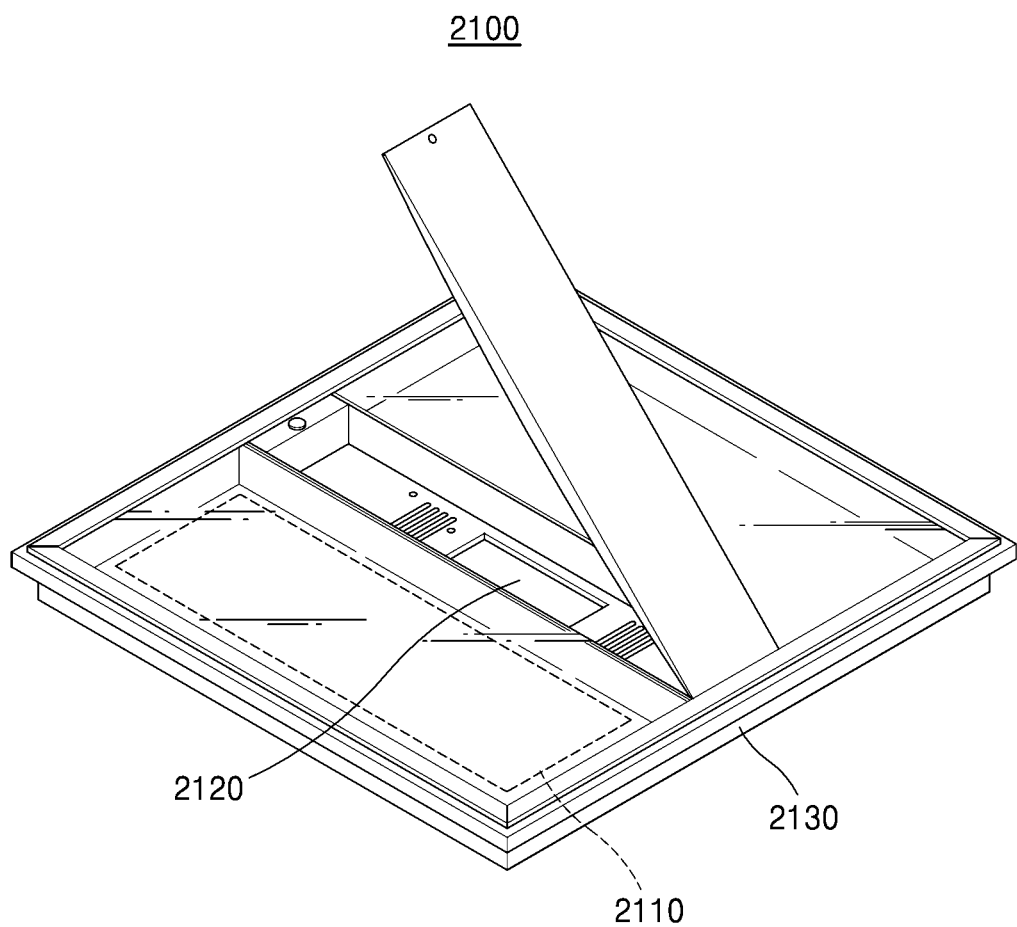
FIG. 14 is a schematic perspective view of a flat-panel lighting apparatus including a light source module, according to an example embodiment.

FIG. 14 is a schematic perspective view of a flat-panel lighting apparatus 2100 including a light-emitting module, according to example embodiments.

Referring to FIG. 14, the flat-panel lighting apparatus 2100 may include a light source module 2110, a power supply 2120, and a housing 2130.

The light source module 2110 may include at least one of the light-emitting modules 100, 200 300, 400, 500, 600, 700, and 800 according to the embodiments. The light source module 2110 may have a flat shape as a whole.

The power supply 2120 may be configured to supply power to the light source module 2110. The housing 2130 may form an accommodation space for accommodating the light source module 2110 and the power supply 2120. The housing 2130 may be formed to have a hexahedral shape with one opened side, but is not limited thereto. The light source module 2110 may be positioned to emit light toward the opened side of the housing 2130.

Figure 15:
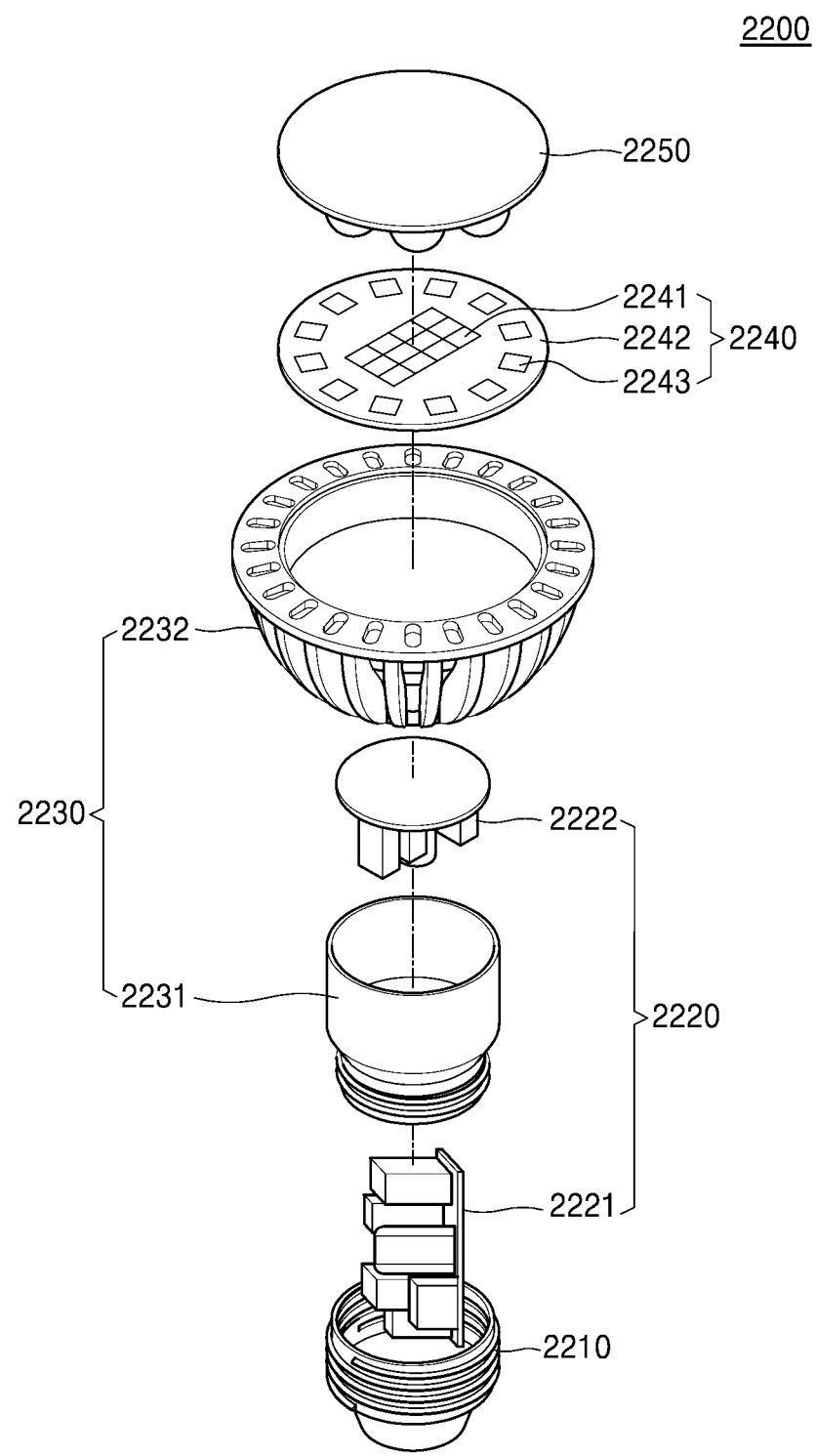
FIG. 15 is an exploded perspective view of a lighting apparatus including a light-emitting module, according to an example embodiment.

FIG. 15 is an exploded perspective view of a lighting apparatus 2200 including a light-emitting module, according to example embodiments.

Referring to FIG. 15, the lighting apparatus 2200 may include a socket 2210, a power supply 2220, a heat sink 2230, a light source module 2240, and an optical unit 2250.

The socket 2210 may be configured to be replaceable with an existing lighting apparatus. Power may be supplied to the lighting apparatus 2200 through the socket 2210. The power supply 2220 may be dissembled into a first power supply 2221 and a second power supply 2222. The heat sink 2230 may include an internal heat sink 2231 and an external heat sink 2232. The internal heat sink 2231 may be directly connected to the light source module 2240 and/or the power supply 2220 and transmit heat to the external heat sink 2232 through the light source module 2240 and/or the power supply 2220. The optical unit 2250 may include an internal optical unit (not shown) and an external optical unit (not shown). The optical unit 2250 may be configured to uniformly disperse light emitted by the light source module 2240.

The light source module 2240 may receive power from the power supply 2220 and emit light to the optical unit 2250. The light source module 2240 may include at least one light-emitting element package 2241, a circuit board 2242, and a controller 2243. The controller 2243 may store driving information of the light-emitting element packages 2241. The light source module 2240 may include at least one of the light-emitting modules 100, 200 300, 400, 500, 600, 700, and 800 according to the embodiments.

Figure 16:
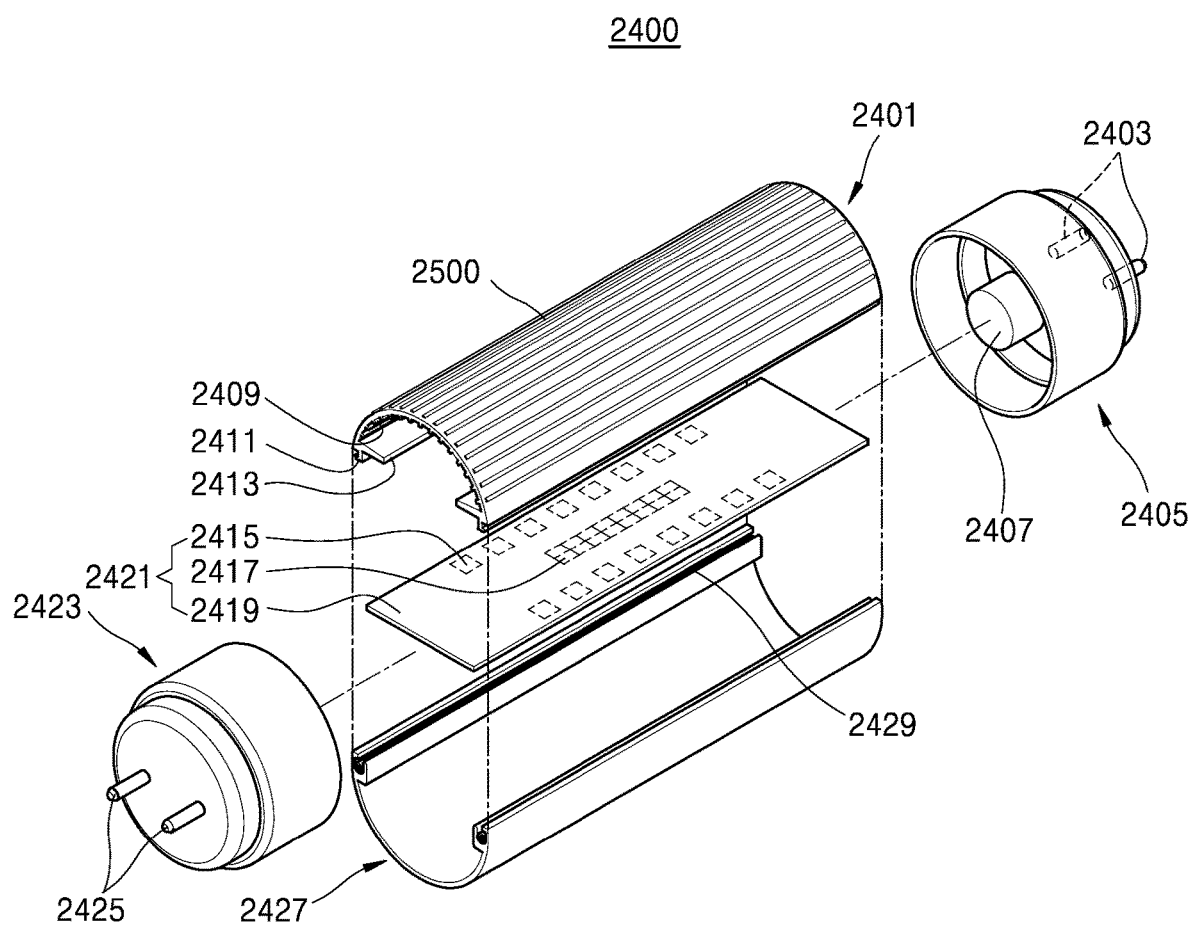
FIG. 16 is an exploded perspective view of a bar-type lighting apparatus including a light-emitting module, according to an example embodiment.

FIG. 16 is an exploded perspective view of a bar-type lighting apparatus 2400 including a light-emitting module, according to example embodiments.

Referring to FIG. 16, the bar-type lighting apparatus 2400 may include a heat sink member 2401, a cover 2427, a light source module 2421, a first socket 2405, and a second socket 2423. A plurality of heat sink fins 2450 and 2409 having a concave/convex shape may be formed on inner or/and outer surfaces of the heat sink member 2401. The heat sink fins 2450 and 2409 may be designed to have various shapes and intervals. A support 2413 having a protruding shape may be formed inside the heat sink member 2401. The light source module 2421 may be fixed to the support 2413. Locking protrusions 2411 may be formed on both ends of the heat sink member 2401.

Locking grooves 2429 may be formed in the cover 2427. The locking protrusions 2411 of the heat sink member 2401 may be hooked to the locking grooves 2429. Positions of the locking grooves 2429 may be exchanged with positions of the locking protrusions 2411.

The light source module 2421 may include a printed circuit board (PCB) 2419, a light source 2417, and a controller 2415. The controller 2415 may store driving information of the light source 2417. Circuit wirings may be formed on the PCB 2419 so as to operate the light source 2417. In addition, the light source module 2421 may include components for operating the light source 2417.

The light source module 2421 may include at least one of the light-emitting modules 100, 200 300, 400, 500, 600, 700, and 800 according to the embodiments.

The first and second sockets 2405 and 2423 may be provided as a pair of sockets and may be connected to both ends of a cylindrical cover unit including the heat sink member 2401 and the cover 2427. For example, the first socket 2405 may include an electrode terminal 2403 and a power supply 2407, and the second socket 2423 may include a dummy terminal 2425. In addition, an optical sensor and/or a communication module may be embedded into any one of the first socket 2405 and the second socket 2423.

Figure 17:
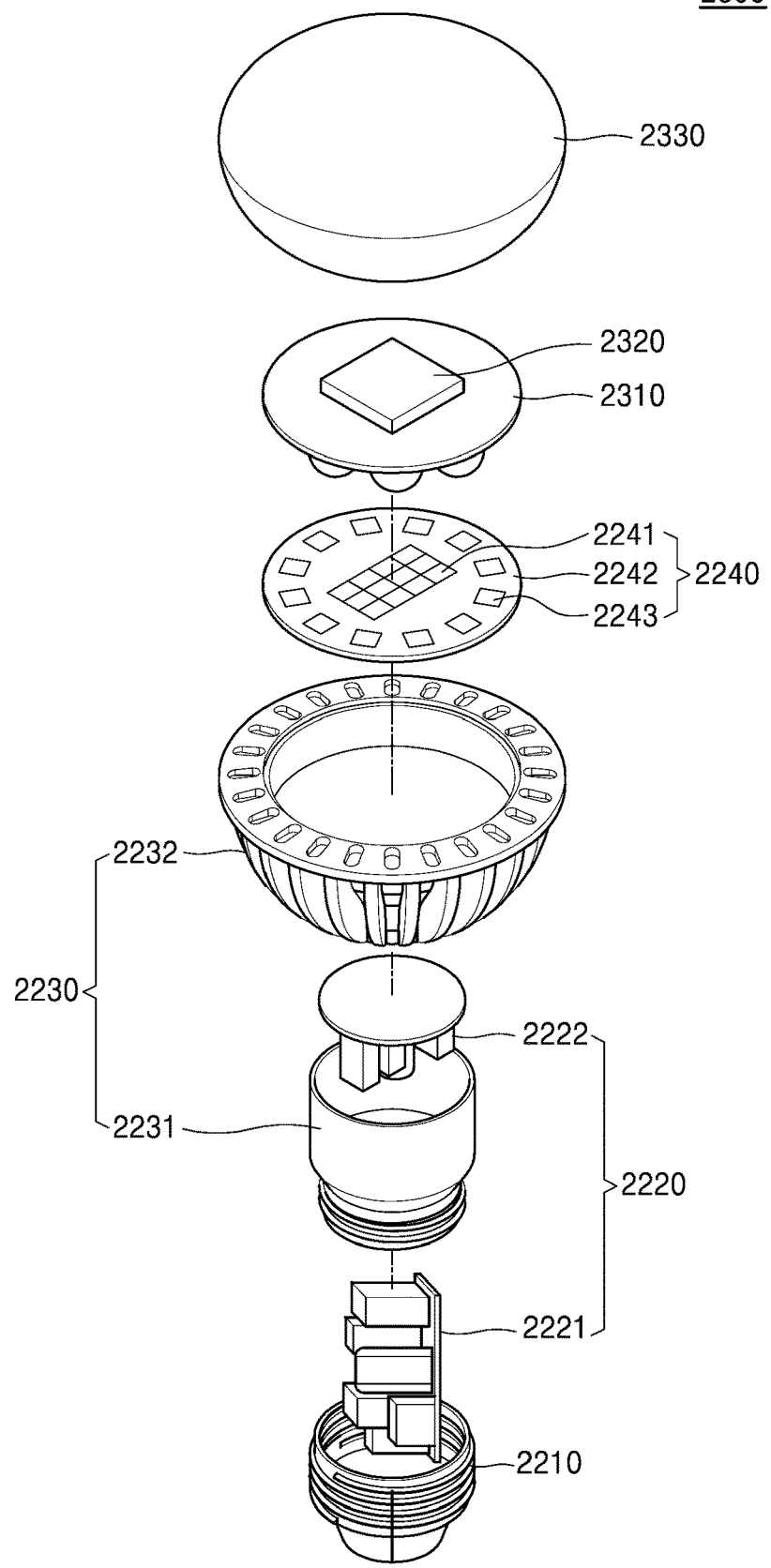
FIG. 17 is an exploded perspective view of a lighting apparatus including a light-emitting module, according to an example embodiment.

FIG. 17 is an exploded perspective view of a lighting apparatus 2500 including a light-emitting module, according to example embodiments.

The lighting apparatus 2500 of FIG. 17 is generally similar to the lighting apparatus 2200 of FIG. 15 except that a reflection plate 2310 and a communication module 2320 are provided on a light source module 2240. The reflection plate 2310 may uniformly disperse light from a light source in a lateral direction and a rearward direction so as to reduce glare. The communication module 2320 may be mounted on the reflection plate 2310. Home network communication may be implemented through the communication module 2320. For example, the communication module 2320 may be a wireless communication module using ZigBee, WiFi, or LiFi, and may control an indoor or outdoor lighting apparatus, such as on/off operations or brightness adjustment of the lighting apparatus 2500 through a smartphone or a wireless controller. Also, the communication module 2320 may control indoor or outdoor electronic appliances and vehicle systems, such as TVs, refrigerators, air conditioners, doorlock systems, and vehicles. The reflection plate 2310 and the communication module 2320 may be covered by a cover 2330.

Figure 18:
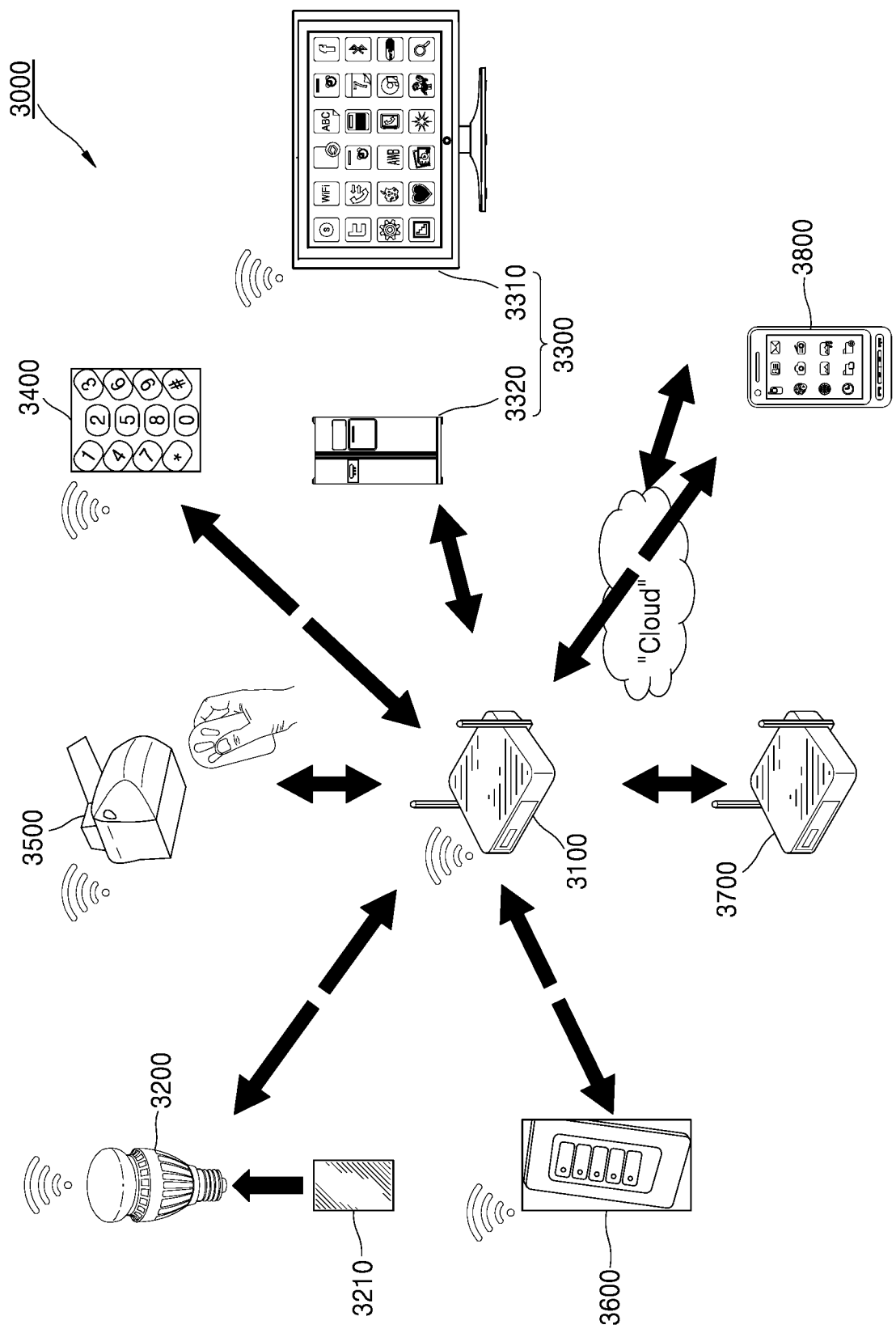
FIG. 18 is a schematic diagram for describing an indoor lighting control network system including a light-emitting module, according to an example embodiment.

FIG. 18 is a schematic diagram for describing an indoor lighting control network system 3000 including a light-emitting module, according to example embodiments.

Referring to FIG. 18, the indoor lighting control network system (hereinafter, referred to as network system) 3000 may be a composite smart lighting-network system in which illumination technology using a light-emitting element, such as an LED, Internet of Things (IoT) technology, and wireless communication technology converge. The network system 3000 may be implemented using various lighting apparatuses and wired/wireless communication devices. Alternatively, the network system 3000 may be implemented based on an IoT environment so as to collect and process a variety of information and provide the information to users.

An LED lamp 3200 included in the network system 3000 may receive information about an ambient environment from a gateway 3100 and control illumination of the LED lamp 3200 itself. Furthermore, the LED lamp 3200 may check and control the operation states of other devices (e.g., 3300 to 3800) included in the IoT environment based on a visible light communication function of the LED lamp 3200.

The LED lamp 3200 may include at least one of the light-emitting modules 100, 200 300, 400, 500, 600, 700, and 800 according to the embodiments. The LED lamp 3200 may be communicably connected to the gateway 3100 by the wireless communication protocol such as WiFi, ZigBee, or LiFi. To this end, the LED lamp 3200 may include at least one lamp communication module 3210.

In a case where the network system 3000 is applied to the home, the plurality of devices (e.g., 3300, 3400, 3500, 300, 3700, 3800) may include electronic appliances 3300, a digital doorlock 3400, a garage doorlock 3500, a lighting switch 3600 installed on a wall, a router 3700 for relaying a wireless communication network, and mobile devices 3800 such as smartphones, tablets, or laptop computers.

In the network system 3000, the LED lamp 3200 may check operation states of the various devices (e.g., 3300, 3400, 3500, 300, 3700, 3800) or automatically control the illumination of the LED lamp 3200 itself according to the ambient environment and conditions by using the wireless communication network (e.g., ZigBee, WiFi, LiFi, etc.) installed at home. In addition, the LED lamp 3200 may control the devices (e.g., 3300, 3400, 3500, 300, 3700, 3800) included in the network system 3000 through LiFi communication using visible light emitted by the LED lamp 3200.

The LED lamp 3200 may automatically control the illumination of the LED lamp 3200 based on the information about the ambient environment, which is transmitted from the gateway 3100 through the lamp communication module 3210, or the information about the ambient environment, which is collected from a sensor mounted on the LED lamp 3200. For example, the brightness of the LED lamp 3200 may be automatically adjusted according to a kind of a TV program aired on the TV 3310 or a screen brightness of the TV 3310. To this end, the LED lamp 3200 may receive operation information of the TV 3310 from the lamp communication module 3210 connected to the gateway 3100. The lamp communication module 3210 may be integrally modularized with a sensor and/or a controller included in the LED lamp 3200.

For example, after elapse of a predetermined time after the digital doorlock 3400 has been locked in such a state that there is no person at home, it is possible to prevent waste of electricity by turning off the turned-on LED lamp 3200. Alternatively, in a case where a security mode is set through the mobile device 3800 or the like, when the digital doorlock 3400 is locked in such a state that there is no person at home, the LED lamp 3200 may be maintained in the turned-on state.

The operation of the LED lamp 3200 may be controlled according to information about the ambient environment, which is collected through various sensors connected to the network system 3000. For example, in a case where the network system 3000 is implemented in a building, it is possible to turn on or off the illumination by combining a lighting apparatus, a position sensor, and a communication module within the building, or provide collected information in real time, thus enabling efficient facility management or efficient utilization of unused space.

Figure 19:
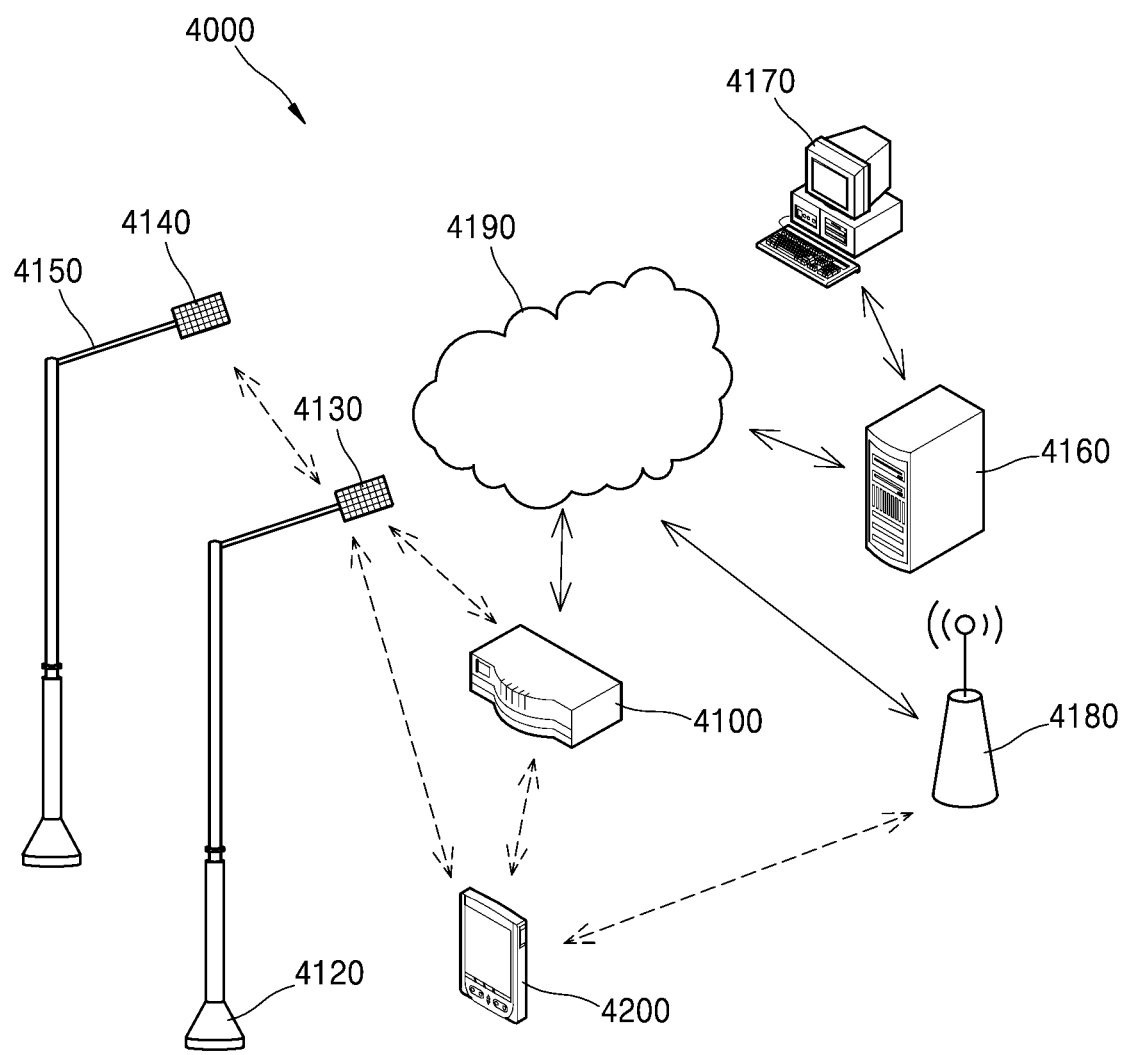
FIG. 19 is a schematic diagram for describing a network system including a light-emitting module, according to an example embodiment.

FIG. 19 is a schematic diagram for describing a network system 4000 including a light-emitting module, according to example embodiments. FIG. 19 illustrates a schematic configuration of the network system 4000 applied to an open space, according to an embodiment.

Referring to FIG. 19, the network system 4000 may include a communication connecting device 4100, a plurality of lighting apparatuses (e.g., 4120 and 4150) installed at predetermined intervals and communicably connected to the communication connecting device 4100, a server 4160, a computer 4170 configured to manage the server 4160, a communication base station 4180, a communication network 4190 configured to connect communicable devices, and a mobile device 4200.

The plurality of lighting apparatuses 4120 and 4150 installed in open external spaces such as streets or parks may include smart engines 4130 and 4140, respectively. Each of the smart engines 4130 and 4140 may include a light-emitting element configured to emit light, a driver configured to drive the light-emitting element, a sensor configured to collect information about an ambient environment, and a communication module.

Each of the smart engines 4130 and 4140 may include at least one of the light-emitting modules 100, 200 300, 400, 500, 600, 700, and 800 according to the embodiments.

The communication module may enable the smart engines 4130 and 4140 to communicate with other peripheral devices in accordance with a communication protocol such as WiFi, ZigBee, or LiFi. One smart engine 4130 may be communicably connected to the other smart engine 4140. In this case, a WiFi mesh may be applied to the communication between the smart engines 4130 and 4140. At least one smart engine 4130 may be connected to the communication connecting device 4100 connected to the communication network 4190 by a wired/wireless communication.

The communication connecting device 4100 may be an access point (AP) capable of performing wired/wireless communications and may relay a communication between the communication network 4190 and other devices. The communication connecting device 4100 may be connected to the communication network 4190 by at least one of the wired/wireless communication schemes. For example, the communication connecting device 4100 may be mechanically accommodated in one of the lighting apparatuses 4120 and 4150.

The communication connecting device 4100 may be connected to the mobile device 4200 through a communication protocol such as WiFi. A user of the mobile device 4200 may receive information about the ambient environment, which is collected by a plurality of smart engines (e.g., 4130 and 4140), through the communication connecting device 4100 connected to the smart engine 4130 of an adjacent lighting apparatus 4120. The information about the ambient environment may include neighboring traffic information, weather information, and the like. The mobile device 4200 may be connected to the communication network 4190 through the communication base station 4180 by a wireless cellular communication scheme such as a 3G or 4G communication scheme.

The server 4160 connected to the communication network 4190 may receive information collected by the smart engines 4130 and 4140 respectively mounted on the lighting apparatuses 4120 and 4150 and may monitor the operation states of the lighting apparatuses 4120 and 4150. The server 4160 may be connected to the computer 4170 that provides a management system, and the computer 4170 may execute software capable of monitoring and managing the operation states of the smart engines 4130 and 4140.

While example embodiments has been particularly shown and described, it will be understood that various changes in form and details may be made therein without departing from the spirit and scope of the following claims.

What is claimed is:

1. A light source module comprising:
   a light-emitting cell;
   a wiring structure provided on the light-emitting cell and connected to the light-emitting cell;
   a support substrate that is apart from the light-emitting cell with the wiring structure provided between the support substrate and the light-emitting cell in a vertical direction;
   a printed circuit board that is apart from the wiring structure with the support substrate provided between the printed circuit board and the wiring structure in the vertical direction, the printed circuit board overlapping the light-emitting cell in the vertical direction, and the printed circuit board being adhered onto the support substrate; and
   at least one insulating film that is apart from the wiring structure in the vertical direction, the at least one insulating film covering at least one of a first surface of the support substrate, which faces the wiring structure, and a second surface of the support substrate, which faces the printed circuit board.

2. The light source module of claim 1, further comprising an adhesive layer provided between the support substrate and the wiring structure,
   wherein the at least one insulating film is apart from the wiring structure with the adhesive layer provided between the at least one insulating film and the wiring structure in the vertical direction.

3. The light source module of claim 1, wherein the at least one insulating film comprises an upper insulating film in contact with the first surface of the support substrate.

4. The light source module of claim 1, wherein the at least one insulating film comprises a lower insulating film in contact with the second surface of the support substrate.

5. The light source module of claim 1, wherein the at least one insulating film comprises:
   an upper insulating film in contact with the first surface of the support substrate; and
   a lower insulating film in contact with the second surface of the support substrate.

6. The light source module of claim 1, wherein the at least one insulating film comprises $SiO_2$, $Si_3N_4$, $Al_2O_3$, $HfSiO_4$, $Y_2O_3$, $ZrSiO_4$, $HfO_2$, $ZrO_2$, $Ta_2O_5$, $La_2O_3$, or a combination thereof.

7. The light source module of claim 1, wherein the support substrate consists of only an insulating substrate.

8. The light source module of claim 1, wherein the support substrate comprises a conductive substrate.

9. The light source module of claim 1, wherein the support substrate comprises doped silicon, undoped silicon, $Al_2O_3$, tungsten (W), copper (Cu), a bismaleimide triazine (BT) resin, an epoxy resin, polyimide, a liquid crystal (LC) polymer, a copper clad laminate, or a combination thereof.

10. The light source module of claim 1, further comprising a plurality of conductive pads provided on the support substrate at positions apart from the light-emitting cell in a lateral direction, the plurality of conductive pads being connected to the wiring structure,
    wherein the wiring structure comprises at least one conductive line, and the at least one conductive line is configured to carry a current in the lateral direction.

11. The light source module of claim 1, wherein a sheet resistivity of the at least one insulating film is at least 50 Megaohms per square.

12. The light source module of claim 1, further comprising an electrode,
    wherein the at least one insulating film comprises a buried insulating film, and a portion of the buried insulating film is at a same height in the vertical direction as the electrode, and the electrode is in contact with a conductive semiconductor layer of the light-emitting cell.

13. A light source module comprising:
    a plurality of light-emitting cells that are apart from each other in a lateral direction;
    a wiring structure provided on the plurality of light-emitting cells and configured to electrically connect the plurality of light-emitting cells to each other;
    a support structure provided opposite the plurality of light-emitting cells with the wiring structure provided between the support structure and the plurality of light-emitting cells, the support structure extending in the lateral direction; and
    a printed circuit board overlapping the plurality of light-emitting cells with the wiring structure and the support structure provided between the printed circuit board and the plurality of light-emitting cells in a vertical direction,
    wherein the support structure comprises:
       a support substrate; and
       at least one insulating film covering at least one of a first surface of the support substrate, which faces the wiring structure, and a second surface of the support substrate, which faces the printed circuit board, and
    wherein the printed circuit board is adhered onto the support substrate.

14. The light source module of claim 13, further comprising a first adhesive layer provided between the support structure and the wiring structure,
    wherein the at least one insulating film comprises an upper insulating film provided between the first adhesive layer and the support substrate.

15. The light source module of claim 13, further comprising a second adhesive layer provided between the support structure and the printed circuit board,
    wherein the at least one insulating film comprises a lower insulating film between the second adhesive layer and the support substrate.

16. The light source module of claim 13, further comprising:
    a first adhesive layer provided between the support structure and the wiring structure; and
    a second adhesive layer provided between the support structure and the printed circuit board,
    wherein the at least one insulating film comprises an upper insulating film provided between the first adhesive layer and the support substrate and a lower insulating film provided between the second adhesive layer and the support substrate.

17. The light source module of claim 13, further comprising a plurality of conductive pads positioned on the support structure at positions apart from the plurality of light-emitting cells in the lateral direction, the plurality of conductive pads being connected to the wiring structure, wherein the wiring structure comprises a plurality of conductive lines, and the plurality of conductive lines are configured to carry a corresponding plurality of conductive currents in the lateral direction.

18. A light source module comprising:
a plurality of light-emitting cells comprising a plurality of light-emitting stack structures, each light-emitting stack structure of the plurality of light-emitting stack structures comprising a first conductive semiconductor layer, an active layer, and a second conductive semiconductor layer, which are sequentially stacked in a vertical direction, the plurality of light-emitting stack structures being apart from each other in a lateral direction;
a wiring structure comprising a plurality of conductive lines configured to connect the plurality of light-emitting cells to each other;
a buried insulating film covering the wiring structure;
an adhesive layer covering the buried insulating film;
a support structure that is apart from the buried insulating film with the adhesive layer provided between the support structure and the buried insulating film in the vertical direction; and
a printed circuit board overlapping the plurality of light-emitting stack structures in the vertical direction with the wiring structure and the support structure provided between the printed circuit board and the plurality of light-emitting stack structures,
wherein the support structure comprises:
a support substrate; and
at least one insulating film covering at least one of a first surface of the support substrate, which faces the wiring structure, and a second surface of the support substrate,
which faces the printed circuit board, and wherein the printed circuit board is adhered onto the support substrate.

19. The light source module of claim 18, wherein the support substrate comprises undoped silicon, and
the at least one insulating film comprises an oxide film.

20. The light source module of claim 18, wherein the support substrate has a first thickness of at least 200 μm in the vertical direction, and
the at least one insulating film has a second thickness of 100 nm to 1000 nm in the vertical direction.

* * * * *